United States Patent
Brick et al.

(10) Patent No.: US 11,156,759 B2
(45) Date of Patent: Oct. 26, 2021

(54) μ-LED, μ-LED DEVICE, DISPLAY AND METHOD FOR THE SAME

(71) Applicant: OSRAM Opto Semiconductors GmbH, Regensburg (DE)

(72) Inventors: Peter Brick, Regensburg (DE); Jean-Jacques Drolet, Obertraubling (DE); Hubert Halbritter, Dietfurt-Toeging (DE); Laura Kreiner, Regensburg (DE); Thomas Schwarz, Regensburg (DE); Tilman Ruegheimer, Regensburg (DE); Frank Singer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/039,422

(22) Filed: Sep. 30, 2020

(65) Prior Publication Data
US 2021/0080637 A1    Mar. 18, 2021

Related U.S. Application Data

(63) Continuation of application No. PCT/EP2020/052191, filed on Jan. 29, 2020.

(30) Foreign Application Priority Data

Jan. 29, 2019  (DK) .............................. PA201970059
May 23, 2019  (DE) ......................... 102019113793.4
(Continued)

(51) Int. Cl.
*F21V 8/00*        (2006.01)
*G02B 27/01*    (2006.01)
*H01L 25/075*  (2006.01)

(52) U.S. Cl.
CPC ........ *G02B 6/0031* (2013.01); *G02B 27/0172* (2013.01); *H01L 25/0753* (2013.01); *G02B 6/0076* (2013.01); *G02B 2027/0147* (2013.01)

(58) Field of Classification Search
CPC ............. G02B 6/0031; G02B 27/0172; G02B 6/0076; G02B 2027/0147;
(Continued)

(56) References Cited

U.S. PATENT DOCUMENTS 4,979,002 A      12/1990   Pankove
5,526,063 A *    6/1996    Joubert ................ H04N 9/3105
                                                                     348/744
(Continued)

FOREIGN PATENT DOCUMENTS

DE    19744793 A1    4/1998
DE    19751649 A1    5/1999
(Continued)

OTHER PUBLICATIONS

Buljan et al., "Ultra-Compact Multichannel Freeform Optics for 4xWUXGA OLED Microdisplays," Proc. SPIE 10676, Digital Optics for Immersive Displays, 9 pages (2018).
(Continued)

*Primary Examiner* — Tracie Y Green
(74) *Attorney, Agent, or Firm* — Arent Fox LLP

(57) ABSTRACT

The invention relates to various aspects of a μ-LED or a μ-LED array for augmented reality or lighting applications, in particular in the automotive field. The μ-LED is characterized by particularly small dimensions in the range of a few μm.

28 Claims, 47 Drawing Sheets

(30) Foreign Application Priority Data

| | | |
|---|---|---|
| Jun. 14, 2019 | (DE) | 102019116312.9 |
| Jul. 4, 2019 | (DE) | 102019118082.1 |
| Jul. 4, 2019 | (DE) | 102019118085.6 |
| Nov. 15, 2019 | (DE) | 102019130934.4 |

(58) Field of Classification Search
CPC ...... G02B 2027/014; G02B 2027/0123; H01L 25/0753; G06F 3/013; G06F 3/012; G06T 19/006; G06T 5/50; G09G 2320/028; G09G 3/002; H04N 5/3415
See application file for complete search history.

(56) References Cited

U.S. PATENT DOCUMENTS

| | | | |
|---|---|---|---|
| 5,537,171 | A | 7/1996 | Ogino et al. |
| 7,254,282 | B2 * | 8/2007 | Sathyanarayana .... G06T 3/4007 382/300 |
| 7,808,005 | B1 | 10/2010 | Fattal et al. |
| 8,349,116 | B1 | 1/2013 | Bibl et al. |
| 10,162,182 | B2 * | 12/2018 | Jepsen ................. G02B 3/0056 |
| 10,177,195 | B2 | 1/2019 | Ahmed et al. |
| 10,466,487 | B2 * | 11/2019 | Blum ................. G02B 27/0172 |
| 10,802,334 | B2 | 10/2020 | Kim et al. |
| 10,903,193 | B2 | 1/2021 | Yamada |
| 2003/0141507 | A1 | 7/2003 | Krames et al. |
| 2003/0189125 | A1 | 10/2003 | Trierenberg |
| 2005/0194598 | A1 | 9/2005 | Kim et al. |
| 2005/0237488 | A1 | 10/2005 | Yamasaki et al. |
| 2006/0002247 | A1 * | 1/2006 | Kim ..................... G11B 7/1369 369/44.11 |
| 2008/0061304 | A1 | 3/2008 | Huang et al. |
| 2009/0315054 | A1 | 12/2009 | Kim et al. |
| 2010/0019697 | A1 | 1/2010 | Korsunsky et al. |
| 2010/0163894 | A1 | 7/2010 | Uemura et al. |
| 2010/0252103 | A1 | 10/2010 | Yao et al. |
| 2011/0151602 | A1 | 6/2011 | Speier |
| 2011/0204327 | A1 | 8/2011 | Hiruma et al. |
| 2012/0223289 | A1 | 9/2012 | Gwo et al. |
| 2013/0063815 | A1 | 3/2013 | Kubota |
| 2013/0082624 | A1 | 4/2013 | Brassfield et al. |
| 2014/0008677 | A1 | 1/2014 | Zhu et al. |
| 2014/0131753 | A1 | 5/2014 | Ishida et al. |
| 2015/0103404 | A1 | 4/2015 | Rudy et al. |
| 2015/0187991 | A1 | 7/2015 | McGroddy et al. |
| 2015/0207399 | A1 | 7/2015 | Li et al. |
| 2015/0280086 | A1 | 10/2015 | Jang et al. |
| 2016/0315218 | A1 | 10/2016 | Bour et al. |
| 2016/0341942 | A1 | 11/2016 | Cheon et al. |
| 2017/0082263 | A1 | 3/2017 | Byrnes et al. |
| 2017/0254518 | A1 | 9/2017 | Vasylyev |
| 2017/0278733 | A1 | 9/2017 | Chang |
| 2017/0352313 | A1 | 12/2017 | Miyake |
| 2018/0097033 | A1 * | 4/2018 | Ahmed ................. H01L 27/156 |
| 2018/0114878 | A1 | 4/2018 | Danesh et al. |
| 2018/0180249 | A1 | 6/2018 | Yamada et al. |
| 2018/0182298 | A1 | 6/2018 | Jang et al. |
| 2018/0211595 | A1 | 7/2018 | Takahashi et al. |
| 2018/0247586 | A1 | 8/2018 | Vahid Far et al. |
| 2018/0275410 | A1 * | 9/2018 | Yeoh ..................... H04N 13/344 |
| 2018/0301433 | A1 | 10/2018 | Robin et al. |
| 2018/0323116 | A1 | 11/2018 | Wu et al. |
| 2018/0331258 | A1 | 11/2018 | Halbritter et al. |
| 2018/0342492 | A1 | 11/2018 | Lu |
| 2018/0367769 | A1 * | 12/2018 | Greenberg ........... H04N 9/3173 |
| 2019/0044023 | A1 | 2/2019 | Cheng et al. |
| 2019/0058081 | A1 | 2/2019 | Ahmed et al. |
| 2019/0113727 | A1 | 4/2019 | Tamma |
| 2019/0165209 | A1 * | 5/2019 | Bonar ..................... H01L 33/10 |
| 2019/0174079 | A1 * | 6/2019 | Anthony ................ G02B 27/58 |
| 2019/0229097 | A1 | 7/2019 | Takeya et al. |
| 2019/0293939 | A1 * | 9/2019 | Sluka ................. G02B 27/0075 |
| 2019/0305185 | A1 | 10/2019 | Lauermann et al. |
| 2020/0119233 | A1 | 4/2020 | Dupont |
| 2020/0219855 | A1 * | 7/2020 | Chen ..................... H01L 33/483 |
| 2020/0227594 | A1 | 7/2020 | Kuo |
| 2020/0343230 | A1 * | 10/2020 | Sizov ..................... H01L 33/60 |
| 2020/0357103 | A1 * | 11/2020 | Wippermann ..... H04N 5/23238 |
| 2020/0366067 | A1 | 11/2020 | David et al. |

FOREIGN PATENT DOCUMENTS

| | | |
|---|---|---|
| DE | 19911717 A1 | 9/2000 |
| DE | 10009782 A1 | 9/2001 |
| DE | 102007043877 A1 | 1/2009 |
| DE | 102007046339 A1 | 4/2009 |
| DE | 102005063159 B4 | 5/2009 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 0488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |
| EP | 2396818 A2 | 12/2011 |
| EP | 2430652 A | 3/2012 |
| EP | 2609624 | 3/2012 |
| EP | 2477240 A1 | 7/2012 |
| EP | 2506321 A1 | 10/2012 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986082 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 33673774 A1 | 8/2018 |
| JP | H06244457 A | 9/1994 |
| JP | 2007264610 A | 10/2007 |
| JP | 2007324416 A | 12/2007 |
| JP | 2009186794 A | 8/2009 |
| JP | 2015099238 A | 5/2015 |
| KR | 20130052944 A1 | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |

(56) References Cited

FOREIGN PATENT DOCUMENTS

| WO | 2018117382 A1 | 6/2018 |
| WO | 2018123280 A1 | 7/2018 |

OTHER PUBLICATIONS

Fortuna, "Integrated Nanoscale Antenna-LED for On-Chip Optical Communication," UC Berkeley, 146 pages (2017).

Li et al., "Waveguiding in Vertical Cavity Quantum-Well Structure Defined by Ion Implantation," J. Lightwave Technol. 16, pp. 1498-1508 (1998).

Ogihara et al., "1200 Dots-Per-Inch Light Emitting Diode Array Fabricated by Solid-Phase Zinc Diffusion," IEICE Transactions on Electronics, 80:3, pp. 489-497 (1997).

Stevens et al., "Varifocal Technologies Providing Prescription and VAC Mitigation in HMDs Using Alvarez Lenses," Proc. SPIE 10676, Digital Optics for Immersive Displays, 18 pages (2018).

Tomioka et al., "Selective-Area Growth of III-V Nanowires and Their Applications," Journal of Materials Research, 26 (17), pp. 2127-2141 (2011).

Waldern et al., "DigiLens Switchable Bragg Grating Waveguide Optics for Augmented Reality Applications," Proc. SPIE 10676, Digital Optics for Immersive Displays, 17 pages (2018).

Wheelwright et al., "Field of View: Not Just a Number," Proc. SPIE 10676, Digital Optics for Immersive Displays, 8 pages (2018).

Yu et al., "Hybrid LED Driver for Multi-Channel Output with High Consistency," 2015 IEEE 11th International Conference on ASIC (ASICON), Chengdu, 4 pages (2015).

Huang et al., "Metasurface holography: from fundamentals to applications," Nanophotonics. 7(6), pp. 1169-1190 (2018).

International Search Report for International Patent Application No. PCT/EP2020/058997, dated Mar. 5, 2021 (10 pages).

International Search Report for International Patent Application No. PCT/EP2020/058547, dated Mar. 26, 2021 (9 pages).

\* cited by examiner

| | App. Field | Usecase | Viewing Distance [cm] | Min. Size X*Y [cm] | Max. Size X*Y [cm] | PPI | PP [μm] | Res. Type |
|---|---|---|---|---|---|---|---|---|
| Direct Emitter Display | Auto | Low res HuD | tbd | tbd | tbd | tbd | tbd | tbd |
| | Auto | Multi Media Display Rear | 30 - 40 | 15*10 | 25*15 | ≥ 250 | ≤ 102 | mid res |
| | Auto | Rear View Mirror / Replacement | 25 - 70 | 16*6 | 30*15 | ≥ 250 | ≤ 102 | |
| | Auto | Display in the Window Pillars | 25 - 150 | 20*5 | 100*30 | ≥ 250 | ≤ 102 | |
| | Auto | Cluster | 40 - 70 | 20*10 | 90*30 | ≥ 200 | ≤ 127 | |
| | Auto | Center Stack | 40 - 70 | 12*9 | 40*25 | ≥ 200 | ≤ 127 | |
| | Auto | Small Distributed info Displays (e.g. AC Control) | 40 - 70 | 1*0,5 | 6*6 | ≥ 200 | ≤ 127 | |
| | Auto | Extended Cluster Across Dash Board | 40 - 70 | 150*10 | 180*30 | ≥ 200 | ≤ 127 | |
| | Auto | Exterior Advertisement good resolution | 50 - 150 | 30*30 | 50*150 | ≥ 100 | ≤ 254 | |
| | Auto | Roof / Sky | 20 - 40 | 70*40 | 200*180 | ≥ 50 | ≤ 508 | low res |
| | Auto | RCL | 200 - .... | 20*10 | 50*30 | ≥ 50 | ≤ 508 | |
| | Auto | Decoration Style Displays | 20 - 200 | 20*10 | 180*30 | ≥ 50 | ≤ 508 | |
| | MM | Command & Control | 300-1500 | 200*200 | 5000*300 | ≤ 30 | ≥ 847 | very low res |
| | MM | Conference/Board Rooms | 1000-10000 | 70*180 | 300*600 | ≤ 30 | ≥ 847 | |
| | Auto | Pedestrian Communication | 200-...... | tbd | tbd | ≥ 25 | ≤ 1016 | |
| | Auto | Exterior Advertisement | 50-2000 | 30*30 | 50*150 | ≥ 25 | ≤ 1016 | |
| | MM | Electronic Posters | 50-2000 | 100*200 | 200*400 | ≥ 25 | ≤ 1016 | |
| | MM | Cinema | 3000-50000 | 500*300 | 800*2000 | ≤ 10 | ≥ 2540 | |

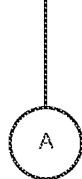

FIG. 3B-1

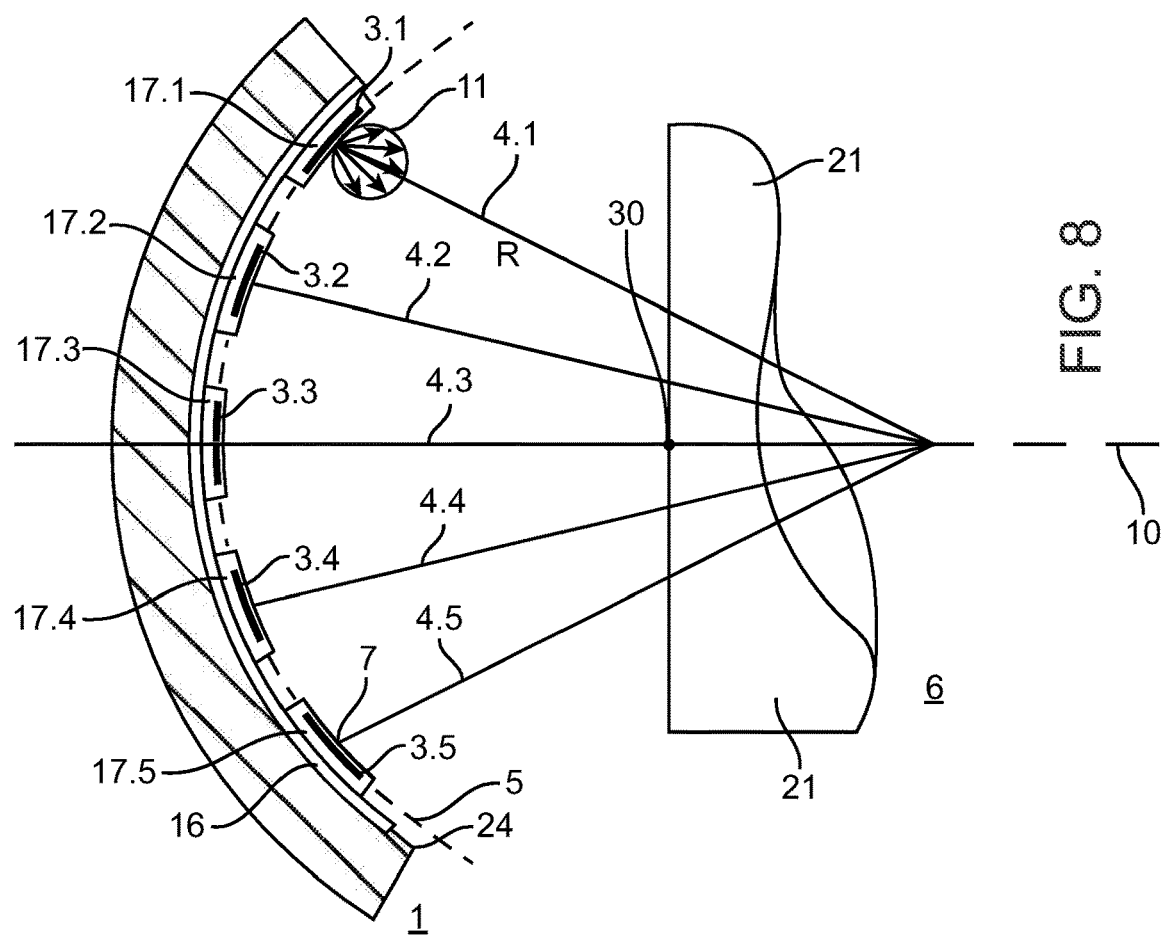
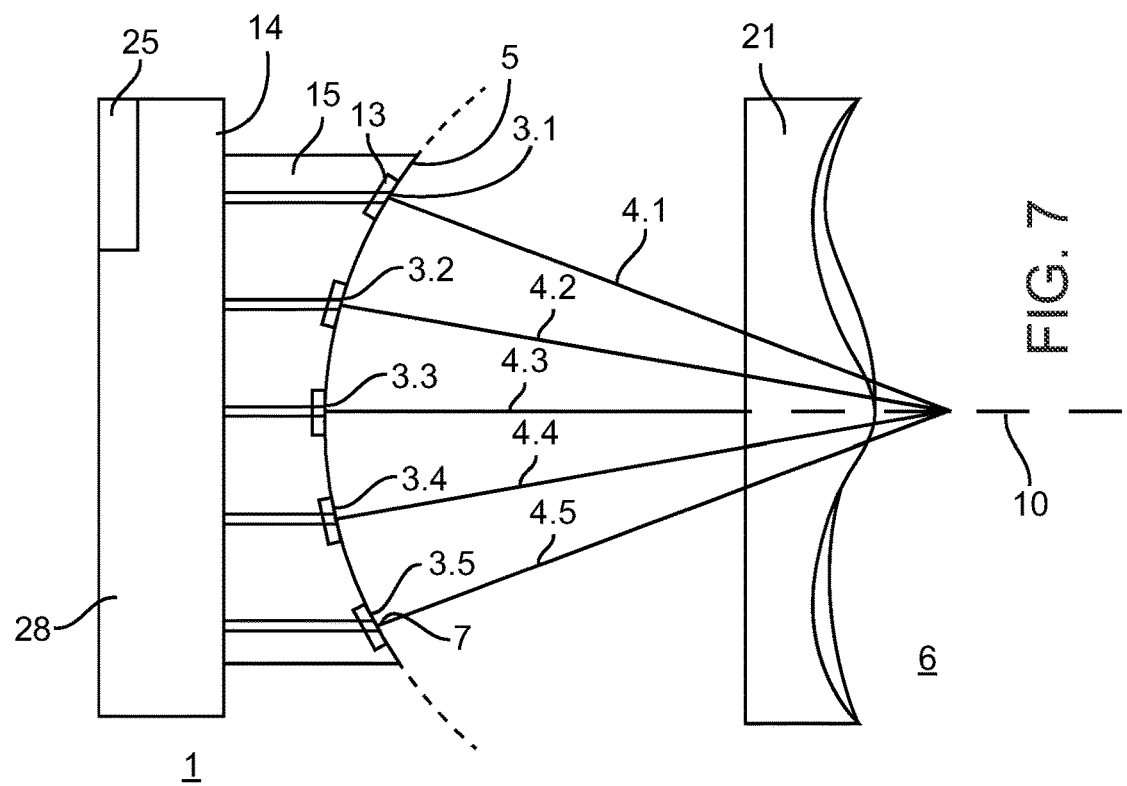

μ-LED, μ-LED DEVICE, DISPLAY AND METHOD FOR THE SAME

This patent application claims the priorities of the German applications, DE 10 2019 118 082.1 of 4 Jul. 2019, DE 10 2019 130 934.4 of 15 Nov. 2019, DE 10 2019 116 312.9 of 14 Jun. 2019, DE 10 2019 118 085.6 of 4 Jul. 2019, DE 10 2019 113 793.4 of 23 May 2019, as well as the priority of the Danish applications DK PA201970059 of 29 Jan. 2019, the disclosure of which are incorporated herein by way of reference. Finally, this application also claims priority from the PCT application PCT/EP2020/052191 of 29 Jan. 2020. The disclosure of PCT/EP2020/052191 is incorporated herein by reference in its entirety. Additionally, this patent application is related to the following co-pending patent applications: U.S. application Ser. No. 17/038,283, entitled "μ-LED, μ-LED Device, Display and Method for the Same," filed Sep. 30, 2020; U.S. application Ser. No. 17/039,283, entitled "μ-LED, μ-LED Device, Display and Method for the Same," filed Sep. 30, 2020; U.S. application Ser. No. 17/039,097, entitled "μ-LED, μ-LED Device, Display and Method for the Same," filed Sep. 30, 2020; and U.S. application Ser. No. 17/039,482, entitled "μ-LED, μ-LED Device, Display and Method for the Same," filed Sep. 30, 2020;

Additionally, this patent application is related to the following co-pending patent applications: U.S. application Ser. No. 17/038,283, entitled "μ-LED, μ-LED Device, Display and Method for the Same," filed Sep. 30, 2020; U.S. application Ser. No. 17/039,097, entitled "μ-LED, μ-LED Device, Display and Method for the Same," filed Sep. 30, 2020; U.S. application Ser. No. 17/039,283, entitled "μ-LED, μ-LED Device, Display and Method for the Same," Sep. 30, 2020; and U.S. application Ser. No. 17/039,482, entitled "μ-LED, μ-LED Device, Display and Method for the Same," filed Sep. 30, 2020.

BACKGROUND

The ongoing current developments within the Internet of Things and the field of communication have opened the door for various new applications and concepts. For development, service and manufacturing purposes, these concepts and applications offer increased effectiveness and efficiency.

One aspect of new concepts is based on augmented or virtual reality. A general definition of "augmented reality" is given by an "interactive experience of the real environment, whereby the objects from it, which are in the real world, are augmented by computer generated perceptible information".

The information is mostly transported by visualization, but is not limited to visual perception. Sometimes haptic or other sensory perceptions can be used to expand reality. In the case of visualization, the superimposed sensory-visual information can be constructive, i.e. additional to the natural environment, or it can be destructive, for example by obscuring parts of the natural environment. In some applications, it is also possible to interact with the superimposed sensory information in one way or another. In this way, augmented reality reinforces the ongoing perception of the user of the real environment.

In contrast, "virtual reality" completely replaces the real environment of the user with an environment that is completely simulated. In other words, while in an augmented reality environment the user is able to perceive the real world at least partially, in a virtual reality the environment is completely simulated and may differ significantly from reality.

Augmented Reality can be used to improve natural environmental situations, enriching the user's experience or supporting the user in performing certain tasks. For example, a user may use a display with augmented reality features to assist him in performing certain tasks. Because information about a real object is superimposed to provide clues to the user, the user is supported with additional information, allowing the user to act more quickly, safely and effectively during manufacturing, repair or other services. In the medical field, augmented reality can be used to guide and support the doctor in diagnosing and treating the patient. In development, an engineer may experience the results of his experiments directly and can therefore evaluate the results more easily. In the tourism or event industry, augmented reality can provide a user with additional information about sights, history, and the like. Augmented Reality can support the learning of activities or tasks.

SUMMARY

In the following summary different aspects for μ-displays in the automotive and augmented reality applications are explained. This includes devices, displays, controls, process engineering methods and other aspects suitable for augmented reality and automotive applications. This includes aspects which are directed to light generation by means of displays, indicators or similar. In addition, control circuits, power supplies and aspects of light extraction, light guidance and focusing as well as applications of such devices are listed and explained by means of various examples.

Because of the various limitations and challenges posed by the small size of the light-generating components, a combination of the various aspects is not only advantageous, but often necessary. For ease of reference, this disclosure is divided into several sections with similar topics. However, this should explicitly not be understood to mean that features from one topic cannot be combined with others. Rather, aspects from different topics should be combined to create a display for augmented reality or other applications or even in the automotive sector.

For considerations of the following solutions, some terms and expressions should be explained in order to define a common and equal understanding. The terms listed are generally used with this understanding in this document. In individual cases, however, there may be deviations from the interpretation, whereby such deviation will be specifically referred to.

"Active Matrix Display"

The term "active matrix display" was originally used for liquid crystal displays containing a matrix of thin film transistors that drive LCD pixels. Each individual pixel has a circuit with active components (usually transistors) and power supply connections. At present, however, this technology should not be limited to liquid crystals, but should also be used in particular for driving μ-LEDs or μ-displays.

"Active Matrix Carrier Substrate"

"Active matrix carrier substrate" or "active matrix backplane" means a drive for light emitting diodes of a display with thin-film transistor circuits. The circuits may be integrated into the backplane or mounted on it. The "active matrix carrier substrate" has one or more interface contacts, which form an electrical connection to a μ-LED display structure. An "active-matrix carrier substrate" can thus be part of an active-matrix display or support it.

"Active Layer"

The active layer is referred to as the layer in an optoelectronic component or light emitting diode in which charge carriers recombine. In its simplest form, the active layer can be characterized by a region of two adjacent semiconductor layers of different conductivity type. More complex active layers comprise quantum wells (see there), multi-quantum wells or other structures that have additional properties. Similarly, the structure and material systems can be used to adjust the band gap (see there) in the active layer, which determines the wavelength and thus the color of the light.

"Alvarez Lens Array"

With the use of Alvarez lens pairs, a beam path can be adapted to video eyewear. An adjustment optic comprises an Alvarez lens arrangement, in particular a rotatable version with a Moire lens arrangement. Here, the beam deflection is determined by the first derivative of the respective phase plate relief, which is approximated, for example, by $z=ax2+by2+cx+dy+e$ for the transmission direction z and the transverse directions x and y, and by the offset of the two phase plates arranged in pairs in the transverse directions x and y. For further design alternatives, swivelling prisms are provided in the adjustment optics.

"Augmented Reality (AR)"

This is an interactive experience of the real environment, where the subject of the picking up is located in the real world and is enhanced by computer-generated perceptible information. Extended reality is the computer-aided extension of the perception of reality by means of this computer-generated perceptible information. The information can address all human sensory modalities. Often, however, augmented reality is only understood to be the visual representation of information, i.e. the supplementation of images or videos with computer-generated additional information or virtual objects by means of fade-in/overlay. Applications and explanations of the mode of operation of Augmented Reality can be found in the introduction and in the following in execution examples.

"Automotive."

Automotive generally refers to the motor vehicle or automobile industry. This term should therefore cover this branch, but also all other branches of industry which include μ-displays or generally light displays—with very high resolution and μ-LEDs.

"Bandgap"

Bandgap, also known as band gap or forbidden zone, is the energetic distance between the valence band and conduction band of a solid-state body. Its electrical and optical properties are largely determined by the size of the band gap. The size of the band gap is usually specified in electron volts (eV). The band gap is thus also used to differentiate between metals, semiconductors and insulators. The band gap can be adapted, i.e. changed, by various measures such as spatial doping, deforming of the crystal lattice structure or by changing the material systems. Material systems with so-called direct band gap, i.e. where the maximum of the valence band and a minimum of the conduction band in the pulse space are superimposed, allow a recombination of electron-hole pairs under emission of light.

"Bragg Grid"

Fibre Bragg gratings are special optical interference filters inscribed in optical fibres. Wavelengths that lie within the filter bandwidth around AB are reflected. In the fiber core of an optical waveguide, a periodic modulation of the refractive index is generated by means of various methods. This creates areas with high and low refractive indexes that reflect light of a certain wavelength (bandstop). The center wavelength of the filter bandwidth in single-mode fibers results from the Bragg condition.

"Directionality"

Directionality is the term used to describe the radiation pattern of a μ-LED or other light-emitting device. A high directionality corresponds to a high directional radiation, or a small radiation cone. In general, the aim should be to obtain a high directional radiation so that crosstalk of light into adjacent pixels is avoided as far as possible. Accordingly, the light-emitting component has a different brightness depending on the viewing angle and thus differs from a Lambert emitter.

The directionality can be changed by mechanical measures or other measures, for example on the side intended for the emission. In addition to lenses and the like, this includes photonic crystals or pillar structures (columnar structures) arranged on the emitting surface of a pixelated array or on an arrangement of, in particular, μ-LEDs. These generate a virtual band gap that reduces or prevents the propagation of a light vector along the emitting surface.

"Far Field"

The terms near field and far field describe spatial areas around a component emitting an electromagnetic wave, which differ in their characterization. Usually the space regions are divided into three areas: reactive near field, transition field and far field. In the far field, the electromagnetic wave propagates as a plane wave independent of the radiating element.

"Fly Screen Effect"

The Screen Door Effect (SDE) is a permanently visible image artefact in digital video projectors. The term fly screen effect describes the unwanted black space between the individual pixels or their projected information, which is caused by technical reasons, and takes the form of a fly screen. This distance is due to the construction, because between the individual LCD segments run the conductor paths for control, where light is swallowed and therefore cannot hit the screen. If small optoelectronic lighting devices and especially μ-LEDs are used or if the distance between individual light emitting diodes is too great, the resulting low packing density leads to possibly visible differences between pointy illuminated and dark areas when viewing a single pixel area. This so-called fly screen effect (screen door effect) is particularly noticeable at a short viewing distance and thus especially in applications such as VR glasses. Sub-pixel structures are usually perceived and perceived as disturbing when the illumination difference within a pixel continues periodically across the matrix arrangement. Accordingly, the fly screen effect in automotive and augmented reality applications should be avoided as far as possible.

"Flip Chip"

Flip-chip assembly is a process of assembly and connection technology for contacting unpackaged semiconductor chips by means of contact bumps, or short "bumps". In flip-chip mounting, the chip is mounted directly, without any further connecting wires, with the active contacting side down—towards the substrate/circuit carrier—via the bumps. This results in particularly small package dimensions and short conductor lengths. A flip-chip is thus in particular an electronic semiconductor component contacted on its rear side. The mounting may also require special transfer techniques, for example using an auxiliary carrier. The radiation direction of a flip chip is then usually the side opposite the contact surfaces.

"Flip-Flop"

A flip-flop, often called a bi-stable flip-flop or bi-stable flip-flop element, is an electronic circuit that has two stable states of the output signal. The current state depends not only on the input signals present at the moment, but also on the state that existed prior to the time under consideration. A dependence on time does not exist, but only on events. Due to the bi-stability, the flip-flop can store a data quantity of a single bit for an unlimited time. In contrast to other types of storage, however, power supply must be permanently guaranteed. The flip-flop, as the basic component of sequential circuits, is an indispensable component of digital technology and thus a fundamental component of many electronic circuits, from quartz watches to microprocessors. In particular, as an elementary one-bit memory, it is the basic element of static memory components for computers. Some designs can use different types of flip-flops or other buffer circuits to store state information. Their respective input and output signals are digital, i.e. they alternate between logical "false" and logical "true". These values are also known as "low" 0 and "high" 1.

"Head-Up Display"

The head-up display is a display system or projection device that allows users to maintain their head position or viewing direction by projecting information into their field of vision.

The Head-up Display is an augmented reality system. In some cases, a Head-Up Display has a sensor to determine the direction of vision or orientation in space.

"Horizontal Light Emitting Diode"

With horizontal LEDs, the electrical connections are on a common side of the LED. This is often the back of the LED facing away from the light emission surface. Horizontal LEDs therefore have contacts that are only formed on one surface side.

"Interference Filter"

Interference filters are optical components that use the effect of interference to filter light according to frequency, i.e. color for visible light.

"Collimation"

In optics, collimation refers to the parallel direction of divergent light beams. The corresponding lens is called collimator or convergent lens. A collimated light beam contains a large proportion of parallel rays and is therefore minimally spread when it spreads. A use in this sense refers to the spreading of light emitted by a source. A collimated beam emitted from a surface has a strong dependence on the angle of radiation. In other words, the radiance (power per unit of a fixed angle per unit of projected source area) of a collimated light source changes with increasing angle. Light can be collimated by a number of methods, for example by using a special lens placed in front of the light source. Consequently, collimated light can also be considered as light with a very high directional dependence.

"Converter Material"

Converter material is a material, which is suitable for converting light of a first wavelength into a second wavelength. The first wavelength is shorter than the second wavelength. This includes various stable inorganic as well as organic dyes and quantum dots. The converter material can be applied and structured in various processes.

"Lambert Lamps"

For many applications, a so-called Lambertian radiation pattern is required. This means that a light-emitting surface ideally has a uniform radiation density over its area, resulting in a vertically circular distribution of radiant intensity. Since the human eye only evaluates the luminance (luminance is the photometric equivalent of radiance), such a Lambertian material appears to be equally bright regardless of the direction of observation. Especially for curved and flexible display surfaces, this uniform, angle-independent brightness can be an important quality factor that is sometimes difficult to achieve with currently available displays due to their design and LED technology.

LEDs and µ-LEDs resemble a Lambert spotlight and emit light in a large spatial angle. Depending on the application, further measures are taken to improve the radiation characteristics or to achieve greater directionality (see there).

"Conductivity Type"

The term "conductivity type" refers to the majority of (n- or p-) charge carriers in a given semiconductor material. In other words, a semiconductor material that is n-doped is considered to be of n-type conductivity. Accordingly, if a semiconductor material is n-type, then it is n-doped. The term "active" region in a semiconductor refers to a border region in a semiconductor between an n-doped layer and a p-doped layer. In this region, a radiative recombination of p- and n-type charge carriers takes place. In some designs, the active region is still structured and includes, for example, quantum well or quantum dot structures.

"Light Field Display"

Virtual retinal display (VNA) or light field display is referred to a display technology that draws a raster image directly onto the retina of the eye. The user gets the impression of a screen floating in front of him. A light field display can be provided in the form of glasses, whereby a raster image is projected directly onto the retina of a user's eye. In the virtual retina display, a direct retinal projection creates an image within the user's eye. The light field display is an augmented reality system.

"Lithography" or "Photolithography"

Photolithography is one of the central methods of semiconductor and microsystem technology for the production of integrated circuits and other products. The image of a photomask is transferred onto a photosensitive photoresist by means of exposure. Afterwards, the exposed areas of the photoresist are dissolved (alternatively, the unexposed areas can be dissolved if the photoresist is cured under light). This creates a lithographic mask that allows further processing by chemical and physical processes, such as applying material to the open areas or etching depressions in the open areas. Later, the remaining photoresist can also be removed.

"µ-LED"

A µ-LED is an optoelectronic component whose edge lengths are less than 70 µm, especially down to less than 20 µm, especially in the range of 1 µm to 10 µm. Another range is between 10 to 30 µm. This results in an area of a few hundred µm$^2$ down to several tens of µm$^2$. For example, a µ-LED can comprise an area of about 60 µm$^2$ with an edge length of about 8 µm. In some cases, a µ-LED has an edge length of 5 µm or less, resulting in a size of less than 30 µm$^2$. Typical heights of such µ-LEDs are, for example, in the range of 1.5 µm to 10 µm.

In addition to classic lighting applications, displays are the main applications for µ-LEDs. The µ-LEDs form pixels or subpixels and emit light of a defined color. Due to their small pixel size and high density with a small pitch, µ-LEDs are suitable for small monolithic displays for AR applications, among other things.

Due to the above-mentioned very small size of a µ-LED, the production and processing is significantly more difficult compared to previous larger LEDs. The same applies to additional elements such as contacts, package, lenses etc. Some aspects that can be realized with larger optoelectronic components cannot be produced with µ-LEDs or only in a different way. In this respect, a µ-LED is therefore significantly different from a conventional LED, i.e. a light emitting device with an edge length of 200 µm or more.

"µ-LED Array"

See at µ-Display

"µ-Display"

A µ-display or µ-LED array is a matrix with a plurality of pixels arranged in defined rows and columns. With regard to its functionality, a µ-LED array often forms a matrix of µ-LEDs of the same type and color. Therefore, it rather provides a lighting surface. The purpose of a µ-display, on the other hand, is to transmit information, which often results in the demand for different colors or an addressable control for each individual pixel or subpixel. A µ-display can be made up of several µ-LED arrays, which are arranged together on a backplane or other carrier. Likewise, a µ-LED array can also form a µ-Display.

The size of each pixel is in the order of a few µm, similar to µ-LEDs. Consequently, the overall dimension of a p display with 1920*1080 pixels with a µ-LED size of 5 µm per pixel and directly adjacent pixels is in the order of a few 10 $mm^2$. In other words, a µ-display or µ-LED array is a small-sized arrangement, which is realized by means of µ-LEDs.

µ-displays or µ-LED arrays can be formed from the same, i.e. from one work piece. The µ-LEDs of the µ-LED array can be monolithic. Such µ-displays or µ-LED arrays are called monolithic µ-LED arrays or µ-displays.

Alternatively, both assemblies can be formed by growing µ-LEDs individually on a substrate and then arranging them individually or in groups on a carrier at a desired distance from each other using a so-called Pick & Place process. Such µ-displays or µ-LED arrays are called non-monolithic. For non-monolithic µ-displays or µ-LED arrays, other distances between individual µ-LEDs are also possible. These distances can be chosen flexibly depending on the application and design. Thus, such µ-displays or µ-LED arrays can also be called pitch-expanded. In the case of pitch-expanded µ-displays or µ-LED arrays, this means that the µ-LEDs are arranged at a greater distance than on the growth substrate when transferred to a carrier. In a non-monolithic µ-display or µ-LED array, each individual pixel can comprise a blue light-emitting µ-LED and a green light-emitting µ-LED as well as a red light-emitting µ-LED.

To take advantage of different advantages of monolithic µ-LED arrays and non-monolithic µ-LED arrays in a single module, monolithic µ-LED arrays can be combined with non-monolithic µ-LED arrays in a µ-display. Thus, µ-displays can be used to realize different functions or applications. Such a display is called a hybrid display.

"µ-LED Nano Column"

A µ-LED nano column is generally a stack of semiconductor layers with an active layer, thus forming a µ-LED. The µ-LED nano column has an edge length smaller than the height of the column. For example, the edge length of a µ-LED nanopillar is approximately 10 nm to 300 nm, while the height of the device can be in the range of 200 nm to 1 µm or more.

"µ-Rod"

µ-rod or Rod designates in particular a geometric structure, in particular a rod or bar or generally a longitudinally extending, for example cylindrical, structure. µ-rods are produced with spatial dimensions in the µm to nanometer range. Thus, nanorods are also included here.

"Nanorods"

In nanotechnology, nanorods are a design of nanoscale objects. Each of their dimensions is in the range of about 10 nm to 500 nm. They may be synthesized from metal or semiconducting materials. Aspect ratios (length divided by width) are 3 to 5. Nanorods are produced by direct chemical synthesis. A combination of ligands acts as a shape control agent and attaches to different facets of the nanorod with different strengths. This allows different shapes of the nanorod with different growth rates to produce an elongated object. µLED nanopillars are such nano rods.

"Miniature LED"

Their dimensions range from 100 µm to 750 µm, especially in the range larger than 150 µm.

"Moiré Effect" and "Moiré Lens Arrangement"

The moiré effect refers to an apparent coarse raster that is created by overlaying regular, finer rasters. The resulting pattern, whose appearance is similar to patterns resulting from interference, is a special case of the aliasing effect by subsampling. In the field of signal analysis, aliasing effects are errors that occur when the signal to be sampled contains frequency components that are higher than half the sampling frequency. In image processing and computer graphics, aliasing effects occur when images are scanned and result in patterns that are not included in the original image. A moire lens array is a special case of an Alvarez lens array.

"Monolithic Construction Element"

A monolithic construction element is a construction element made of one piece. A typical such device is for example a monolithic pixel array, where the array is made of one piece and the µ-LEDs of the array are manufactured together on one carrier.

"Optical Mode"

A mode is the description of certain temporally stationary properties of a wave. The wave is described as the sum of different modes. The modes differ in the spatial distribution of the intensity. The shape of the modes is determined by the boundary conditions under which the wave propagates. The analysis according to vibration modes can be applied to both standing and continuous waves. For electromagnetic waves, such as light, laser and radio waves, the following types of modes are distinguished: TEM or transverse electromagnetic mode, TE or H modes, TM or E modes. TEM or transverse electromagnetic mode: Both the electric and the magnetic field components are always perpendicular to the direction of propagation. This mode is only propagation-capable if either two conductors (equipotential surfaces) insulated from each other are available, for example in a coaxial cable, or no electrical conductor is available, for example in gas lasers or optical fibers. TE or H modes: Only the electric field component is perpendicular to the direction of propagation, while the magnetic field component is in the direction of propagation. TM or E modes: Only the magnetic field component is perpendicular to the propagation direction, while the electric field component points in the propagation direction.

"Optoelectronic Device"

An optoelectronic component is a semiconductor body that generates light by recombination of charge carriers during operation and emits it. The light generated can range from the infrared to the ultraviolet range, with the wavelength depending on various parameters, including the material system used and doping. An optoelectronic component is also called a light emitting diode.

For the purpose of this disclosure, the term optoelectronic device or also light-emitting device is used synonymously. A PLED (see there) is thus a special optoelectronic device with regard to its geometry. In displays, optoelectronic components are usually monolithic or as individual components placed on a matrix.

"Passive matrix backplane" or "passive matrix carrier substrate" A passive matrix display is a matrix display, in which the individual pixels are driven passively (without additional electronic components in the individual pixels). A light emitting diode of a display can be controlled by means of IC circuits. In contrast, displays with active pixels driven by transistors are referred to as active matrix displays. A passive matrix carrier substrate is part of a passive matrix display and carries it.

"Photonic Crystal" or "Photonic Structure"

A photonic structure can be a photonic crystal, a quasi-periodic or deterministically aperiodic photonic structure. The photonic structure generates a band structure for photons by a periodic variation of the optical refractive index. This band structure can comprise a band gap in a certain frequency range. As a result, photons cannot propagate through the photonic structure in all spatial directions. In particular, propagation parallel to a surface is often blocked, but perpendicular to it is possible. In this way, the photonic structure or the photonic crystal determines a propagation in a certain direction. It blocks or reduces this in one direction and thus generates a beam or a bundle of rays of radiation directed as required into the room or radiation area provided for this purpose.

Photonic crystals are photonic structures occurring or created in transparent solids. Photonic crystals are not necessarily crystalline—their name derives from analogous diffraction and reflection effects of X-rays in crystals due to their lattice constants. The structure dimensions are equal to or greater than a quarter of the corresponding wavelength of the photons, i.e. they are in the range of fractions of a μm to several μm. They are produced by classical lithography or also by self-organizing processes.

Similar or the same property of a photonic crystal can alternatively be produced with non-periodic but nevertheless ordered structures. Such structures are especially quasiperiodic structures or deterministically aperiodic structures. These can be for example spiral photonic arrangements.

In particular, so-called two-dimensional photonic crystals are mentioned here as examples, which exhibit a periodic variation of the optical refractive index in two mutually perpendicular spatial directions, especially in two spatial directions parallel to the light-emitting surface and perpendicular to each other.

However, there are also one-dimensional photonic structures, especially one-dimensional photonic crystals. A one-dimensional photonic crystal exhibits a periodic variation of the refractive index along one direction. This direction can be parallel to the light exit plane. Due to the one-dimensional structure, a beam can be formed in a first spatial direction. Thereby a photonic effect can be achieved already with a few periods in the photonic structure. For example, the photonic structure can be designed in such a way that the electromagnetic radiation is at least approximately collimated with respect to the first spatial direction. Thus, a collimated beam can be generated at least with respect to the first direction in space.

"Pixel"

Pixel, image cell or picture element refers to the individual color values of a digital raster graphic as well as the area elements required to capture or display a color value in an image sensor or screen with raster control. A pixel is thus an addressable element in a display device and comprises at least one light-emitting device. A pixel has a certain size and adjacent pixels are separated by a defined distance or pixel space. In displays, especially μ-displays, often three (or in case of additional redundancy several) subpixels of different color are combined to one pixel.

"Planar Array"

A planar array is an essentially flat surface. It is often smooth and without protruding structures. Roughness of the surface is usually not desired and does not have the desired functionality. A planar array is for example a monolithic, planar array with several optoelectronic components.

"Pulse Width Modulation"

Pulse width modulation or PWM is a type of modulation for driving a component, in particular a μ-LED. Here the PWM signal controls a switch that is configured to switch a current through the respective μ-LED on and off so that the μ-LED either emits light or does not emit light. With the PWM, the output provides a square wave signal with a fixed frequency f. The relative quantity of the switch-on time compared to the switch-off time during each period T (=1/f) determines the brightness of the light emitted by the μ-LED. The longer the switch-on time, the brighter the light.

"Quantum Well"

A quantum well or quantum well refers to a potential in a band structure in one or more semiconductor materials that restricts the freedom of movement of a particle in a spatial dimension (usually in the z-direction). As a result, only one planar region (x, y plane) can be occupied by charge carriers. The width of the quantum well significantly determines the quantum mechanical states that the particles can assume and leads to the formation of energy levels (sub-bands), i.e. the particle can only assume discrete (potential) energy values.

"Recombination"

In general, a distinction is made between radiative and nonradiative recombination. In the latter case, a photon is generated which can leave a component. A non-radiative recombination leads to the generation of phonons, which heat a component. The ratio of radiative to non-radiative recombination is a relevant parameter and depends, among other things, on the size of the component. In general, the smaller the component, the smaller the ratio and non-radiative recombination increases in relation to radiative recombination.

"Refresh Time"

Refresh time is the time after which a cell of a display or similar must be rewritten so that it either does not lose the information or the refresh is predetermined by external circumstances.

"Die" or "Light-Emitting Body"

A light-emitting body or also a die is a semiconductor structure which is separated from a wafer after production on a wafer and which is suitable for generating light after an electrical contact during operation. In this context, a die is a semiconductor structure, which contains an active layer for light generation. The die is usually separated after contacting, but can also be processed further in the form of arrays.

"Slot Antenna"

A slot antenna is a special type of antenna in which instead of surrounding a metallic structure in space with air (as a nonconductor), an interruption of a metallic structure (e.g. a metal plate, a waveguide, etc.) is provided. This interruption causes an emission of an electromagnetic wave whose wavelength depends on the geometry of the interruption. The interruption often follows the principle of the dipole, but can theoretically have any other geometry. A slot antenna thus comprises a metallic structure with a cavity resonator having a length of the order of magnitude of wavelengths of visible light. The metallic structure can be located in or surrounded by an insulating material. Usually, the metallic structure is earthed to set a certain potential.

"Field of Vision"

Field of view (FOV) refers to the area in the field of view of an optical device, a sun sensor, the image area of a camera (film or picking up sensor) or a transparent display within which events or changes can be perceived and recorded. In particular, a field of view is an area that can be seen by a human being without movement of the eyes. With reference to augmented reality and an apparent object placed in front of the eye, the field of view comprises the area indicated as a number of degrees of the angle of vision during stable fixation of the eye.

"Subpixels"

A subpixel (approximately "subpixel") describes the inner structure of a pixel. In general, the term subpixel is associated with a higher resolution than can be expected from a single pixel. A pixel can also consist of several smaller subpixels, each of which radiates a single color. The overall color impression of a pixel is created by mixing the individual subpixels. A subpixel is thus the smallest addressable unit in a display device. A subpixel also comprises a certain size that is smaller than the size of the pixel to which the subpixel is assigned.

"Vertical Light Emitting Diode"

In contrast to the horizontal LED, a vertical LED comprises one electrical connection on the front and one on the back of the LED. One of the two sides also forms the light emission surface. Vertical LEDs thus comprise contacts that are formed towards two opposite main surface sides. Accordingly, it is necessary to deposit an electrically conductive but transparent material so that on the one hand, electrical contact is ensured and on the other hand, light can pass through.

"Virtual Reality"

Virtual reality, or VR for short, is the representation and simultaneous perception of reality and its physical properties in a real-time computer-generated, interactive virtual environment. A virtual reality can completely replace the real environment of an operator with a fully simulated environment.

Several aspects relate to the lighting design by suitable projection units after the light has left the emitter or µ-LED, i.e. the distance from a light source to the eye of a user. In some solutions, the display is in the line of vision of a user. These solutions are mainly relevant for automotive and other applications. Alternatively, the virtual elements can be created outside the direct line of sight and their light must then be directed to the user's eyes. In all cases, it should be ensured that the projection of the image to the user is sufficiently sharp and contrasty. This means that the pixels should be separated from each other, so that different raven between two adjacent pixels will create the same impression on the user.

In some aspects, a µ-display arrangement or display array will have optics to direct light emitted by the µ-LED array in certain spatial directions or to reduce its divergence, for example, or to allow shaping of a light beam emitted by the µ-LED array. For this purpose, the optics may include optical lenses and/or reflectors. The optics may also include, for example, optical filters to change the color of the emitted light. Furthermore, the optics may include, for example, light scattering agents to enable a better homogenization of the emitted light.

An arrangement with a µ-display may have optics for individual µ-LEDs or common optics for some or all µ-LEDs of the µ-LED array, for example to direct light emitted by these µ-LEDs in certain spatial directions or to reduce its divergence or to allow shaping of a light beam emitted by the µ-LEDs. For this purpose, the optics may comprise optical lenses or reflectors, for example. Furthermore, the optics may include, for example, optical filters or/and light scattering means to change the light color or the homogeneity of the emitted light for some or all µ-LEDs of the µ-Display. For example, the optics may be arranged on a common carrier for the µ-LEDs of the µ-LED array.

In another embodiment, an aspect of light guidance is considered when the light-emitting display is not in direct line of sight. For this purpose a light guide arrangement downstream of the light-emitting device and having at least two light-emitting devices emitting light of different colors.

The arrangement also comprises a first and a second elongated light guide arranged so that light generated by the light emitting devices is coupled into the light guide. For this purpose, the light guide arrangement further comprises a first coupling element disposed adjacent to the first elongated light guide and configured to couple light of the first color into the first elongated light guide. A second coupling element is disposed adjacent to the elongate second light guide and configured to launch the light of the second color into the elongate second light guide. Corresponding outcouplings are located at the respective end portions of each of the first and second elongated light guides. These guide the light to the user's eye. The light guide elements can be made of a transparent material so that they can be arranged in the direct line of sight of the user without impairing the user's vision. The coupling and decoupling elements can be implemented as separate elements or, for example, as a coating on the corresponding light guides.

The light emitting device may have a µ-LED display or a µ-LED display matrix and the like. These devices can be monolithically integrated. The sub-pixels of different colors can be integrated on a single device. As an alternative, a variety of µ-LED displays can be provided, each of the µ-LED displays being adapted to produce light of a specific color. The generated light can then be combined by different optics placed in front of the µ-LED display. Using different µ-LED displays can reduce the technical requirements regarding the size of individual pixels compared to a solution where sub-pixels of different colors are arranged on the same substrate. The above solution uses different coupling elements to couple selectively the light from the light emitting device into the corresponding light guide. In one aspect, another third coupling element is provided and positioned opposite the second coupling element. The third coupling element is adapted to couple light of a third color into the elongated second light guide. The different launching element allows a separate launching of light of a different color into the corresponding light guide. The separation allows addressing aspects when light of different colors or wavelengths is handled. In this respect, light of the third color may have a longer wavelength than the second color.

Depending on the design, light can be generated at a point that is displaced or offset in relation to the light guides. Accordingly, light generated by the light-emitting device may have an angle of incidence between 30° and 90°, in particular between 45° and 90° and in particular between 60° and 90°, with respect to the surface of the light guide. In other words, the light is not parallel to the elongated light guide when it is launched into the guide through the launching element. In some aspects, at least one of the first and second launching elements may be located on the sidewall of the corresponding elongated light guide. The dimension of the corresponding launching elements is selected so that all light from the different pixels of the light-emitting array is launched.

The first and second elongated light guides can be arranged essentially parallel to each other. They may be separated from each other using spacers between them to provide space for the input and outcouplings. Apart from the input couplers, the end sections of the corresponding light guides may have an outcoupling. The outcoupling element arranged on the output section of the elongated first light guide is adapted to couple out light of the first color. The outcoupling element arranged on the output part of the elongated second light guide is adapted to couple out light of the second color. Furthermore, a third outcoupling element is provided in some variants. The third outcoupling element is located on the output part of the elongated second light guide opposite the second outcoupling element to couple out light of the third color. The corresponding outcoupling elements are arranged in such a way that the light coupled out by the corresponding outcoupling elements is directed towards an eye of the user. It is appropriate if some of the outcoupling elements are transparent to light of a different color. For example, the first outcoupling element is transparent to light of the second and/or third color. The second outcoupling element can at least be transparent to light of the third color.

Due to the small size of µ-LEDs, one difficulty for optoelectronic components is to achieve efficient beam extraction. Likewise, the beam should already be collimated when leaving the device in order to couple it into an optical device in a suitable way. Due to the small size of the individual components on a µ-display, classical lenses placed in front of the individual components are difficult to realize. Therefore, in the following a concept is presented that is based on a curved emission surface, a foveated display is based on. In addition, a small imaging error should be achieved.

Starting point of the concept is an illumination arrangement comprising a light-emitting optoelectronic element and an optical device for beam conversion of the electromagnetic radiation generated by the light-emitting optoelectronic element, wherein the optoelectronic element comprises several emission regions arranged in matrix form and each emission region is assigned a main beam direction.

It was found that the optical device following the light-emitting optoelectronic element in the beam path can be of simplified design if at least some and preferably all emission regions of the light-emitting optoelectronic element are arranged in such a way that their centres lie on a curved surface. In one aspect, this can be achieved with a concavely curved surface. The center of an emission area is understood to be the intersection of the main beam direction with the surface of the emission area emitting electromagnetic radiation.

In one aspect, the curved surface forms a spherical segment whose associated spherical center lies on the optical axis of the optical device. For the preferred concave curved surface for the arrangement of the centres of the emission regions, the centre of the sphere is at a distance from the light-emitting optoelectronic element in the direction of the beam path. Alternatively, the curved surface is a rotating conical section, for example an ellipsoid, paraboloid or hyperboloid.

For a first embodiment, adjacent emission areas are tilted against each other so that the main radiation directions of the emission areas are at an angle to each other. For a second, alternative embodiment, there are emission areas with a coinciding main beam direction, which are arranged on different planes with a different distance in the main beam direction to the optical device.

For a further embodiment, it is proposed that the optical device forms a system optic, in particular an imaging projection optic. By the arrangement of the emission regions an improved compensation of the field curvature of the system optics is achieved. Additionally, the imaging in the projection optics can be simplified. For a further design of these concepts, several nonplanar collimating optical elements are provided between the emission areas and the system optics.

In one aspect, each individual emission area forms a separate Lambertian radiator. Furthermore, the emission areas are very small in area and have maximum edge lengths of less than 70 µm, in particular less than 25 µm. For an embodiment of the illumination arrangement, at least one of the emission regions is formed by the aperture of a primary optical element assigned to a µ-LED or a converter element assigned to a µ-LED. Alternatively, the emission regions can comprise readily collimating elements, for example in the form of a photonic structure In this case, the emission regions whose centres lie on a curved surface can be part of a monolithic pixelated optochip or they are arranged in several separate optochips arranged on a nonplanar IC substrate.

A plurality of different projection units are known in the art, with which images can be displayed in specifically defined image planes according to requirements. Such projection units are used in so-called augmented reality or virtual reality glasses or in head-up displays, for example in motor vehicles. In the aforementioned special applications of projection units, augmented reality applications and head-up displays regularly display enlarged images at a distance from the viewer. In contrast, in virtual reality glasses, the projection optics usually take over the function of a magnifying glass that enlarges the display.

In this context, display units for motor vehicles are known from EP 1 544 660 and DE 197 51 649 A1. The latter uses an intermediate image on a ground glass screen in order to display the image on the windscreen to the correct side for the driver by means of additional optics. In this way, it is possible to display instruments, warning displays or other information important to the driver directly in the field of vision, so that he can see the information without having to look away from the road ahead.

An alternative embodiment to transfer images to or into the eye of a user is achieved by so-called light field displays, also known as virtual retinal display (VNA). In contrast to normal displays, which create an image on a plane directly in front of the user's eye, light field displays create an image inside the eye by direct retinal projection.

The requirement for a light field display of small size and light weight to achieve a comfortably portable system is contrary to the desire to achieve a large field of view with high resolution. Up to now, arrangements with µ-displays as image generators and these imaging multi-channel optics have been proposed, which split the beam path for reshaping and reunite it on the retina. A suitable system with hybrid diffractive-refractive optics and free-form lenses is described by Marina Buljan, et al., "Ultra-compact multi-channel freeform optics for 4×WUXGA OLED microdisplays", Proc. SPIE 10676, Digital Optics for Immersive Displays, 1067607 (21 May 2018).

Other projection units are also known whose pixels emit light that is mixed from light of different colors. In these solutions, light is generated spatially separated and then mixed by suitable optical elements, such as an achromatic lens, and combined into a beam. In the case of displays that generate color by means of pixels arranged in a matrix on a surface, the light must be sufficiently collimated to be able to resolve adjacent pixels of different colors, especially at high fill factors.

In contrast, other solutions suggest using μ-LEDs with a low packing density. However, this leads to significant differences between punctually illuminated and dark areas when viewing a single pixel area. This so-called fly screen effect (screen door effect) is particularly noticeable at a short viewing distance and thus especially in applications such as AR or VR glasses.

Other solutions with adaptive optics for phase modulation and beam shaping are mentioned by Jonathan D. Waldern, "DigiLens switchable Bragg grating waveguide optics for augmented reality applications", Proc. SPIE 10676, Digital Optics for Immersive Displays, 106760G (21 May 2018). Waveguides are proposed for HMDs with integrated diffractive optical elements (DOE) formed by switchable Bragg gratings (SBG). To produce the SBGs, liquid crystals are embedded in a polymer. Prior to polymerization, pattern-forming cavities are created by holographic processes to accommodate the liquid crystal phase in the monomer starting material. After solidification of the matrix, the liquid crystals can be aligned by means of an electric field so that a variation of the refractive index results in a switchable beam deflection.

An alternative adjustment optics for VR HMDs is described by R. E. Stevens, et al., "Varifocal technologies providing Prescription and VAC mitigation in HMDs using Alvarez Lenses", Proc. SPIE 10676, Digital Optics for Immersive Displays, 106760J (21 May 2018). The disclosure concerns the use of Alvarez lens pairs to adjust the beam path of video glasses.

Based on the known problems, further solutions will be proposed. It is considered to be not insignificant that the optics used for beam guidance and beam shaping are as efficient as possible so that optical losses are considerably minimized.

One aspect thus concerns a projection unit comprising an optoelectronic lighting device and projection optics, the optoelectronic lighting device comprising a matrix of pixels for the emission of visible light. Each pixel comprises several μ-LEDs with spectrally different light emission so that sub-pixels of different colors are formed. Each μ-LED is separately controllable and may be connected to the driver circuits disclosed in this application. The matrix of pixels comprises in some aspects one or more μ-LED modules having the structures disclosed in this application. For example, the matrix may comprise an antenna structure or a bar shape as disclosed herein. Various measures such as a transparent cover electrode, photonic structure or similar may be provided to improve outcoupling and directionality. In one configuration, the matrix can be formed by pixel modules (each with three subpixels) attached to a carrier substrate. The carrier substrate may contain leads and drive circuits and may be made of a different material system than the matrix.

In addition, each pixel is assigned a separate collimation optics, which is connected upstream of the projection optics to increase the fill factor. According to the invention, the collimation optics are configured in such a way that enlarged and overlapping intermediate images of the μ-LEDs of the respective pixel are generated in the beam path in front of the projection optics. Accordingly, the collimation optics assigned to each individual pixel not only increases the degree of illumination of a pixel, but additionally enables a spatial correction of the radiation of the μ-LEDs forming subpixels by means of the most accurate possible superimposition of the subpixel intermediate images, which enables efficient light coupling into the projection optics following in the beam path. It should be mentioned at this point that such an optic would be suitable for the concepts presented here, which provide partly redundant subpixel elements.

It is advisable to adapt the collimation optics in such a way that the degree of overlap of the intermediate images of the μ-LEDs belonging to the same pixel is as high as possible. An overlapping of the intermediate images of the Hμ-LEDs of a pixel of at least 85% and further of at least 95% of their intermediate image area has proven to be suitable.

Furthermore, an embodiment is preferred for which the intermediate images of the μ-LEDs are virtual intermediate images. In an aspect, the collimation optics generate a virtual image of the subpixels, so that the size of the virtual image of a subpixel corresponds to the size of the pixel. Furthermore, the collimation optics is preferably arranged between the μ-LEDs of a pixel and the projection optics.

The light emitted by μ-LEDs with different colors can occupy areas of the pixel of equal size or the areas occupied by the subpixels are adapted to the light emission and are of different sizes. For an embodiment, it is intended that the subpixel emitting green light occupies the largest surface area of the pixel compared to the other two subpixels or at least that green light is emitted over a larger area. This is due to the fact that the eye is most sensitive to the green color. Furthermore, it is useful if the surface area of an RGB pixel occupied by subpixels for red light is larger than the surface area occupied by subpixels emitting blue light. According to this embodiment, green light is emitted over a larger surface area of the pixel than red light, and red light is emitted over a larger surface area of the pixel than blue light. By means of the proposed collimation optics of the pixel, intermediate images are generated by the differently sized and differently located μ-LEDs of the subpixels in the beam path in front of the projection optics, which have a high degree of overlap.

According to another aspect, small μ-LEDs are used so that there are large surface areas in the individual pixels that do not emit light. Preferably, the semiconductor lighting devices of a pixel occupy no more than 30% and moor preferably no more than 15%, most preferably no more than 10% of the pixel area. This ensures that optical and electrical crosstalk between the individual pixels is prevented. Preferably, the sub-pixels are arranged in such a way that they are not directly on the edge of a pixel and do not adjoin each other. In addition to μ-LEDs, the term μ-LEDs also includes color converted μ-LEDs or VCSELs with such edge length or μ-LEDs illuminated optical fiber end pieces. The slotted antenna structures that would be regarded as such μ-LEDs should also be mentioned at this point.

The collimation optics assigned to each pixel offers the advantage that the light emitted by the subpixels is converted into a pre-collimated beam, which is then available in an advantageous way for the generation of an image by at least one further optical element. By using at least one suitable collimating optical element, pre-collimated light beams can thus be generated, so that in turn optical crosstalk between the individual light beams emitted by the subpixels is prevented or at least reduced.

An aspect provides that the collimation optics comprises at least one holographic optical element (HOE) that compensates for the different positions of the three semiconductor lighting devices on the surface of the pixel. Alternatively or in addition, it is conceivable that this function is achieved by a refractive optical element (ROE), which is a component of the collimation optics. It is also conceivable that a diffractive optical element (DOE) is used as a supplement or alternative to achieve appropriate compensation of the different positions of the semiconductor luminous devices on the illuminated area in the intermediate image of the pixel.

In further aspects, the projection unit will be adapted further. In one design it comprises a projection optic which is arranged downstream of the collimation optic in the beam path. With the help of the projection optics, an image or another intermediate image is generated from the individual intermediate images generated by the collimation optics. This image or intermediate image is used directly or in further processed form to display the desired information to the viewer. For this purpose, the projection optics has suitable optical elements, such as deflection mirrors, beam splitters and/or lenses, which are preferably controlled by a control unit and can be moved in such a way as to effect beam steering and/or beam deformation as required, so that information is presented in an easily understandable and perceptible form on a display, on a matt screen and/or as a virtual image, for example in front of the windscreen of a motor vehicle.

A proposed projection unit, according to at least one of the previously described aspects, can be used to generate an image for an augmented reality application, for a virtual reality application, and/or in a head-up display. In particular, the proposed one can be installed in an augmented reality spectacle and/or in a virtual reality spectacle worn on the head by the viewer.

In addition to directing light to a display and creating a virtual image, there is another way of transmitting information to the user. It is based on the knowledge that the eye does not have a uniform resolution over its range of perception. Rather, the eye has a very high spatial and also color vision in the area of its fovea centralis. However, this decreases at larger angles, so that in the area of peripheral vision, i.e. at approx. 20° to 30°, both spatial resolution and color vision decrease. In conventional displays, this is not taken into account further, i.e. the number and size of the individual pixels is substantially constant over the entire row or all columns.

The fovea centralis, also known as the visual fossa, is a sunken area in the centre of the yellow spot on the retina with a diameter of about 1.5 mm in an adult person. It is characterised by a high surface density of light receptors, which also have a direct neural connection. The fovea centralis has only cones for daylight vision, with predominantly M cones for the green spectrum and L cones for red light.

This application discloses novel concepts with which the different resolution capabilities of the eye is considered. This includes the generation of different resolutions by suitable optics as well as a solution with variable pixel density.

In the following concept, an approach is to be pursued in which a light guiding arrangement is provided that takes into account the resolution capability on the retina of the eye, thus reducing the requirements for a μ-display with respect to pixel density and size.

The proposed light guiding arrangement here comprises at least one optoelectronic imaging device, in particular a μ-display for generating at least a first image and a second image. Furthermore, at least one imaging optic is provided which is configured to project a first image of the first image with a first resolution onto a first region of the retina of an eye of the user and to project a second image of the second image with a second resolution onto another, second region of the retina, the first resolution being different from the second resolution.

The first image and the second image can be a respective image of a sequence or sequence of images. In particular, the images may be at least two successive images of a sequence or succession of images, which are perceived by the user as a scene or frame, the individual images normally being displayed so quickly that the eye does not perceive them as individual images but only as a scene or frame in their entirety. In this case, the first image can have a first partial image with the first resolution and the second image can have a second partial image with the second resolution. Thus, in the eye of the user, the first and the second image each have different resolutions.

With the proposed light guiding arrangement, the first image with the first resolution can be projected onto the first region of the retina and the second image with the second resolution onto the second region of the retina. Different areas of the retina can thus be illuminated with images whose resolutions are adapted to the physiological possibilities of the retina.

For example, an image can be projected onto an outer area of the retina with a relatively low resolution, while another image is projected onto a central area of the retina with a higher resolution.

The proposed light guiding arrangement therefore allows different resolutions of the projected images to be provided for different regions of the retina, so that resolutions can be achieved that lead to pixels that are no longer resolvable for the eye. On the other hand, so-called oversampling can be avoided, since, for example, the resolution at any point of the retina can be adapted to the actual receptor density of the retina. Thus, it is possible to execute an optoelectronic imager more easily, since it does not have to deliver high resolution images everywhere.

In particular, an image of an image cannot be generated with constant resolution over the entire surface of the retina. Rather, it is taken into account that the resolving power of the eye is lower in the peripheral areas of the retina than in the centre. This is particularly advantageous compared to a system that produces an image with constant resolution over the entire surface of the retina. In this case, a constant pixel density is provided, so that either the resolution in the peripheral areas of the field of view is higher than the eye can perceive, or the resolution in the centre of the retina is too low to enable good image perception.

With regard to the regions into which a respective image is projected, in particular for a respective frame, a so-called scanning method can be used, in which, in particular to generate a respective overall image or frame, the entire retina is gradually scanned. The areas, such as in particular the first and second region, are therefore smaller than the total area of the retina.

It may also be intended that at least one image for a frame, especially the first or second image, fills the entire surface of the retina. At least one region, such as the first region or the second region, may therefore correspond to the total area of the retina.

The imaging optics or components thereof and the imaging device may be synchronized in such a way as to produce at least one frame comprising the first and second images, which the eye perceives as a complete image. It is understood that the retina, the eye and the user are not part of the optoelectronic device.

The first and second images generated by the at least one imaging device or μ-display may have a total number of pixels projected onto the first and second areas of the retina where they appear as first and second images, respectively. The resolution of the first and second image is therefore determined by the ratio of the number of pixels and the area of the area into which the respective image is projected on the retina. Each image can be assigned a resolution with which the image is projected onto the respective area of the retina.

The images generated by the at least one imaging device have the same resolution according to the number of pixels of the respective imaging device when leaving the imaging device and only when the image is enlarged or reduced by the imaging optics does the resolution of the respective projected images on the retina differ.

Compared to a conventional projection of an image generated by an imaging device such as DLP or LCD over the entire retina, the light-guiding device based on this concept can enable a frame of several non-resolvable images with different resolutions according to the sensitivity of the eye to be projected onto the retina using a more compact component than an imaging device or with fewer pixels or a smaller imaging device diagonal, without limiting the visual experience.

Such a frame, which is composed of images, can also be called a scene, where the images can be projected onto the retina of the eye simultaneously or sequentially. A scene with sequentially displayed images is usually so fast that the eye perceives them as a single overall image. Typical refresh rates are 60 or 120 Hz and the display duration per image is a fraction of a frame, with 2 to 100 images, preferably 5 to 50 images, being displayed per frame.

The imaging device, for example in the form of a µ-display, can be configured to comprise a pixel size with dimensions in the range of a few µm, in the range of 100 µm×100 µm or less. Such pixel sizes can be realized with displays that include µ-LEDs. Distances between two pixels can be in the range of about 1 µm to 5 µm, the pixel size itself is smaller than 70 µm and can for example be smaller than 20 µm or in the range of 3 µm to 10 µm.

Alternatively, such pixel sizes can be realized with displays based on a monolithic, pixelated array. Therefore, the imaging device can be adapted as a monolithic component, but the individual pixels can be individually controlled. The array can be an RGB array. Separate arrays for each color, especially RGB color, can also be provided. The pixels can, for example, have sizes in the range of a few µm to a maximum of 50 µm and be almost seamlessly adjacent to each other. With such imaging devices, the number of pixels can be in the range 1000 to 50000, whereby the pixels are preferably directly adjacent. The use of monolithic picture generator allows compact components to be realized.

The at least one optoelectronic imager may be formed by an array of µ-LEDs with m×n pixels. m and n may have values between 50 and 5000 inclusive, preferably between 100 and 1000 inclusive. The size of the pixels and the distance between adjacent pixels (pitch) may be constant. Typical values for the pitch can be in the range between 1 µm and 70 µm inclusive, preferably between 2 µm and 30 µm inclusive, and particularly preferably between 2 µm and 10 µm inclusive.

The at least one optoelectronic imager may have subpixels with at least one primary color, but preferably subpixels with the three primary colors red, green and blue (R,G,B). Subpixels of all three primary colors form one pixel. The number or the density per area of the subpixels can be different. For example, several green subpixels may be provided because the eye is sensitive especially in the green area.

The antenna structure proposed in this application is also conceivable. Likewise, µ-rods as disclosed herein or optoelectronic elements with dyes in between would also be possible. With µ-LEDS the distances between pixels could also be greater. For example, arrangements are possible in which the distance between adjacent pixels is between 1 and 5 times the pixel size. Such shapes and designs are disclosed in this application.

With the help of such a display it is possible to project an image with a high resolution onto the entire image area of the retina. However, this places high demands on the production and integration of such displays, especially if resolutions in the HD range (1920×1080 pixels) are to be achieved. The light guiding arrangement according to the invention allows the use of such high-resolution displays as image generators. However, lower resolution image generators can also be used, since—as already explained—a higher resolution can be achieved on the retina.

The first region in which the first, especially higher resolution is achieved may be located in the center or closer to the center of the retina than the second region in which the second, especially lower resolution is achieved. The higher first resolution takes into account the higher receptor density in the center of the retina.

The first and second regions can be arranged on the retina so that the second area concentrically surrounds the first area. Accordingly, the first region in the center of the retina has the shape of a circle, for example. This can be surrounded concentrically by at least one second region, for example in the shape of a ring. The individual images can thus enclose themselves on the retina like concentric circles, whereby a partial overlap is also possible.

The imaging optics may include a beam steering device, which directs light rays of the first image onto the first region of the retina to produce the first image and light rays of the second image onto the second region of the retina to produce the second image. By means of the beam steering device, images produced by an imager can be projected onto the respective intended retinal regions. A control system may be provided which controls the beam steering device in dependence on an image displayed by the imager.

The beam steering device may have at least one movable and/or fixed mirror or other equivalent reflecting element to direct the beam. The movable mirror may, for example, be configured to tilt about one, two, three or more axes, preferably about one or two axes. The control system can control the positioning of the mirror in dependence on an image displayed by the imager.

The beam steering device may have at least one, and preferably at least two, optical fibres for beam steering. The glass fibres may be fixed. Depending on the image, the light beams emitted by an imaging device can be coupled into different glass fibres. Each glass fibre can illuminate a specific, assigned area of the retina. The image of an image therefore appears on the area of the retina that is assigned to the glass fiber into which the light rays are coupled to form the image.

The imaging optics may have at least one beam-shaping device, which focuses the light rays of the first and second images on the respective area of the retina. The light rays of the first image can be focused more strongly than the light rays of the second image. The first image resulting from the first image on the retina thus appears on a smaller area than the less strongly focused second image. The first image therefore has a higher resolution than the second image.

The beam shaping device may have at least one focusing or magnifying optic, at least two different magnifications may be provided, preferably between three and ten different magnifications. The highest and lowest magnifications of the beam shaping device may differ, for example, by a factor between 1.1 and 10, preferably between 1.5 and 5, particularly preferably between 1.8 and 3. The imaging optics may have at least a first beam-shaping element and a second beam-shaping element. The first beam shaping element can focus the light beams of the first image and the second beam shaping element can focus the light beams of the second image.

The at least one first and one second beam-shaping element can be formed, for example, from a lens, in particular a converging lens and/or a diverging lens. It is also possible for the at least one first and second beam-shaping element to be formed from a segmented lens which may have a plurality of smaller converging lenses and/or diverging lenses. In addition to lenses of classical design, other suitable optical elements, for example flat optical elements, can also be used as beam-shaping elements, for example metal lenses.

The at least one first and one second image can be displayed one after the other, especially on the same image generator. A composite overall image resulting therefrom for the eye can be produced on the retina by a scanning process, since different areas of the retina can be illuminated at different times. In doing so, the retina can be at least substantially completely illuminated within a scene comprising at least the first and the second image or image.

The first and the second image can be displayed at least substantially simultaneously, in particular on at least two different imaging devices. Thus, a simultaneous projection of the first image and the second image onto the corresponding areas of the retina can be performed. For this purpose, the first and the second image are generated at least substantially simultaneously on different imaging devices and a projection can be made on the intended retinal areas by means of a respective, assigned beam steering device. The advantage of this is that the beam steering devices can be easily designed, as there are no moving parts, for example. In addition, by mapping the images from several imaging devices onto assigned retinal areas, an adapted resolution can be easily achieved on each area of the retina.

The optoelectronic device may have at least one controller designed to control the imaging optics in dependence on a respective image provided by the imager.

An alternative way of transferring images to or into the eye of a user is achieved by so-called light field displays, also known as virtual retinal displays (VNA). In contrast to normal displays, which create an image on a plane directly in front of the user's eye, light field displays create an image inside the eye by direct retinal projection.

Rather, the concepts presented here propose a light field display comprising an optoelectronic device for generating a raster image and an optics module for direct retinal projection of the raster image into a user's eye. In order to improve the image resolution while maintaining a compact size, the proposed operating method is based on the realization that in addition to a first raster image projected flat onto the retina of a user, a second raster image, which has a higher resolution and a smaller spatial extent than the first raster image, is imaged onto the fovea centralis in the user's eye.

The projection covers at least the fovea centralis and can draw a picture on a further area around the fovea centralis, which is assigned to the parafovea. This ensures that a certain centering error of the second raster image relative to the position of the fovea centralis is not perceived in the user's eye. A maximum diameter of the second partial raster image projected onto the retina of 5 mm, preferably of 4 mm and especially preferably of 3 mm is advisable.

In some aspects of the proposed concept, the light field display comprises a first imaging unit generating a first raster sub-image and a second imaging unit generating a second raster sub-image. The raster image projected onto the retina comprises the first raster sub-image and the second raster sub-image. Thus, there may be additional raster sub-images that are projected onto different areas of the retina with an adapted resolution. It is possible to create configurations for which the retinal projections of the raster images overlap.

For an embodiment, the retina-projected raster image is composed of the first raster sub-image and the second raster sub-image, whereby the first raster sub-image has a dark area in the area of the fovea centralis, into which the second raster sub-image is faded in with higher resolution by an adjustment optic. The adjustment optic is configured in such a way that the relative position of the retinal projection of the second raster subimage can be adjusted in relation to the retinal projection of the first raster sub-image. For this purpose, an advantageous embodiment of the adjustment optics has a switchable Bragg grating. For a further embodiment according to some aspects, the adjustment optic includes an Alvarez lens arrangement, in particular a rotatable version with a Moire lens arrangement. Here, the beam deflection is determined by the first derivative of the respective phase plate relief, which is approximated, for example, by $z=ax2+by2+cx+dy+e$ for the transmission direction z and the transverse directions x and y, and by the offset of the two phase plates arranged in pairs in the transverse directions x and y. For further design alternatives, swivelling prisms or other elements with the same functionality are provided in the adjustment optics.

For a further embodiment, the optical module of the light field display has collimation optics for the first imaging unit and/or the second imaging unit. Preferably, the adjustment optics are at least partially arranged in the collimation optics and especially preferably completely in the collimation optics. In some aspects, an adjustment optics can be at least partially located between the collimation optics and a waveguide. Particularly, flat embodiments use an adjustment optic, which is at least partially arranged, in a waveguide or completely in the waveguide.

For the light field display according to the proposed principle, the first imaging unit and/or the second imaging unit are formed by a light emitting diode microarray. This has the advantage that a space-saving arrangement results, since the µ-LED module and/or a µ-display for the particularly high resolution and its control components can be designed in a small construction due to the limited projection area. For an embodiment, the µ-LED module for the second imaging unit can be simplified in terms of design by the fact that at least the central areas have pixels that generate light only in the green and red spectral range, which can be detected by the cones of the fovea centralis.

For an embodiment, the light field display is assigned in some further aspects to a measuring device for determining the position of the fovea centralis in the user's eye. This may include an IR illumination device for measuring the retina. In particular, a device may be provided which determines the position of the fovea centralis by an imaging procedure. It is also possible to determine the position indirectly by measuring the optical axis of the eye on the basis of the pupil position or by detecting the location of the more visible optic nerve papilla on the retina. From the centre of the optic nerve papilla, the centre of the fovea centralis in the average adult is at a transverse distance of 4.5 mm (15°) laterally (on the temporal side) and a vertical offset of 0.65 mm (2° 10') proximally.

For a further configuration of the light field display, the projection of the first raster sub-image onto the fovea centralis is dynamically tracked and thus follows the direction of the user's gaze. For this purpose, an eye movement detection device and a control device for the adjustment optics are provided. For possible designs, the eye movement detection device has an imaging measuring device for the fovea centralis or another reference point in the eye, such as the pupil axis or the optic nerve papilla. In addition, the control device may also have a prediction device which has a model of the eye movement stored in it and which additionally processes the superimposed image data. In doing so, moving objects in the image to which the user most probably directs the direction of gaze can be detected and this information can be fed into the motion model.

Another concept is based on the fact that the human eye does not see equally well everywhere in its full range of vision, both in terms of color perception and spatial resolution. In particular, eye sensitivity varies across the visual range, so that good spatial resolution and good color resolution are only necessary in the area around the center of a µ-display. Thus, power consumption can be reduced compared to conventional displays or pixel arrays. In addition, a more compact component can be implemented without restricting the visual experience.

Thus, an imaging element only needs to have as good a resolution as is required for the respective areas in the eye.

The application now suggests to create a imaging element with a variable pixel density and to generate the image by scanning with a suitable optical system. For example, the imaging element comprises a linear imaging element with variable pixel density and suitable optics so that the actual image is generated by scanning the polar angle. Optics are used to "rotate" an image strip represented by a line array, resulting in a circular two-dimensional image with a variable pixel resolution for an user. This resolution decreases with increasing distance from the centre according to the sensitivity of the eye. The linear imaging element can be, for example, an array of µ-LEDs or a monolithic pixelated RGB array. The latter is a monolithic component in which individual areas can be individually controlled. The versions of µ-LEDs or modules disclosed in this application are particularly suitable for such an arrangement. The size of the µ-LEDs or pixels should be as small as possible in the centre of the visual range of the eye to achieve high resolution. In the peripheral areas, a much coarser resolution is then sufficient, since the sensitivity of the eye is also lower here. Here, the color reproduction can also be greatly reduced and in extreme cases can be limited to green light only, since the color perception of the eye is also greatly restricted in the peripheral areas.

In some aspects, a pixel array is proposed, especially for a display in polar coordinates. This comprises a plurality of pixel elements arranged in at least one row from a starting point on an axis through the starting point. The plurality of pixel elements each have a height and a width. At least the width of the pixels, defined as the distance between the centers of two adjacent pixels, is variable in such a way that the width of the pixel elements increases along the row from the starting point. In other words, the individual pixel elements become wider the further away they are from the defined starting point. This line, in a configuration also two or more lines on top of each other, can be used to display a display. In this context, the term "pixel" refers to an addressable picture element of a predefined size, which includes at least one light source. The light source can be of the same size as the pixel, but can also be smaller. Thus, the increase in width can be achieved by different active areas of the light source in the pixel or by increasing dilution. In other words, with increasing distance, the predefined size becomes larger while the light area remains the same, or the light-emitting area becomes smaller while the predefined size remains the same.

In one aspect, not only the width but also the height can be variable. For example, the pixels can also have a variable height, which increases with increasing distance from the starting point.

It may be intended to rotate the light coming from the row array (which forms a light strip) so that a light strip rotating around the starting point results. If this rotation is sufficiently fast, the result is a substantially circular display. The focal point of the eye is substantially in the starting point, which is also the point of rotation. In a design, the variable height is chosen so that the position of the pixel elements from one position to the next are adjacent to each other due to the rotation of the light strip.

In an aspect, the starting point forms a central midpoint and the many pixel elements are arranged symmetrically around the midpoint along the axis in one row. This configuration is similar to the design mentioned above. The only difference is that the rotation is no longer 360°, but only 180° to create a complete image. This allows higher frame rates to be achieved at the same rotation frequency. Alternatively, the optical system can be simplified, since it only has to rotate in a reduced angular range.

In another aspect, the array contains pixels of several basic colors, so that a multi-colored display can be realized. This is done either by an alternating arrangement of the colors within the same one row or the array comprises further rows or-and/or below the primary row, which contain pixels of other primary colors. A colored pixel can also be formed by one subpixel, in which case three subpixels of different color are combined to one pixel. This is the conventional approach for µ-displays. In the present case, however, due to the different light generation and guidance concept, for the sake of simplicity, pixels and subpixels are used synonymously.

Another aspect concerns the different color perception of the eye, which changes depending on the position as well as the spatial resolution. In general, this aspect can be realized in different ways. In an embodiment, for example, two adjacent pixels in a row have a different color. Thus, the plurality of pixel elements can include at least three different colors, with the number of pixels (or subpixels) of the respective color being different. For example, these can be the colors green, red, blue, and yellow. To take into account the decreasing color sensitivity of the eye, the number of pixels of different color can also vary with increasing distance. For example, pixels of the color green may occur more frequently with increasing distance from the starting point than corresponding pixels of other colors.

This generally varies the color distribution of the large number of pixels along the axis. For example, the colors in the central area, i.e. near the starting point, are evenly distributed, and further outwards the color to which the eye is still sensitive dominates.

In an alternative configuration, a first number of the plurality of pixel elements is arranged in a first row, a second number of pixel elements is arranged in at least one second row. The pixels in the first row differ in color from pixels in the second row. There may be three or four rows of pixel elements, with the pixels in each row being of a different color.

It may also be provided that each of the at least two rows contains pixel elements of all colors. However, these are arranged differently from row to row, so that the nth pixel of each row differs in color. This can be useful when creating an overall image by rotating the rows.

In an embodiment, the rows are arranged essentially parallel to an axis. In an aspect, a first row of the at least two rows is arranged centrally on the axis, a second row then follows below the centrally arranged row, a further row eventually above. However, it is also possible to place all rows in a common starting point and at a defined angle to each other. In this way, each row is arranged along an axis, but not parallel. For example, three rows can have a common starting point and include an angle of 60°.

Some other aspects concern a distribution of pixels of different colors. The first and at least one second row need not have the same number of pixels. For example, the first number of the plurality of pixel elements in the first row is different from the second number of the plurality of pixel elements in the at least one second row. For example, the active area of the light source may be different in the pixels of the first row and the pixels of the second row. This aspect can be realized mainly in a range of the rows, i.e. from a predefined distance from the starting point depending on the sensitivity of the eye.

In particular, one aspect requires that at least some pixels of the first and second row have the same width and from an n-th pixel of the first row on the width is different from the width of the n-th pixel of the second row. In an embodiment, the one row or the several rows is designed as a pixelated array, in which each pixel of the array can be controlled individually. Such an array can be configured as a monolithic component. Alternatively, the individual pixel elements can be implemented by µ-LED.

Another aspect concerns a pixel matrix. As described above, to form a display and an image, it is sufficient to use a pixel array and to rotate the light strip generated by this array. In aspects, a pixel array with at least two pixel arrays is now also proposed, especially for a display in polar coordinates. The at least two pixel arrays have a common center, i.e. their respective starting point is the same. Furthermore, the two pixel arrays form a defined angle to each other. For example, the angle between the pixel arrays is 90° for two pixel arrays, for three pixel arrays the angle can be 60°.

Another aspect concerns a display arrangement in polar coordinates. Such an arrangement comprises a pixel array or matrix and an optical system for light deflection and rotation of the light strip generated by the pixel array during operation. The optical system comprises a mirror, which is movable about at least two axes, which is arranged in a main radiation direction of the pixel array or the pixel matrix and is adapted to make radiated light from the pixels arranged in row rotate about a point corresponding to the starting point.

Finally, a last aspect concerns a method for operating a pixel array or a pixel matrix. For this purpose, a first light strip with a plurality of pixel elements arranged in a row is generated and this light strip is guided to a target location. Then a second light strip is generated. The second light strip is rotated by a certain angle and a rotation point, whereby the rotation point corresponds to the starting point of the pixel elements arranged in a row. The second light strip thus rotated is then guided to the target location. In an embodiment, the rotation of the light strip takes place via one or more mirrors. The row can be a single or several rows. A monolithically integrated pixelated component can also be used as such a row.

BRIEF DESCRIPTION OF THE DRAWINGS

In the following section, some of the above-mentioned and summarized aspects are explained in more detail using various explanations and examples.

FIGS. 3B-1 and 3B-2 are a table of preferred applications for µ-LED arrays;

FIG. 7 shows an enlarged partial view for the embodiment of the light guide concept with separate µ-LEDs on a non-planar IC substrate;

FIG. 8 represents a third embodiment of a light guide with a monolithic pixelated chip according to further aspects;

DETAILED DESCRIPTION

Figure 1A:
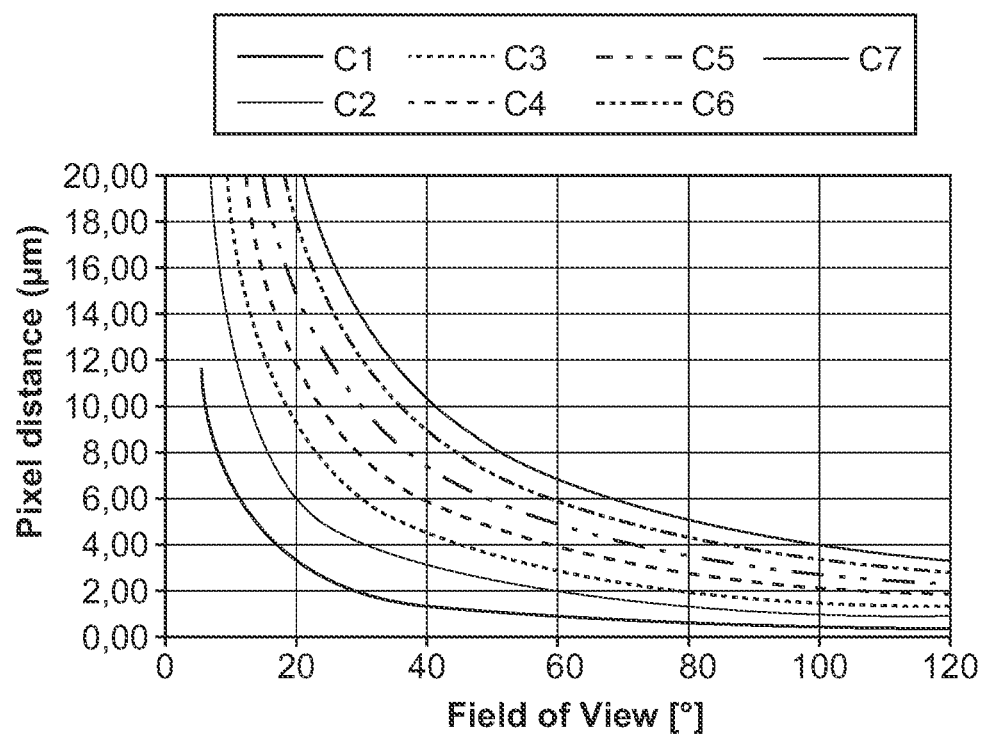
FIG. 1A shows a diagram illustrating some requirements for so-called µ-displays or micro-displays of different sizes with respect to the field of view and pixel pitch of the µ-display.

Augmented reality is usually generated by a dedicated display whose image is superimposed on reality. Such device can be positioned directly in the user's line of sight, i.e. directly in front of it.

Alternatively, optical beam guidance elements can be used to guide the light from a display to the user's eye.

In both cases, the display may be implemented and be part of the glasses or other visually enhancing devices worn by the user. Google's™ Glasses is an example of such a visually augmenting device that allows the user to overlay certain information about real world objects. For the Google™ glasses, the information was displayed on a small screen placed in front of one of the lenses. In this respect, the appearance of such an additional device is a key characteristic of eyeglasses, combining technical functionality with a design aspect when wearing glasses. In the meantime, users require glasses without such bulky or easily damaged devices to provide advanced reality functionality. One idea, therefore, is that the glasses themselves become a display or at least a screen on or into which the information is projected.

In such cases, the field of vision for the user is limited to the dimension of the glasses. Accordingly, the area onto which extended reality functionality can be projected is approximately the size of a pair of spectacles. Here, the same, but also different information can be projected on, into or onto the two lenses of a pair of spectacles.

In addition, the image that the user experiences when wearing glasses with augmented reality functionality should have a resolution that creates a seamless impression to the user, so that the user does not perceive the augmented reality as a pixelated object or as a low-resolution element. Straight bevelled edges, arrows or similar elements show a staircase shape that is disturbing for the user at low resolutions.

In order to achieve the desired impression, two display parameters are considered important, which have an influence on the visual impression for a given or known human sight. One is the pixel size itself, i.e. the geometric shape and dimension of a single pixel or the area of 3 subpixels representing the pixel. The second parameter is the pixel pitch, i.e. the distance between two adjacent pixels or, if necessary, subpixels. Sometimes the pixel pitch is also called pixel gap. A larger pixel pitch can be detected by a user and is perceived as a gap between the pixels and in some cases causes the so-called fly screen effect. The gap should therefore not exceed a certain limit.

The maximum angular resolution of the human eye is typically between 0.02 and 0.03 angular degrees, which roughly corresponds to 1.2 to 1.8 arc minutes per line pair. This results in a pixel gap of 0.6-0.9 arc minutes. Some current mobile phone displays have about 400 pixels/inch, resulting in a viewing angle of approximately 2.9° at a distance of 25 cm from a user's eye or approximately 70 pixels/° viewing angle and cm. The distance between two pixels in such displays is therefore in the range of the maximum angular resolution. Furthermore, the pixel size itself is about 56 µm.

FIG. 1A illustrates the pixel pitch, i.e. the distance between two adjacent pixels as a function of the field of view in angular degrees. In this respect, the field of view is the extension of the observable world seen at a given moment. This is because human vision is defined as the number of degrees of the angle of view during stable fixation of the eye.

In particular, humans have a forward horizontal arc of their field of vision for both eyes of slightly more than 210°, while the vertical arc of their field of vision for humans is around 135°. However, the range of visual abilities is not uniform across the field of vision and can vary from person to person.

The binocular vision of humans covers approximately 114° horizontally (peripheral vision), and about 90° vertically. The remaining degrees on both sides have no binocular area but can be considered part of the field of vision.

Furthermore, color vision and the ability to perceive shapes and movement can further limit the horizontal and vertical field of vision. The rods and cones responsible for color vision are not evenly distributed.

Figure 1B:
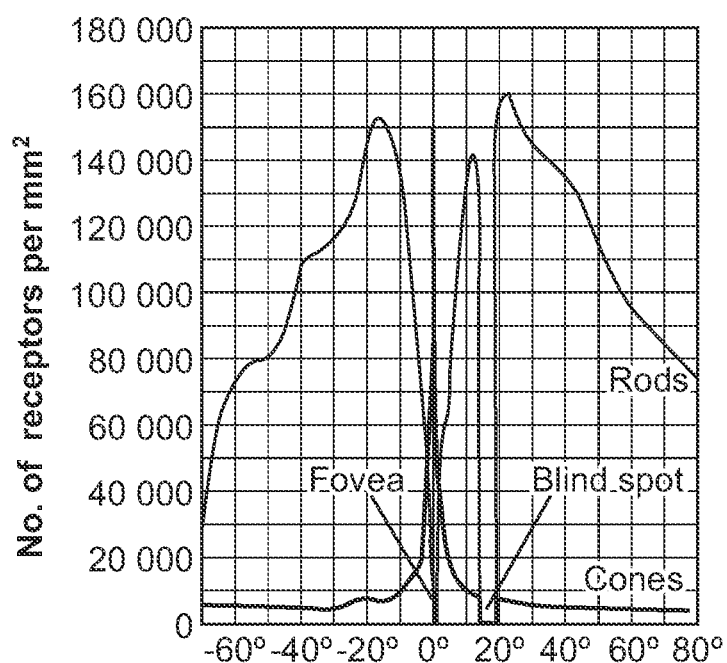
FIG. 1B shows a diagram of the spatial distribution of rods and cones in the human eye.
Figure 1C:
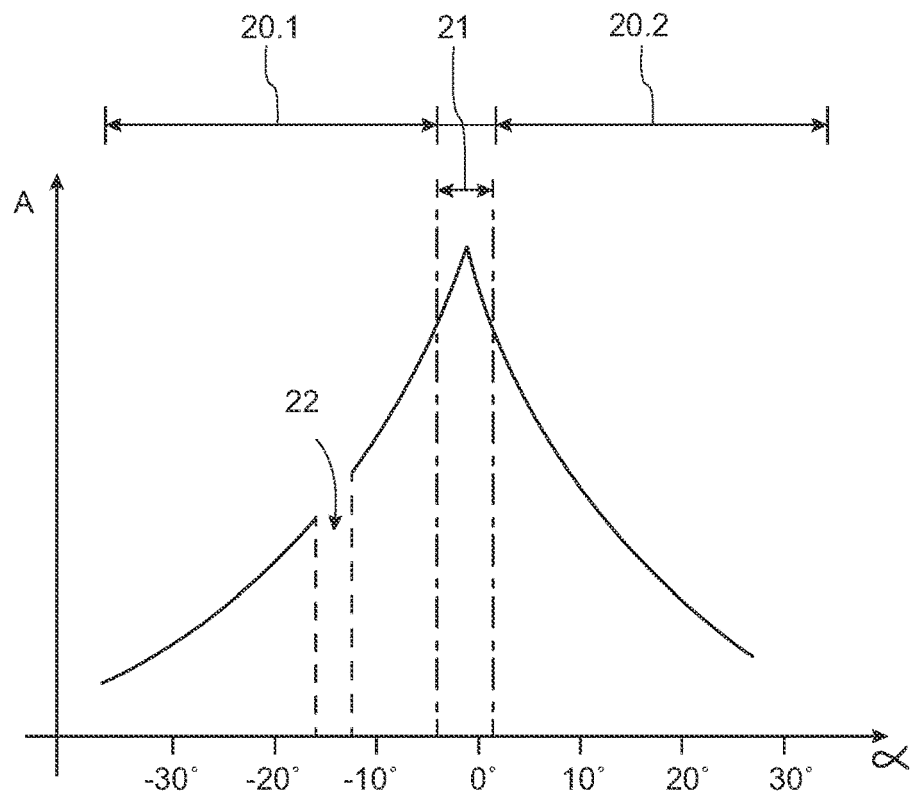
FIG. 1C shows a diagram of the perceptual capacity of the human eye with assigned projection areas.
Figure 1D:
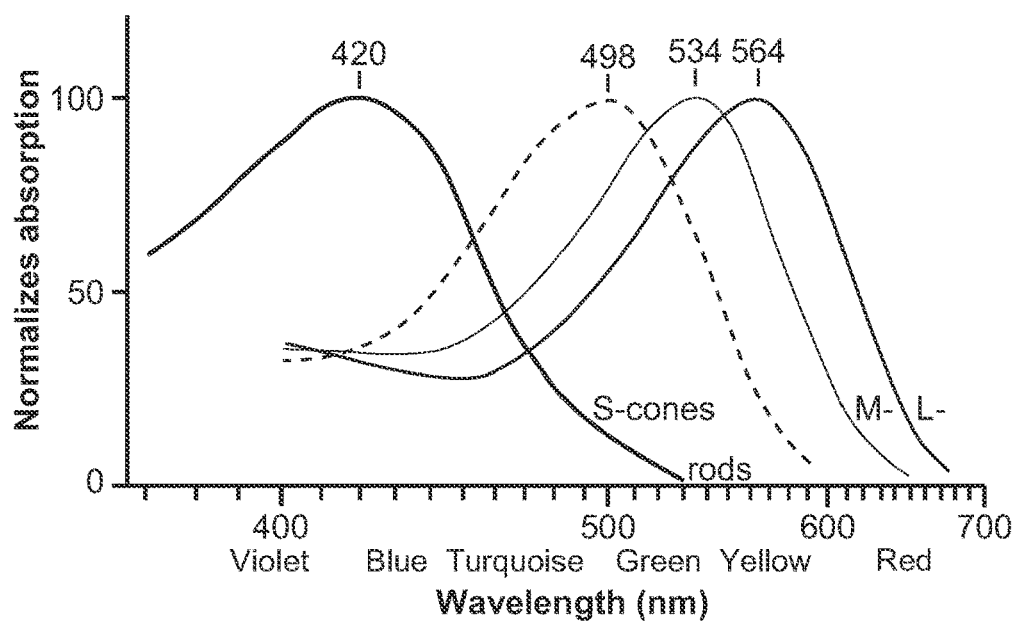
FIG. 1D is a figure showing the sensitivity of the rods and cones over the wavelength.

This point of view is shown in more detail in FIGS. 1B to 1D. In the area of central vision, i.e. directly in front of the eye, as required for Augmented Reality applications and partly also in the automotive sector, the sensitivity of the eye is very high both in terms of spatial resolution and in terms of color perception.

FIG. 1B shows the spatial density of rods and cones per $mm^2$ as a function of the fovea angle. FIG. 1C describes the color sensitivity of cones and rods as a function of wavelength. In the central area of the fovea, the increased density of cones (L, S and M) means that better color vision predominates. At a distance of about 25° around the fovea, the sensitivity begins to decrease and the density of the visual cells decreases. Towards the edge, the sensitivity of color vision decreases, but at the same time contrast vision by means of the rods remains over a larger angular range. Overall, the eye develops a radially symmetrical visual pattern rather than a Cartesian visual pattern. A high resolution for all primary colors is therefore required, especially in the center. At the edge it may be sufficient to work with an emitter adapted to the spectral sensitivity of the rods (max. sensitivity at 498 nm, see FIG. 1D and the sensitivity of the eye).

FIG. 1C shows the different perceptual capacity of the human eye by means of a graph of the angular resolution A relative to the angular deviation α from the optical axis of the eye. It can be seen that the highest angular resolution A is in an interval of the angular deviation a of +/−2.5°, in which the fovea centralis 7 with a diameter of 1.5 mm is located on the retina 19. In addition, the position of the blind spot 22 on the retina 19 is sketched, which is located in the area of the optic nerve papilla 23, which has a position with an angular deviation α of about 15°.

The eye compensates this non-constant density and also the so-called blind spot by small movements of the eye. Such changes in the direction of vision or focus can be counteracted by suitable optics and tracking of the eye.

Furthermore, even with glasses, the field of vision is further restricted and, for example, can be approximately in the range of 80° for each lens.

The pixel pitch in FIG. 1A on the Y-axis is given in µm and defines the distance between two adjacent pixels. The various curves C1 to C7 define the diagonal dimension of a corresponding display from 5 mm to approximately 35 mm. For example, curve C1 corresponds to a display with the diagonal size of 5 mm, i.e. a side length of approximately 2.25 mm. For a field of view of approximately 80°, the pixel pitch of a display with a diagonal size of 5 mm is in the range of 1 µm. For larger displays like curve C7 and 35 mm diagonal size, the same field of view can be implemented with a pixel pitch of approximately 5 µm.

Nevertheless, the curves in FIG. 1A illustrate that for larger fields of view, which are preferred for extended reality applications, very high pixel densities with small pixel pitch are required if the well-known fly screen effect is to be avoided. One can now calculate the size of the pixel for a given number of pixels, a given field of view and a given diagonal size of a µ-display.

Equation 1 shows the relationship between dimension D of a pixel, pixel pitch pp, number N of pixels and the edge length d of the display. The distance r between two adjacent pixels calculated from their respective centers is given by $r = d/2 + pp + d/2.$ $D = d/N - pp$ $N = d/(D + pp)$ (1)

Assuming that the display (e.g. glasses) is at a distance of 2.54 cm (1 inch) from the eye, the distance r between two adjacent pixels for an angular resolution of 1 arcminute as roughly estimated above is given by $r = \tan(1/60°) * 30$ mm $r = 8.7$ µm The size of a pixel is therefore smaller than 10 µm, especially if some space is required between two different pixels. With a distance, r between two pixels and a display with the size of 15 mm×10 mm, 1720×1150 pixels can be arranged on the surface.

Figure 2A:
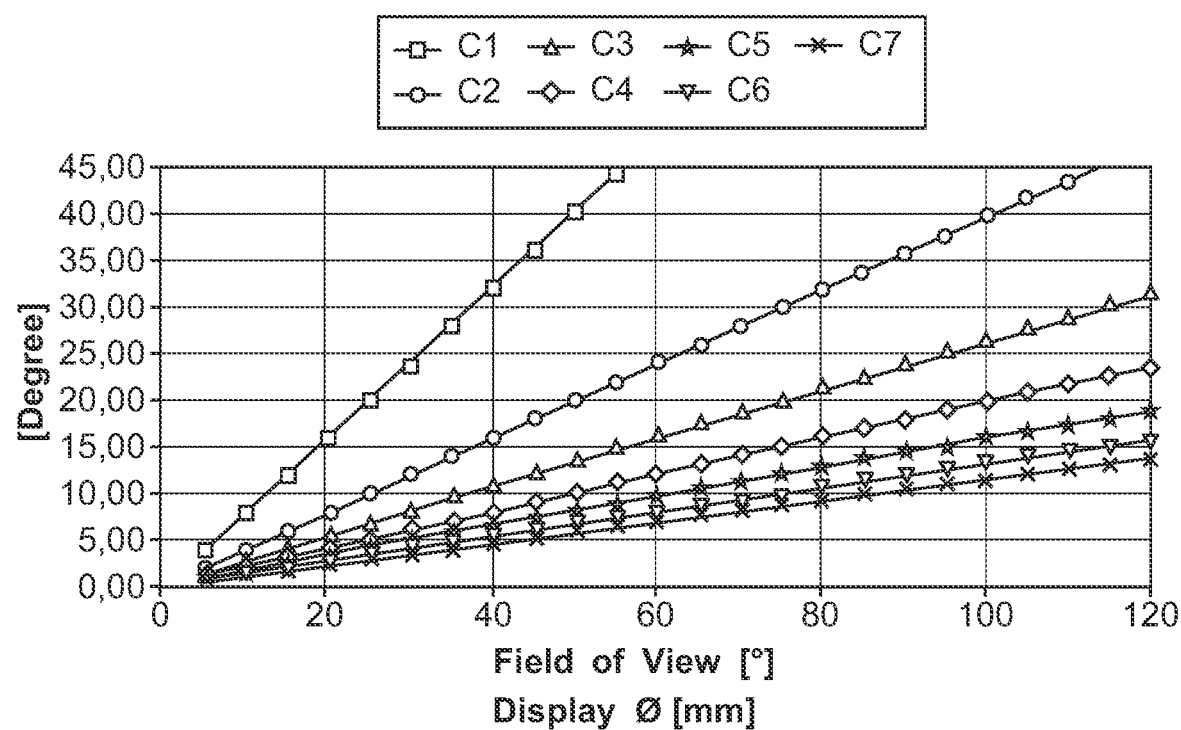
FIG. 2A is a diagram illustrating some requirements for microdisplays of different sizes in terms of the field of view and the angle of collimation of a pixel of the µ-display.
Figure 2B:
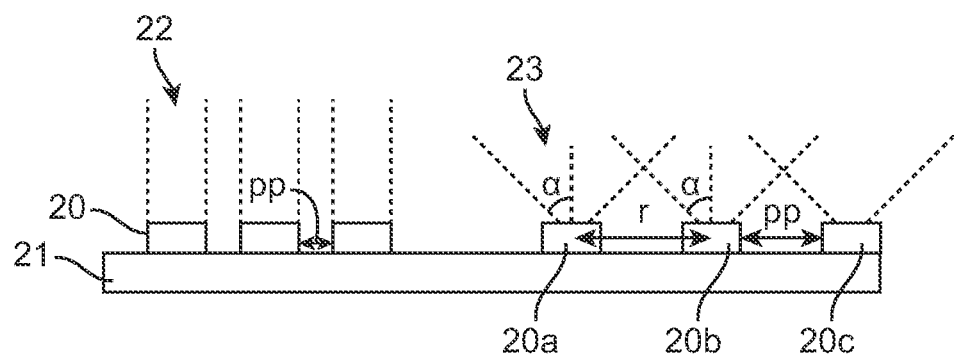
FIG. 2B illustrates an exemplary execution of a pixel arrangement to illustrate the parameters used in FIGS. 1A and 2A.

FIG. 2B shows an arrangement, which has a carrier 21 on which a large number of pixels, 20 and 20a to 20c are arranged. Pixels 20 arranged side by side have the pixel pitch pp, while pixels 20a to 20c are placed on carrier 21 with a larger pixel pitch pp. The distance between two pixels is given by the sum of the pixel pitch and half the size for each adjacent pixel. Each of the pixels 20 is configured so that its illumination characteristic or its emission vector 22 is substantially perpendicular to the emission surface of the corresponding LED.

The angle between the perpendicular axes to the emission surface of the LED and the beam vector is defined as the collimation angle. In the example of emission vector 22, the collimation angle of LEDs 20 is approximately zero. LED 20 emits light that is collinear and does not widen significantly.

In contrast, the collimation angle of the emission vector 23 of the LED pixels 20a to 20c is quite large and in the range of approximately 45°. As a result, part of the light emitted by LED 20a overlaps with the emission of an adjacent LED 20b.

The emission of the LEDs 20a to 20c is partially overlapping, so that its superposition of the corresponding light emission occurs. In case the LEDs emit light of different colors, the result will be a color mixture or a combined color. A similar effect occurs between areas of high contrast, i.e. when LED 20a is dark while LED 20b emits a certain light. Because of the overlap, the contrast is reduced and information about each individual position corresponding to a pixel position is reduced.

In displays where the distance to the user's eye is only small, as in the applications mentioned above, a larger collimation angle is rather annoying due to the effects mentioned above and other disadvantages. A user is able to see a wide collimation angle and may perceive displayed objects in slightly different colors blurred or with reduced contrast.

FIG. 2A illustrates in this respect the requirement for the collimation angle in degrees against the field of view in degrees, independent of specific display sizes. For smaller display sizes such as the one in curve C1 (approx. 5 mm diagonal), the collimation angle increases significantly depending on the field of view.

As the size of the display increases, the collimation angle requirements change drastically, so that even for large display geometries such as those illustrated in curve C7, the collimation angle reaches about 10° for a field of view of 100°. In other words, the collimation angle requirements for larger displays and larger fields of view are increasing. In such displays, light emitted by a pixel must be highly collimated to avoid or reduce the effects mentioned above. Consequently, strong collimation is required when displays with a large field of view are to be made available to a user, even if the display geometry is relatively large.

As a result of the above diagrams and equations, one can deduce that the requirements regarding pixel pitch and collimation angle become increasingly challenging as the display geometry and field of view grow. As already indicated by equation 1, the dimension of the display increases strongly with a larger number of pixels. Conversely, a large number of pixels is required for large fields of view if sufficient resolution is to be achieved and fly screens or other disturbing effects are to be avoided.

Figure 3A:
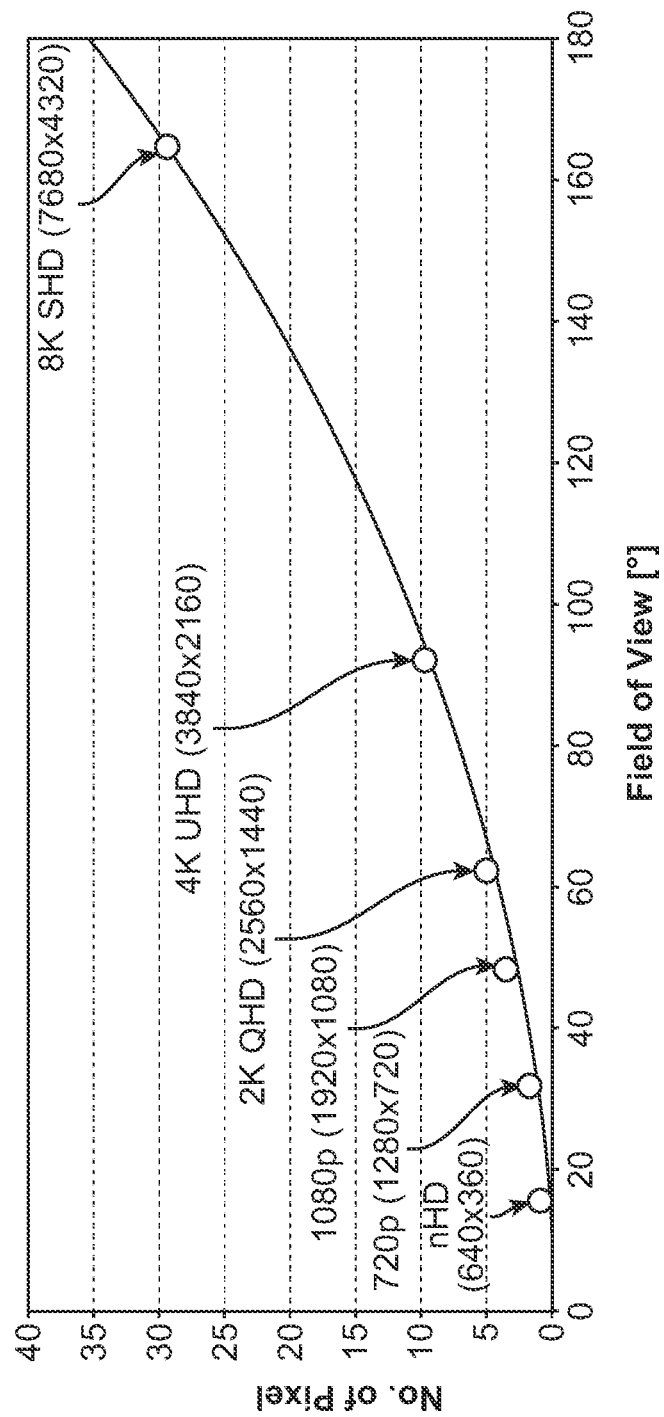
FIG. 3A shows a diagram illustrating the number of pixels required depending on the field of view for a specific resolution.

FIG. 3A shows a diagram of the number of pixels required to achieve an angular resolution of 1.3 arc minutes. For a field of view of approximately 80°, the number of pixels exceeds 5 million. It is easy to estimate that the size of the pixels for a QHD resolution is well below 10 μm, even if the display is 15 mm×10 mm. In summary, advanced reality displays with resolutions in the HD range, i.e. 1080p, require a total of 2.0736 million pixels. This allows a field of view of approximately 50° to be covered. Such a quantity of pixels arranged on a display size of 10×10 mm with a distance between the pixels of 1 μm results in a pixel size of about 4 μm.

Figures 2, 3B:

In contrast, the table in FIGS. 3B-1 and 3B-2 shows several application areas in which μ-LED arrays can be used. The table shows applications (use case) of μ-LED arrays in vehicles (Auto) or for multimedia (MM), such as automotive displays and exemplary values regarding the minimum and maximum display size (min. and max. size X Y [cm]), the pixel density (PPI) and the pixel pitch (PP [μm]) as well as the resolution (Res.-Type) and the distance of the viewer (Viewing Distance [cm]) to the lighting device or display. In this context, the abbreviations "very low res", "low res", "mid res" and "high res" have the following meaning:

very low res pixel pitch approx. 0.8-3 mm
low res Pixel pitch approx. 0.5-0.8 mm
mid res Pixel pitch approx. 0.1-0.5 mm
high res Pixel pitch less than 0.1 mm The upper part of the table, entitled "Direct Emitter Displays", shows inventive applications of μ-LED arrays in displays and lighting devices in vehicles and for the multimedia sector. The lower part of the table, titled "Transparent Direct Emitter Displays", names various applications of μ-LED arrays in transparent displays and transparent lighting devices. Some of the applications of μ-displays listed in the table are explained in more detail below in the form of embodiments.

The above considerations make it clear that challenges are considerable in terms of resolution, collimation and field of view suitable for extended reality applications. Accordingly, very high demands are placed on the technical implementation of such displays.

Conventional techniques are configured for the production of displays that have LEDs with edge lengths in the range of 100 μm or even more. However, they cannot be automatically scaled to the sizes of 70 μm and below required here. Pixel sizes of a few μm as well as distances of a few μm or even less come closer to the order of magnitude of the wavelength of the generated light and make novel technologies in processing necessary.

In addition, new challenges in light collimation and light direction are emerging. Optical lenses, for example, which can be easily structured for larger LEDs and can also be calculated using classical optics, cannot be reduced to such a small size without the Maxwell equations. Apart from this, the production of such small lenses is hardly possible without large errors or deviations. In some variants, quantum effects can influence the behaviour of pixels of the above-mentioned size and have to be considered. Tolerances in manufacturing or transfer techniques from pixels to sub mounts or matrix structures are becoming increasingly demanding. Likewise, the pixels must be contacted and individually controllable. Conventional circuits have a space requirement, which in some cases exceeds the pixel area, resulting in an arrangement and space problem.

Accordingly, new concepts for the control and accessibility of pixels of this size can be quite different from conventional technologies. Finally, a focus is on the power consumption of such displays and controllers. Especially for mobile applications, a low power consumption is desirable.

In summary, for many concepts that work for larger pixel sizes, extensive changes must be made before a reduction can be successful. While concepts that can be easily up scaled to LEDs at 2000 µm for the production of LEDs in the 200 µm range, downscaling to 20 µm is much more difficult. Many documents and literature that disclose such concepts have not taken into account the various effects and increased demands on the very small dimensions and are therefore not directly suitable or limited to pixel sizes well above 70 µm.

In the following, various aspects of the structure and design of µ-LED semiconductors, aspects of processing, light extraction and light guidance, display and control are presented. These are suitable and designed to realize displays with pixel sizes in the range of 70 µm and below. Some concepts are specifically designed for the production, light extraction and control of µ-LEDs with an edge length of less than 20 µm and especially less than 10 µm. It goes without saying, and is even desired, that the concepts presented here can and should be combined with each other for the different aspects. This concerns for example a concept for the production of a µ-LED with a concept for light extraction. In concrete terms, a µ-LED implemented by means of methods to avoid defects at edges or methods for current conduction or current constriction can be provided with light extraction structures based on photonic crystal structures. Likewise, a special drive can also be realized for displays whose pixel size is variable. Light guidance with piezoelectric mirrors can be realized for µ-LEDs displays based on the slot antenna aspect or on conventional monolithic pixel matrices.

In some of the following embodiments and described aspects, additional examples of a combination of the different embodiments or individual aspects thereof are suggested. These are intended to illustrate that the various aspects, embodiments or parts thereof can be combined with each other by the skilled person. Some applications require specially adapted concepts; in other applications, the requirements for the technology are somewhat lower. Automotive applications and displays, for example, may have a longer pixel edge length due to the generally somewhat greater distance to a user. Especially there, besides applications of extended reality, classical pixel applications or virtual reality applications exist. This is in the context of this disclosure for the realization of µ-LED displays, whose pixel edge length is in the range of 70 µm and below, also explicitly desired.

Figure 4A:
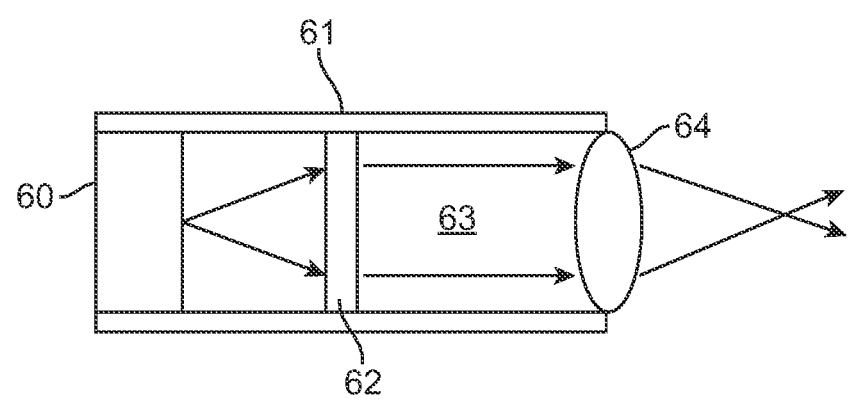
FIG. 4A shows a principle representation of a µ-LED display with essential elements for light generation and light guidance.
Figure 4B:
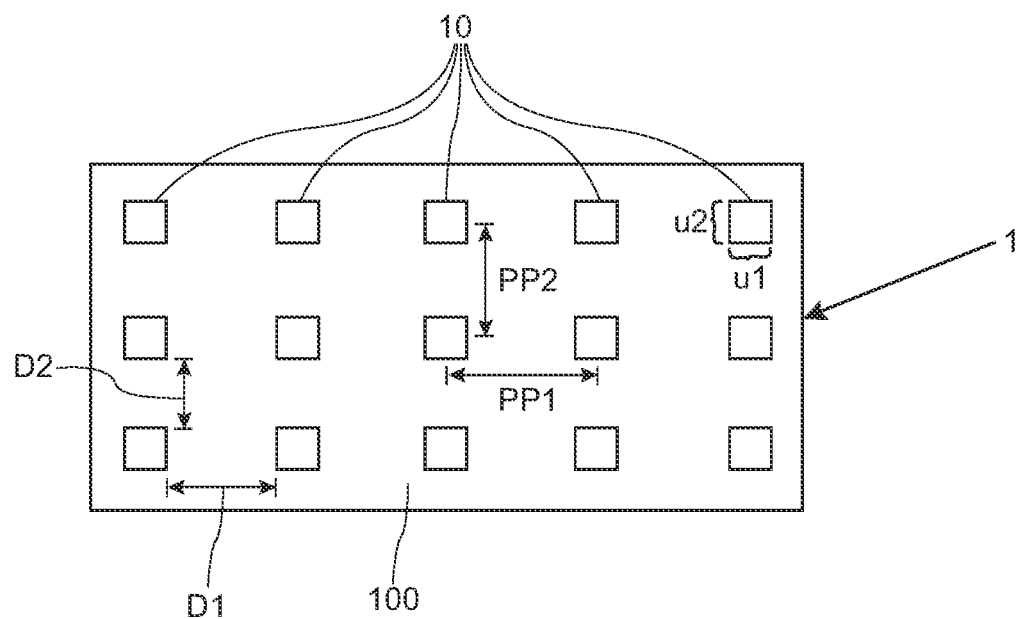
FIG. 4B shows a schematic representation of a µ-LED array with similar µ-LEDs.
Figure 4C:
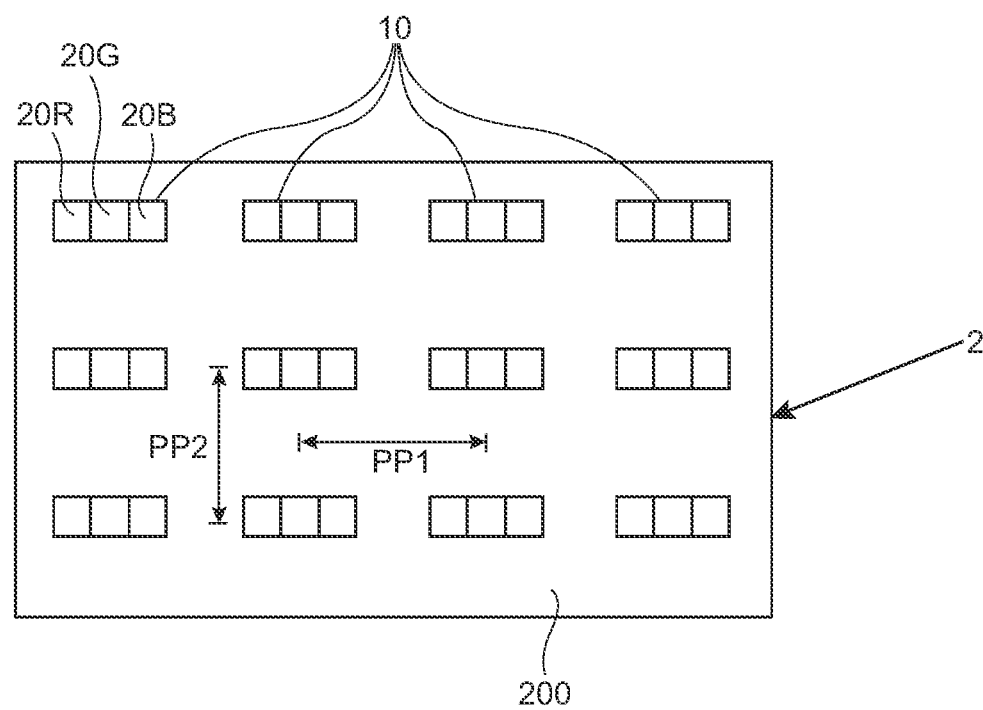
FIG. 4C is a schematic representation of a µ-LED array with µ-LEDs of different light colors.

A general illustration of the main components of a pixel in a µ-display is shown schematically in FIG. 4A. It shows an element 60 as a light generating and light emitting device. Various aspects of this are described in more detail below in the section on light generation and processing. Element 60 also includes basic circuits, interconnects, and such to control the illumination, intensity, and, when applicable, color of the pixel. Aspects of this are described in more detail in the section on light control. Apart from light generation, the emitted light must be collimated. For this purpose, many pixels in microdisplays have such collimation functionality in element 60. The parallel light in element 63 is then fed for light guidance into some optics 64, for further shaping and the like. Light collimation and optics suitable for implementing pixels for microdisplays are described in the section on light extraction and light guidance.

The pixel device of FIG. 4A illustrates the different components and aspects as separate elements. An expert will recognize that many components can be integrated into a single device. In practice, the height of a µ-display is also limited, resulting in a desired flat arrangement.

For light extraction and light guiding there are basically two possibilities. In the first case, the eye of a user is directly in line with the direction of radiation of a display. In such a case, the light generated by the display can be radiated directly, collimated, enlarged or reduced. However, no more complex light guidance is necessary. This type of generation and guidance is often found in display applications, including the automotive sector. Also in applications to augmented reality, using glasses can make use of this principle. The display is implemented directly into the glasses and thus the glasses themselves are used as a semi-transparent screen. Of course, this also requires the implementation of control circuits and connection possibilities with transparent material.

However, in some applications a light guide arrangement necessary for light guidance, since the light-generating display is located outside a user's field of vision or at least not directly in front of it. Google's Glass™ is an example of such an application.

Figure 5:
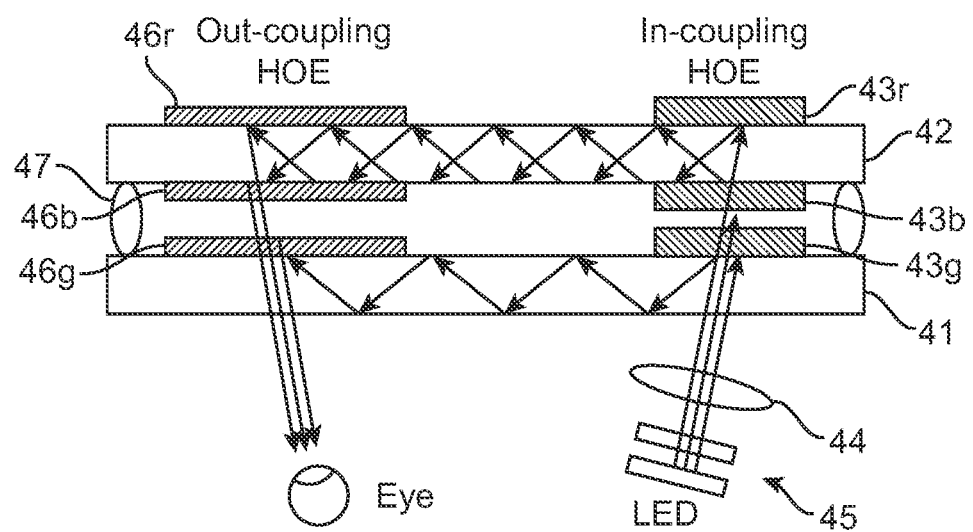
FIG. 5 is an example of a pair of glasses for advanced reality functionality that uses a µ-display to illustrate various aspects and basic principles.

FIG. 5 illustrates an example where the display is not within the line of sight of the eye; that is, the light generated by the display must be directed through the glasses to the eye. In FIG. 5, a µ-display 45, which has a light-generating element LED and an optical system 44 placed in front of the light path, is placed in a position outside the field of vision of the eye. The light-generating element LED is one of the structures presented above. It is substantially one or more small displays with µ-LED pixels or subpixels thereof. A control is done by the concepts also presented here. In case of a monolithic display, the control can be implemented directly in the carrier. The µ-LED display is placed on the carrier and electrically connected to it.

In the case of spectacles, the µ-display is located on the temples close to the hinge. The µ-display in this example emits light of the primary colors red, blue and green parallel to a feed element, which is built as a sandwich structure using elements 41, 43g, 43b, 42, 43r and 43b. The feed element has a first light guide 41 made of a transparent material. A reflective input element 43g is mounted on the sidewall of the light guide and opposite incident light to reflect the green portion of the light of the µ-display and guide it through the light guide 42. In some variants, the incident light has an angle of 0° to 45° with respect to the surface of the corresponding light guide. In the illustrated example, the angle of light incidence is approximately 70° in relation to the surface of the light guide.

Another reflective coupler 43b is either on or on element 43g to couple the blue component into the second light guide 42. Finally, the last reflective element 43r is positioned on the second light guide 42 to reflect the red portion of the µ-display into the second light guide. To this extent, the reflective elements 43 are adapted to couple the corresponding light portion into the light guides 41 and 42. Reflective coupling elements allow light to be coupled into light guides even if incident light hits the light guide at a large angle, e.g. approximately 70° to 90° as in FIG. 5. The first and second light guides are spaced apart using spacers 47 at both ends of the light guides.

The light guides 41 and 42 are both elongated and arranged parallel to each other. They can be part of the glasses, for example. Total reflection in both light guides prevents the light (the green part and the red or blue part) from being coupled out of the light guide. The light is guided to an area in the light guide that is covered by the reflective out-coupling elements 46r, 46b and 46g. All these areas are arranged on the same side as the areas of the corresponding reflective elements 43g, 43b and 43r. Coupling element 46r is arranged on the second light guide 42 and is configured to couple out the red portion of the light from the second light guide and direct the portion to the eye. Elements 46*b* and 46*g* comprise the same functionality for the blue and green portions so that all three light portions are substantially parallel and directed to the eye.

The couplers 43 are implemented using, for example, mirrors and the like, which are reflective for a certain portion of the light but otherwise transparent. For the purpose of reflection, the couplers can change the refractive index so that light is reflected. In a similar way, the change of refractive index between air and the light guide leads for example to the light inside the guide. The light is coupled out in a similar way. If the light of different colors is essentially parallel and overlapping, the corresponding coupling element(s) should be stacked on top of each other. However, the stacking should occur in such a way that the coupling element absorbs or reflects undesired portions of the light. In some variants, MEMS mirrors can be used to direct the light coming from the display to the user's eye. In this example, the output coupler 46 is mounted directly on the light guide.

Figure 6:
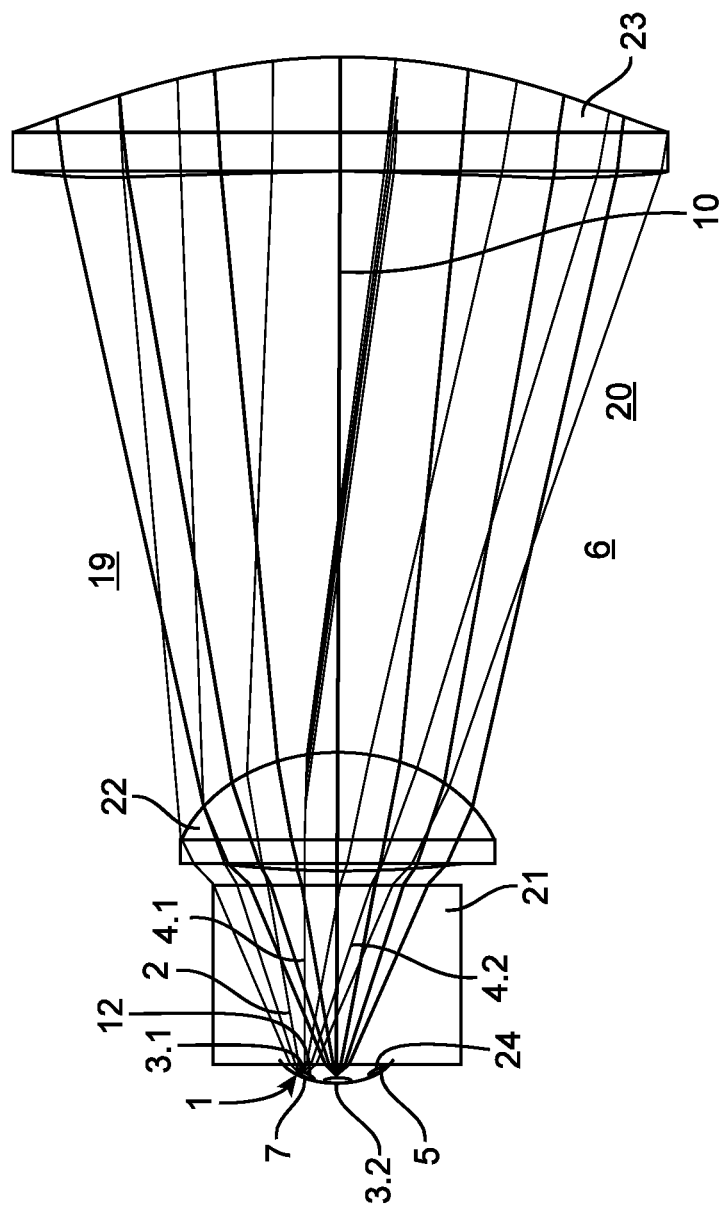
FIG. 6 shows a first embodiment of a light guiding concept of a curved light surface according to some aspects of the proposed concept.

FIG. 6 shows an example of a light guide, in which a suitable beam guidance is achieved using a foveated display. FIG. 6 proposes an illumination arrangement of, for example, a μ-display, comprising a light-emitting optoelectronic element 1 and an optical device 6 for beam conversion or beam-shaping of the electromagnetic radiation generated by the light-emitting optoelectronic element 1. In this context, a light-emitting optoelectronic element 1 comprises a plurality of μ-LEDs, which emit light of one color in operation. The light-emitting optoelectronic element is designed so that the μ-LEDs emit different colors. As subpixels, three μ-LEDs form part of an entire pixel. The light-emitting optoelectronic element thus contains a large number of such pixels.

The optical device 6 represents a system optic 19 in the form of an imaging projection optic 20 and comprises in the beam path successively a plane-parallel lens 21 and a first aspherical lens 22 and a second aspherical lens 23, which realize an image of the light-emitting optoelectronic element 1.

Furthermore, FIG. 6 shows that the light-emitting optoelectronic element 1 comprises several emission regions 3.1, 3.2 arranged in matrix form. These each comprise one or more μ-LEDs (for different colors). Optionally, the μ-LEDs can already include primary optics 12. These primary optics can contain converter elements, decoupling structures or photonic crystals to achieve a certain beam-shaping already at light emission. Each of the emission areas 3.1, 3.2 is assigned a main beam direction 4.1 and 4.2. For at least partial compensation of the field curvature arising in the optical device, the centers 7 of the emission areas 3.1, 3.2 are arranged on a curved surface 5, which, for the present embodiment, forms a spherical segment 24 with an associated spherical center 30 on the optical axis 10 of the optical device 6.

For a possible dimensioning, a radius R of 10 mm is selected for a light-emitting optoelectronic element 1 with a diameter D of 3.7 mm for the curved surface 5 for the arrangement of the emission zones 3.1, 3.2 and a material with a refractive index of at least 1.6 and a thickness in the direction of the optical axis 10 of at least twice the diameter D is required for the plane-parallel lens 21 of the optical device 1 following in the beam path.

FIG. 7 shows an enlarged partial view of an example of an illumination arrangement with a light-emitting optoelectronic element 1 comprising several emission regions 3.1-3.5 formed by apertures of the primary optics of separate optochips 17.1-17.5 in the form of μ-LEDs. An arrangement of the separate optochips 17.1-17.5 on a non-planar IC substrate 16 is shown so that the centers 7 of the emission regions 3.1-3.5 are located on a concave curved surface 5. Each of the emission regions 3.1-3.5 forms a Lambert radiator 11 to which a main beam direction 4.1-4.5 is assigned, whereby due to the nonplanar IC substrate in the form of a spherical segment 24 facing the optical device 6, the main beam directions 4.1-4.5 comprise a common point of intersection on the optical axis 10 of the optical device 6. By means of primary optical elements 12 (cf. FIG. 6) the Lambertian emission of the emission regions 3.1-3.5 can be transformed into a non-Lambertian emission, in particular into an emission with a narrower aperture angle.

FIG. 8 shows an enlarged partial view of a design alternative with an optical device 6, which is only shown in a sectional view, and a flat IC substrate 28 with a schematically simplified control device 25, which typically includes driver components and interface and memory elements. A monolithically pixelated optochip 14 is arranged on the flat IC substrate 28, which comprises a light-emitting optoelectronic element 1 manufactured in a common process and having several emission regions 3.1-3-5 lying on a concavely curved surface 5 of a region 15 of the chip 14, which are each formed by a converter element 13. Corresponding to the previous embodiment, the main radiation directions 4.1-4.5 of the emission regions 3.1-3.5 are at an angle to each other and intersect on the optical axis 10 of the optical device 6.

Figure 9:
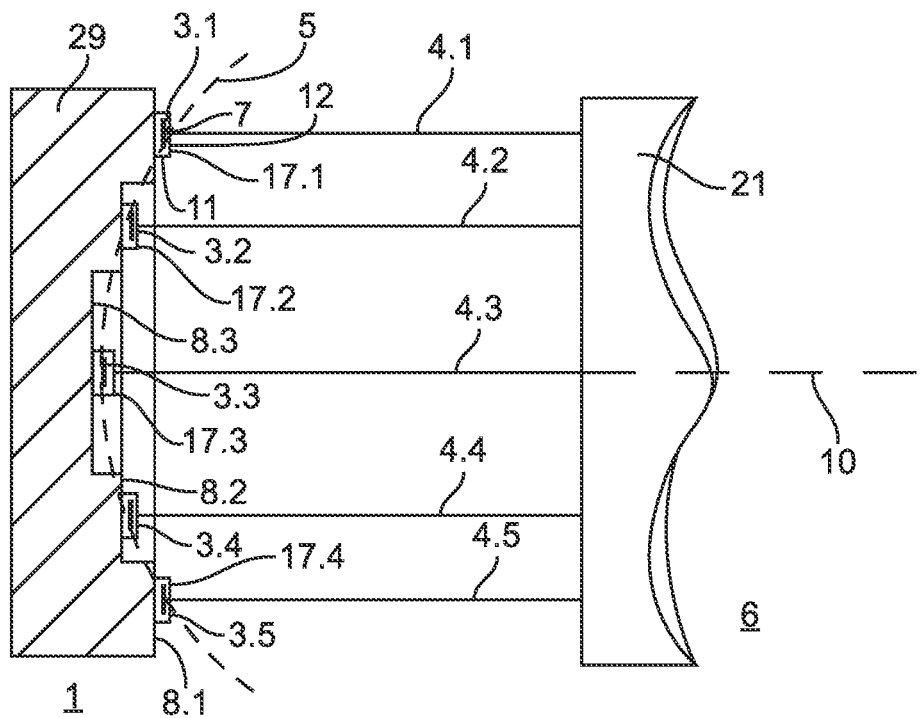
FIG. 9 shows a fourth embodiment of a lighting system with some aspects.

FIG. 9 shows a fourth embodiment of an illumination device with a light-emitting optical element 1, comprising a stepped IC substrate 29, separate optochips 17.1-17 being mounted on concentrically arranged ring surfaces 8.1, 8.2, 8.3 of the stepped IC substrate 29.5 formed by μ-LEDs 11 are arranged in such a way that the centers 7 of the emission regions 3.1-3.5 formed by primary optical elements 12 of the respective μ-LEDs 11 lie on a concavely curved surface 5, while the main beam directions 4.1-4.5 the emission regions 3.1-3.5 comprise a coincident orientation. Consequently, the distances of the separate optochips 17.1-17.5 to the plane-parallel lens 21 of the optical device 6 and thus the beam cross-section in the widening beam path in front of the optical device 6 differ if they are arranged on different ring planes 8.1-8.3.

Figure 10:
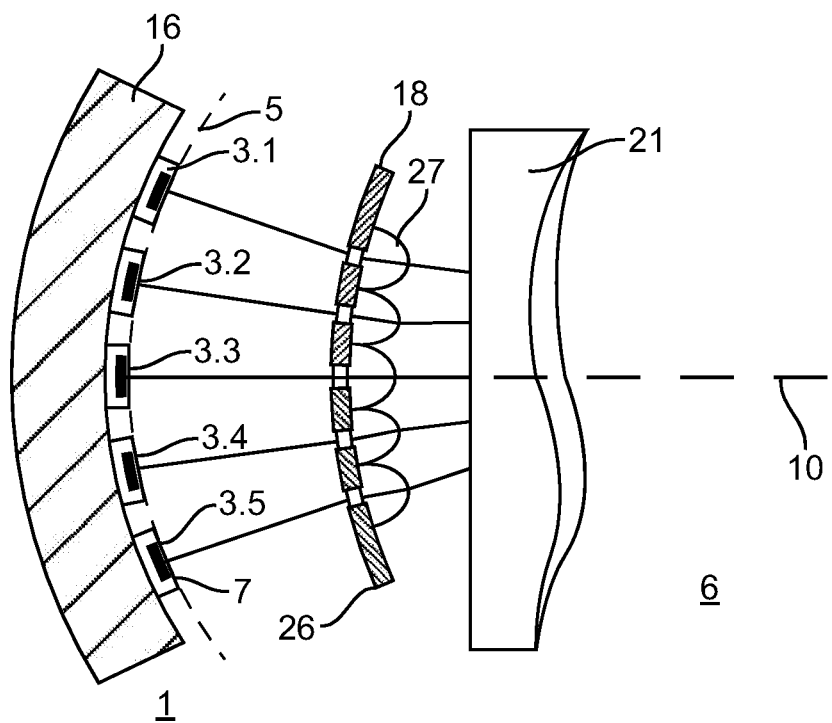
FIG. 10 is a further development of one of the above embodiment according to some aspects of the concept presented.

FIG. 10 shows a further development of the invention based on the variant shown in FIG. 9, whereby a likewise concavely curved collimating optical element 18 is additionally arranged between the centers 7 of the emission zones 3.1-3.5 arranged on a concavely curved surface 5 and the plane-parallel lens 21 of the optical device 6. For the version shown, the collimating optical element 18 comprises a curved pinhole 26 and a curved microlens arrangement 27, which form a radiation angle filter. The functional components of the collimating optical element 18 can be assigned to one or more emission ranges 3.1-3.5. For a version not shown in detail, each functional component of the collimating optical element 18 serves to pre-collimate several emission ranges 3.1-3.5 belonging to one pixel and radiating with different colors.

Figure 11:
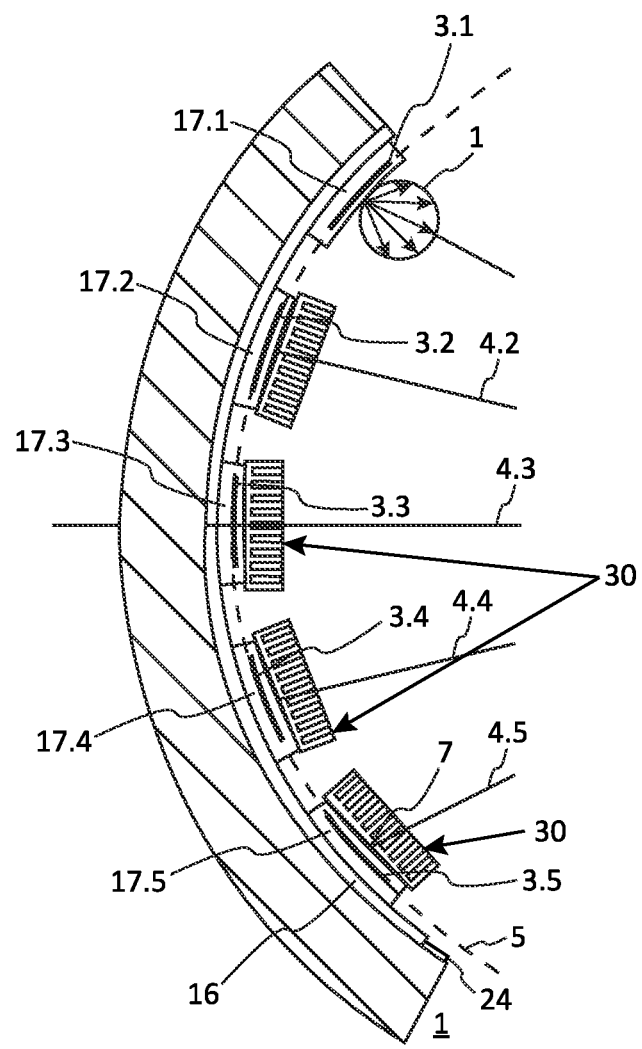
FIG. 11 is another embodiment of the example of FIG. 7, with additional light-shaping structures.

FIG. 11 shows an addition wherein the optochips 17.1 to 17.5 are designed as μ-LED arrays with an additional light-shaping structure on the upper side of the emission surface. This improves light guidance and changes the radiation characteristics of the individual optochips. The light-shaping structure, which is for example a photonic crystal in a semiconductor material of the optochip, results in a higher directionality of the emitted light. The light-forming structure can be formed in different ways.

Figure 13:
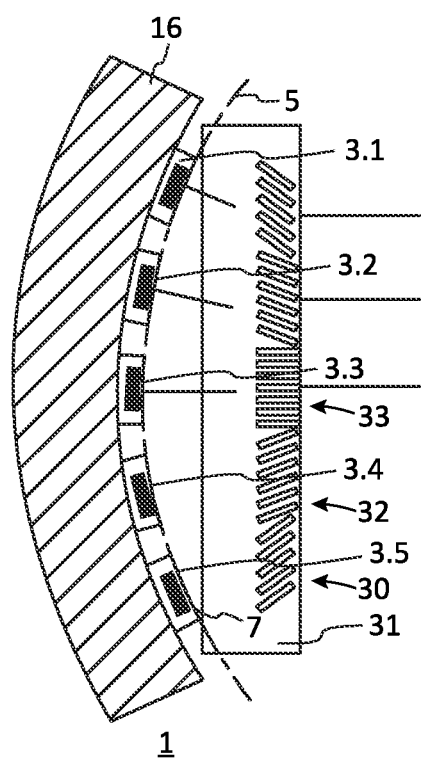
FIG. 13 shows a further embodiment based on the example in FIG. 9.

FIG. 13 shows a further embodiment based on the example in FIG. 10, in which the light-forming structure 31 is arranged in the optical path of the optochips. It has several areas 30, 31 and 32 with a periodic change of the refractive index. In particular, the regions are formed by holes in the material of structure 31, which produces the periodic variation of the refractive index. The holes for areas 30 and 32 are not perpendicular to the surface of the structure, but are etched at an angle to it. This etching thus causes a directional dependence of the holes and thus the variation of the refractive index. Correspondingly, such an arrangement produces a shaping of the light in the area shown in the upper section of FIG. 13. Areas 30 and 32 are configured in such a way that they collimate incident light and emit it again in a directed manner at an angle defined by the direction of the holes. Only in area 33 is light collimated. This special design of the photonic structure results in an essentially parallel beam of light.

Figure 12:
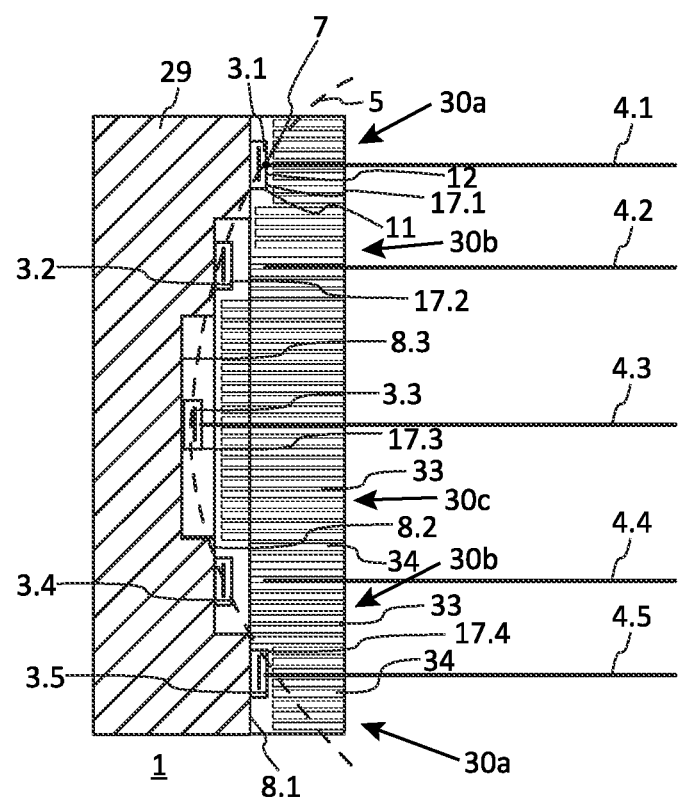
FIG. 12 is a supplement to the embodiment of FIG. 10, where a photonic structure is arranged in the beam path.

The embodiment of FIG. 12 is based on the example of FIG. 9, which also forms a light-shaping structure, but the width varies and follows the shape or surface of body 1.

Figure 14A:
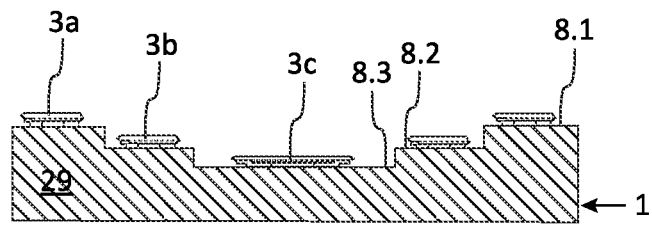
FIG. 14A shows a further embodiment based on the example in FIG. 9.
Figure 14B:
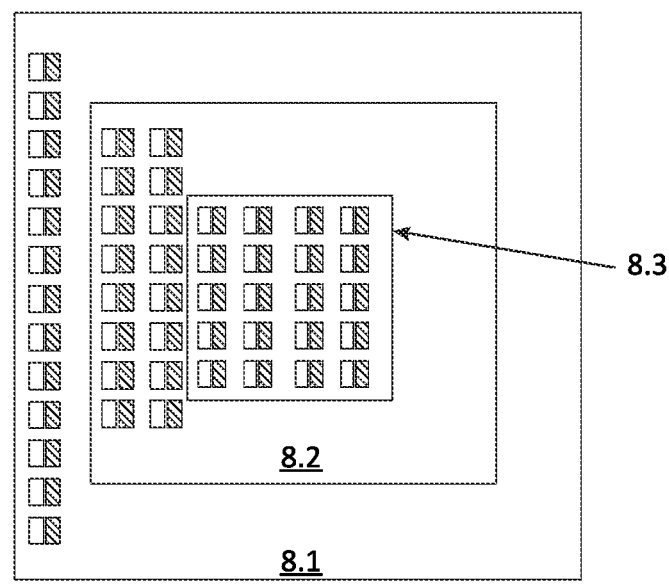
FIG. 14B shows a top view of an embodiment of a step-shaped substrate.

FIGS. 14A and B show another design in cross-sectional view and top view. In this case, μ-LED modules 3a, 3b and 3c are arranged as described above on the concentrically arranged surfaces 8.1, 8.2 and 8.3 of the stepped IC substrate, which are made up of several base modules. In a top view, this is shown in more detail by means of another embodiment, where the stepped substrate comprises rectangular stepped surfaces. In the central i.e. "deepest" area 8.1 a μ-LED module consisting of 4×5 base modules is arranged. In the next area 8.2 some more μ-LED modules are shown. This can be a 2×8 module, but also have a different shape. Finally, the last section is partly already equipped with a 1×13 module.

Figure 15:
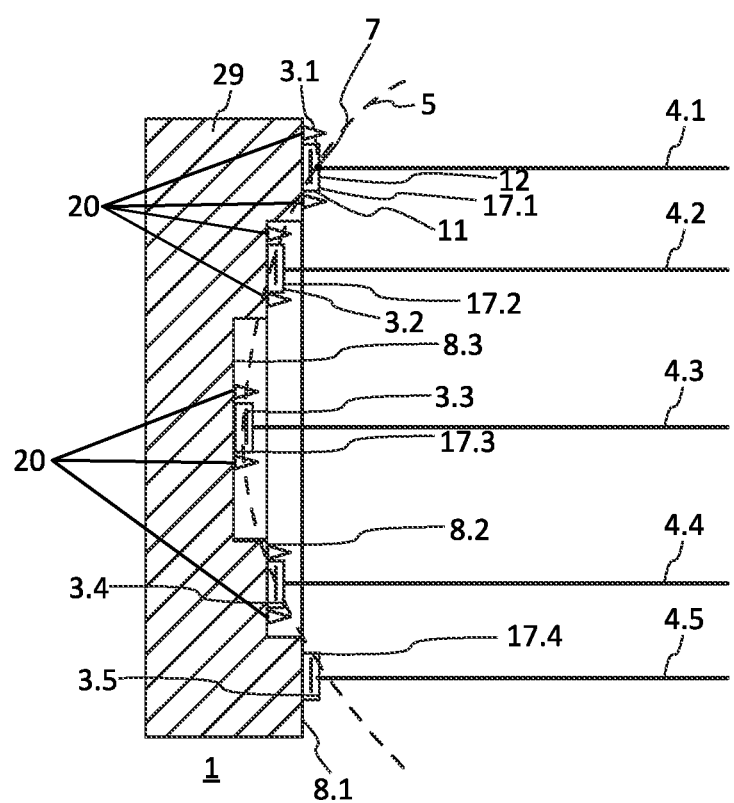
FIG. 15 is an embodiment with a reflective circumferential structure around the optochip.

In addition to photonic structures, other light shaping measures can also be provided directly on the substrate 29. FIG. 15 shows such an example. In this case, a reflective structure 20 is arranged around each emission range 3.1 to 3.5 or around each optochip 17.1 to 17.4. The reflective structure 20 extends over the height of the emission surface so that light emitted at a flat angle is deflected laterally by the reflective structure. The reflective structure is formed with features from this application. For example, the optochips may be arranged in cavities in each annular surface, the reflective structure 20 forming part of the walls of the cavities.

Figure 16:
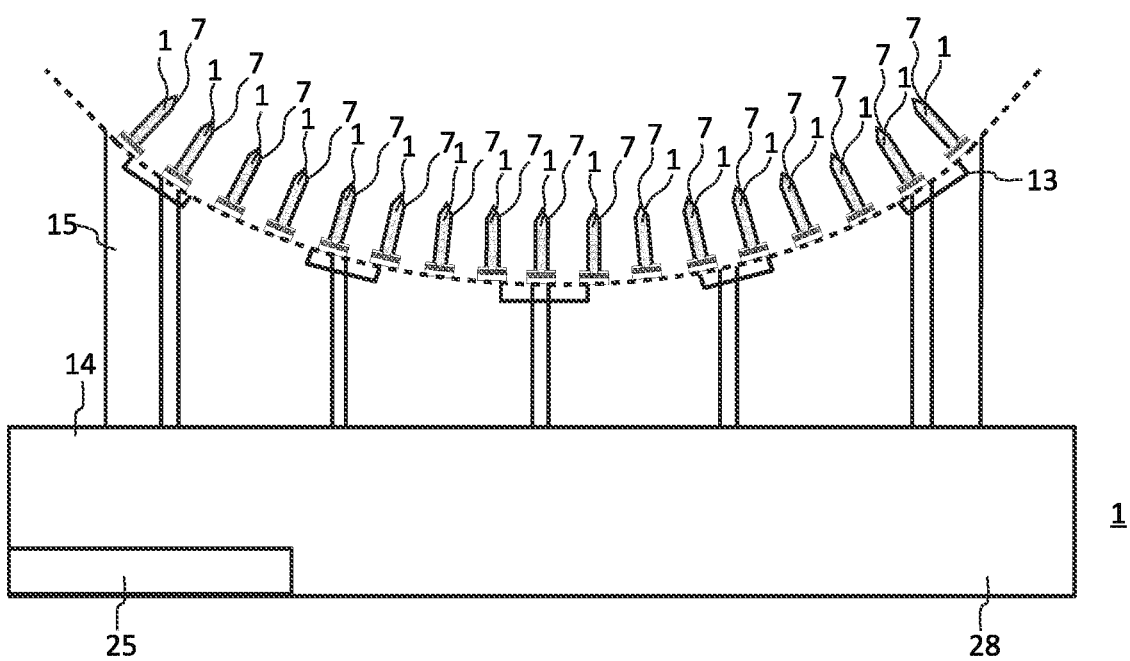
FIG. 16 combines nanorods arranged on its curved surface of a substrate with control.

FIG. 16 shows a combination of the embodiment based on the example in FIG. 8, with a large number of nanorods arranged on the surface, for example those with a structure similar to the examples in FIGS. 26 to 29. These are individually contacted and controlled by the control circuit 28.

A plurality of different projection units are known in the art, with which images can be displayed in specifically defined image planes according to requirements.

Figure 17A:
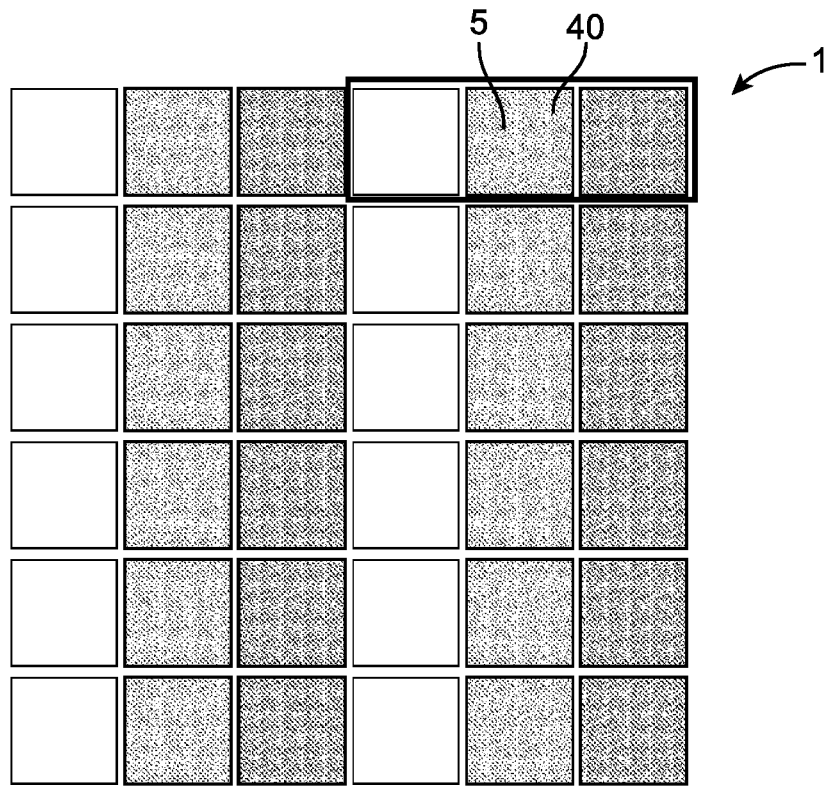
FIG. 17A shows a matrix with RGB pixels, which has a high fill factor.

FIG. 17A shows a top view of a RGB emitter array with an optoelectronic lighting device 1 according to the state of the art, which is designed as a matrix with RGB pixels 40 emitting red, green or blue light. The RGB-Pixel 40 are characterized by a high fill factor. This means that a large part of the area 5 of the individual RGB pixel 40 is used as light-emitting area.

Figure 17B:
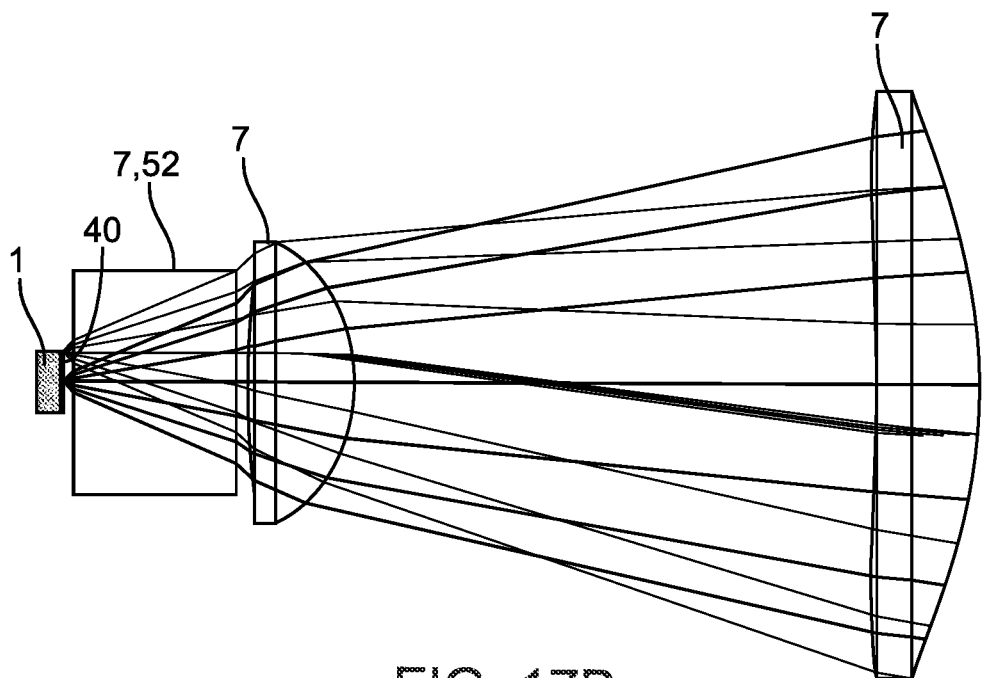
FIG. 17B is a schematic representation of the beam guidance in a conventional projection unit.

FIG. 17B shows a schematic diagram of beam guidance in projection units with projection optics 7. Projection optics 7 comprises all 3 lenses shown in FIG. 17B, including the lens or plate 52. It can be seen that the radiation emitted by the individual RGB pixels 40 is not collimated. As shown in FIG. 17B, only the rays emitted by the RGB pixels 40 with an angle of radiation between +45° and −45° reach the elements of projection optics 7, which are arranged downstream of plate 52. Since the RGB pixels 40 emit light in accordance with Lambert's law of radiation, without collimation of the radiation, therefore, part of the radiation emitted by the RGB pixels 40 cannot be used for image generation, which ultimately means a loss of efficiency.

Figure 18:
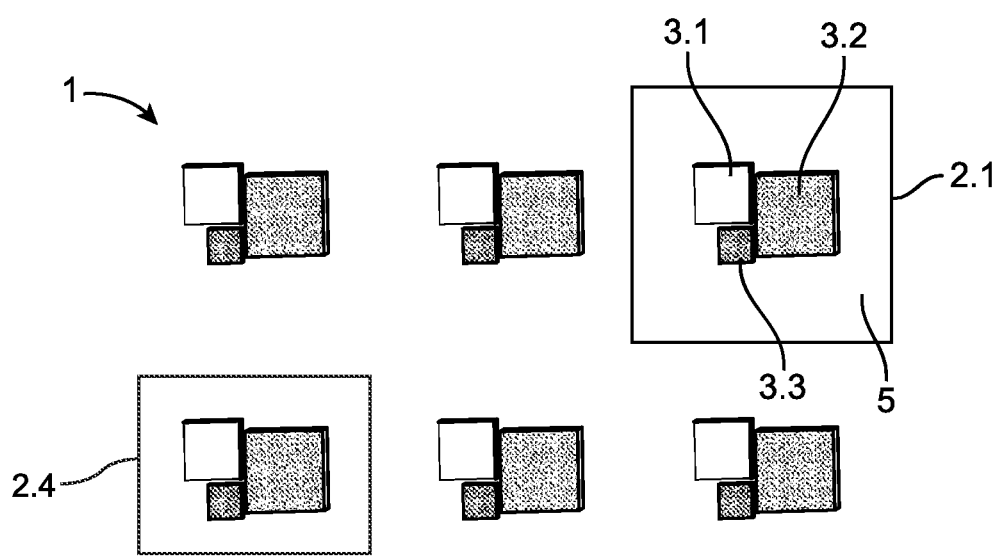
FIG. 18 shows an embodiment of an implemented matrix with RGB pixels, which has a small fill factor according to some aspects of the proposed concept.

FIG. 18 shows a schematically simplified top view of an optoelectronic lighting device 1 with a proposed designed RGB emitter array according to some aspects disclosed here with six pixels, whereby the assigned pixel area 5 is shown for the exemplary pixel 2.1 provided with reference signs. Pixel 2.1 comprises separately applied μ-LEDs 3.1, 3.2, 3.3 forming subpixels, which are adapted as μ-LEDs and which emit red, green and blue light for the embodiment shown. The individual pixels 2.1 are characterized by a small fill factor so that only a comparatively small part of the pixel area 5 is occupied by the μ-LEDs 3.1, 3.2, 3.3. Otherwise, the μ-LEDs 3.1, 3.2, 3.3 are arranged in such a way that a comparatively large distance is formed between the individual light-emitting areas of the subpixels. On the one hand, the μ-LEDs 3.1, 3.2, 3.3 or the μ-LEDs are arranged at a distance from the edge of the pixels 2.1 so that optical and/or electrical crosstalk between adjacent pixels 2.1 does not occur. On the other hand, the μ-LEDs 3.1, 3.2, 3.3 are also arranged within the individual pixels 2.1 in such a way that optical and electrical crosstalk between the individual semiconductor lighting devices 3.1, 3.2, 3.3 of a pixel 2.1 can be prevented or at least minimized. The arrangement of the individual μ-LEDs 3.1, 3.2, 3.3 takes into account the radiation characteristics and the light output required to produce the desired images. In addition, a reflective elevation 2.4 can be designed, as shown here in the upper leftmost pixel. A transparent cover electrode can also be attached. Details of this are disclosed in this application.

Figure 19A:
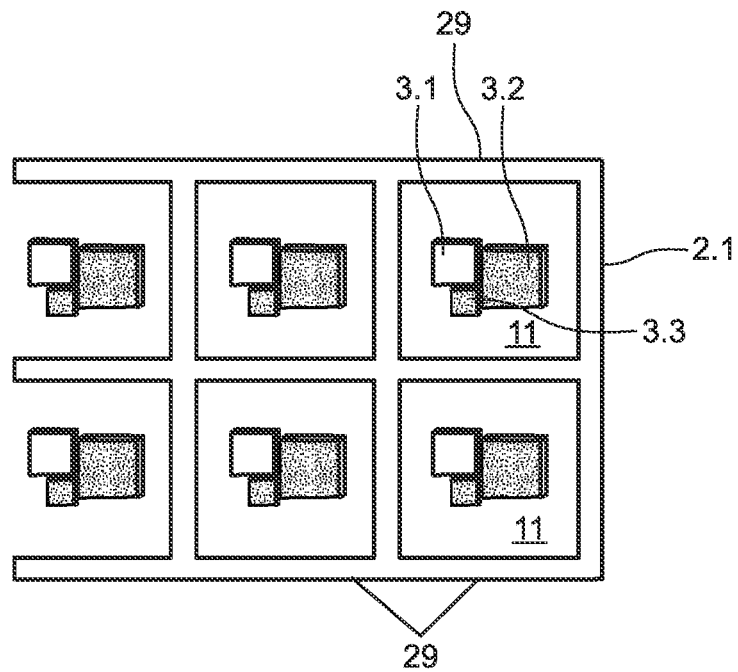
FIGS. 19A and 19B show a top view and a cross-sectional view of a combined embodiment with features of the embodiment examples of FIG. 18.

FIG. 19A shows a complementary embodiment based on the example of FIG. 18, where the pixels are arranged in rows and columns, each pixel having a total of three sub-pixels formed by respective μ-LEDs 3.1, 3.2 and 3.3. The individual μ-LEDs have different sizes depending on their emitting color. μ-LED 3.2 for the green color has the largest area, since the human eye is particularly sensitive to the color green. The μ-LED 3.1 for the red color and the μ-LED 3.3 for the blue color are arranged adjacent to the μ-LED 3.2 and have a significantly smaller size in comparison. A reflective structure 2.1 is arranged around the μ-LEDs. This has a sloping side surface on which a reflective layer 21 is deposited.

Figure 19B:
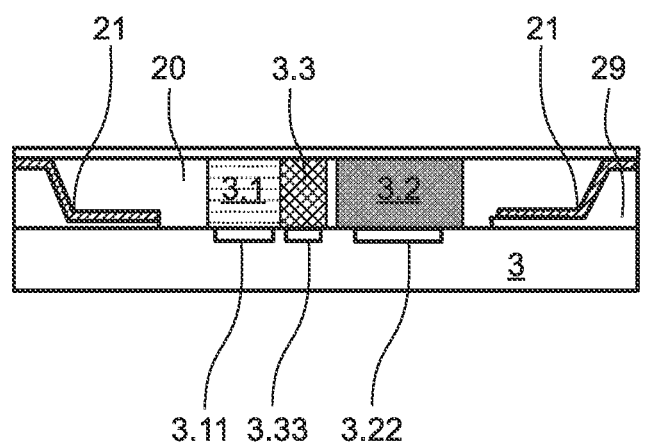

FIG. 19B shows the cross-sectional view along the XX-axis for a single pixel. The individual μ-LEDs 3.1, 3.3.2 and 3.3 are designed as vertical LEDs and each have a contact surface on their underside. Each contact surface is electrically connected to a contact area 3.11, 3.22 and 3.33 in a planar substrate 3. A further contact on the light-emitting side of each μ-LED is connected to a conductive cover electrode. The cover electrode is in turn connected to the conductive metallic and reflective structure 29 on all sides of the pixel. The reflective structure completely surrounds the μ-LEDs 3.1 to 3.3 and comprises a dielectric support 29 on the planar substrate 3, on which a reflective metal 21 is deposited. This extends over the upper side of the structure 29 and is in electrical contact with the top electrode and along the sidewalls and a partial area of the backplane substrate 3. The metal 21 is electrically insulated from the backplane substrate 3 by the electrical structure 29. Due to the large reflection range through the reflective layer 21, light emerging from the side is reflected and radiated upwards.

In the illustration shown in FIG. 19B the μ-LED 3.1 for the red light is partly behind the μ-LED 3.3 for the blue light. The contact areas 3.11 to 3.3 are designed accordingly, so that positioning the individual μ-LEDs on the surface of the backplane substrate 3 is simplified.

Figure 20A:
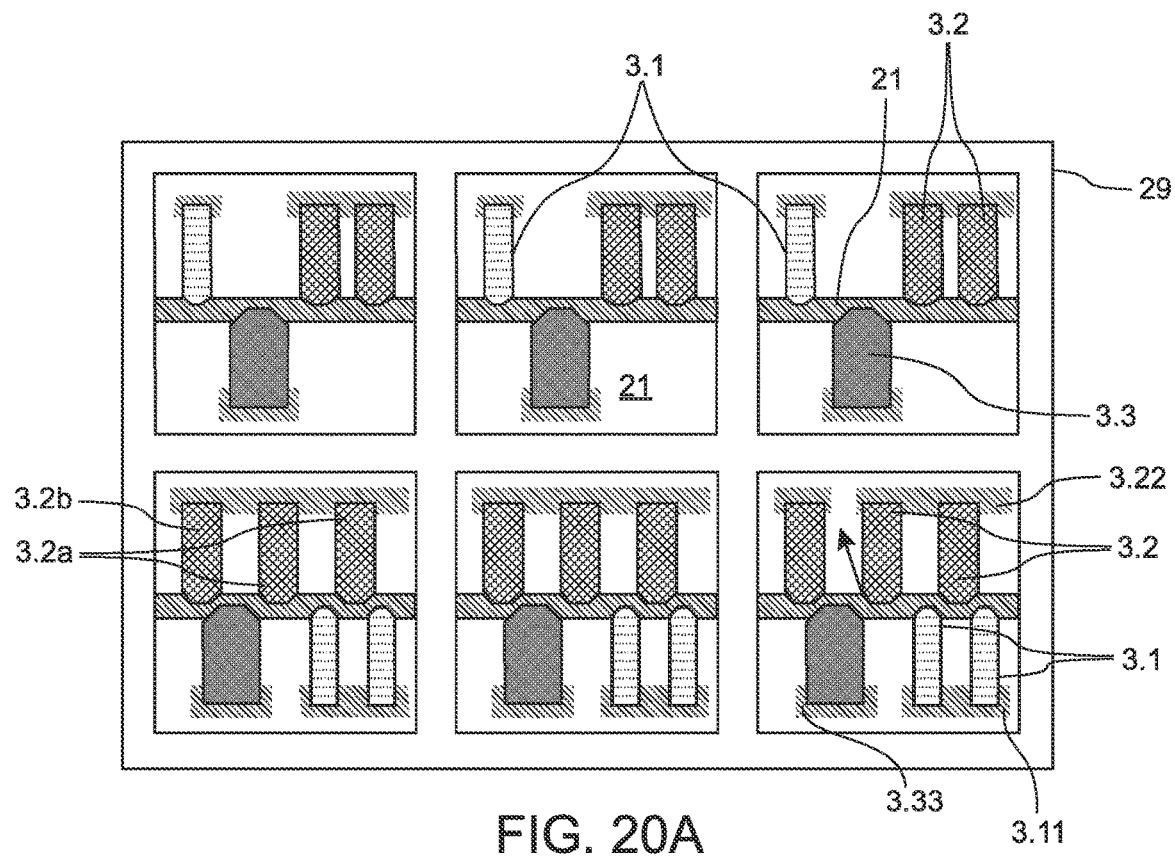
FIGS. 20A and 20B show top views of further versions of a matrix with RGB pixels, realized by µ-LED arrangements according to some of the concepts presented here.

FIG. 20A shows a top view of another embodiment, in which a pixel element with several subpixels is realized by horizontally arranged μ-rods. The horizontally arranged rods correspond to the different embodiments shown in this application. For each pixel, a common contact level 21 is provided on the backplane substrate, which on the one hand contacts the reflective metallic structure and on the other hand is connected to a common terminal of each μ-LED 3.1-3.3. For individual control of each μ-LED, the respective other contact area of this μ-LED is coupled to a contact area on the surface of the backplane substrate. This contact area is designed larger than the diameter or width of the respective μ-LED, thus simplifying positioning. In the design of the top row shown in FIG. 20A, two μ-LEDs 3.2 in the form of μ-rods are provided for the color green. The p-rods 3.1 are used to generate a red light, the μ-rods 3.3 to generate a blue light.

As already explained, the different widths of the μ-rods cause a color emission during operation. Accordingly, the μ-rod 3.3 has the largest width for the blue color, the μ-rod 3.1 the smallest width. It is planned to design the contact areas on the surface of the backplane substrate for individual control of the μ-rods with the same size in each case. This provides additional flexibility in the assembly of the individual pixels.

In the top row shown here, two rods are provided for the green color. Alternatively, however, the existing color space can be expanded, for example by configuring the μ-rods differently for the green color. Such an example is realized in the lower row in the left pixel with the two Rods 3.2a and 3.2b. Here the prod 3.2b shows a slightly different green color emission compared to the two Rods 3.2a. Thus, the color space in the green area is extended. Another aspect is shown in the lower row, and concerns the different sensitivity of the human eye to different colors. In order to achieve an increased number of color gradations or to prevent failure or defects, for example, an embodiment may provide several μ-rods of one color in or for the pixel. In the right pixel of the lower line, this is represented by an additional green μ-rod and an additional red μ-rod. These redundant μ-rods can be placed on the pixel if necessary, i.e. if a defect is present. For this purpose the contact areas, 3.11 and 3.22 are configured accordingly.

Another version shows the middle pixel of FIG. 20A. In this version, the contact areas for the individual control of the rods are combined so that all green and all red rods are controlled simultaneously. In this respect, a parallel connection of the three green and two red elements shown here is achieved for both green and red μ-rods. The contact areas on the surface of the backplane substrate 3 are larger, so that a simplified and more flexible positioning can be achieved.

Figure 20B:
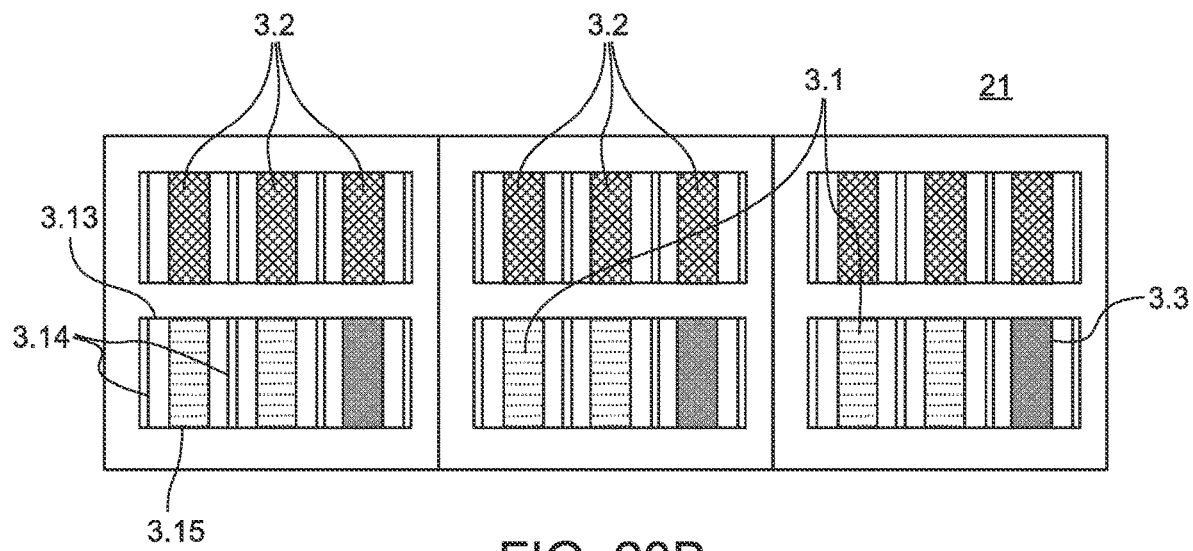

In addition to the rods shown here, other embodiments of such a pixel with different fill factors are also conceivable. FIG. 20B shows a version with μ-LEDs 3.1 to 3.2 in the so-called bar shape presented in this application. As already explained, the converter material 3.15 is arranged between two light-emitting bar-shaped elements 3.14 and thus forms a μ-LED. As shown, three μ-LEDs 3.2 for the green color are arranged in the top row of each pixel. Depending on the application, one of these μ-LEDs can be designed as a redundant μ-LED to replace a defective μ-LED if necessary. Alternatively, it can be designed with a different green color to extend the color space. The bottom row of pixels in FIG. 20B contains one μ-LED 3.3 for the blue color and two μ-LEDs 3.2 for the red color.

Figure 21:
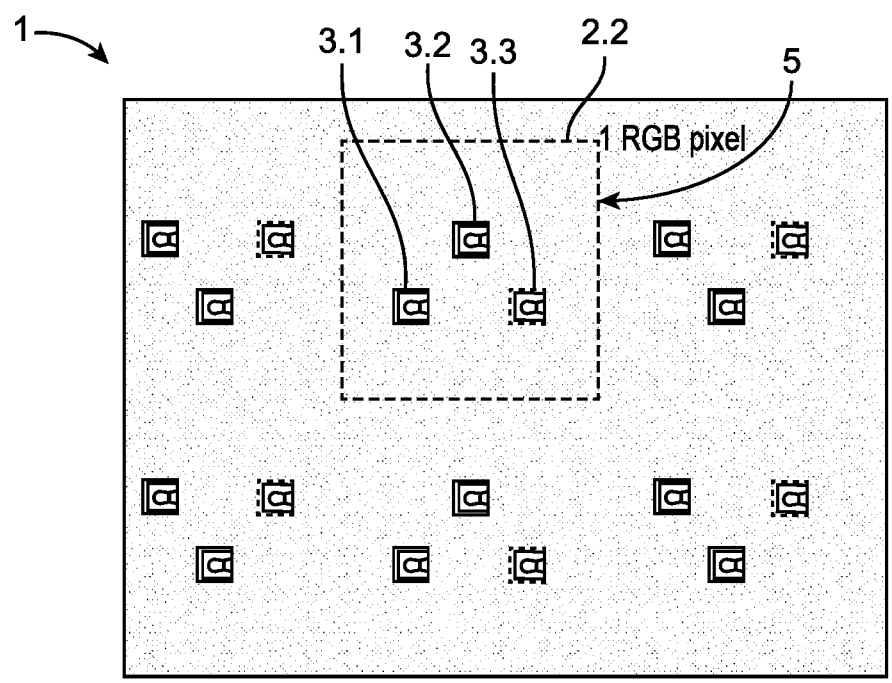
FIG. 21 shows another embodiment of an executed matrix with RGB pixels, which has a small fill factor according to some aspects.

FIG. 21 shows a top view of a matrix formed by RGB pixels, which forms an optoelectronic lighting device 1 of a proposed projection unit. As an example, a pixel area 5 of pixel 2.2 is shown dashed. The pixel 2.2 comprises three sub-pixel forming semiconductor lighting devices 3.1, 3.2, 3.3, which emit red, green or blue light and which are arranged in the form of a triangle on the surface 5 of the pixel 2.2. This embodiment may also be surrounded by a reflective layer. Another aspect at this point would be an embodiment as described above, in which the pixel emits light from the back, i.e. through the substrate, as shown schematically in FIG. 22I.

Figure 22:
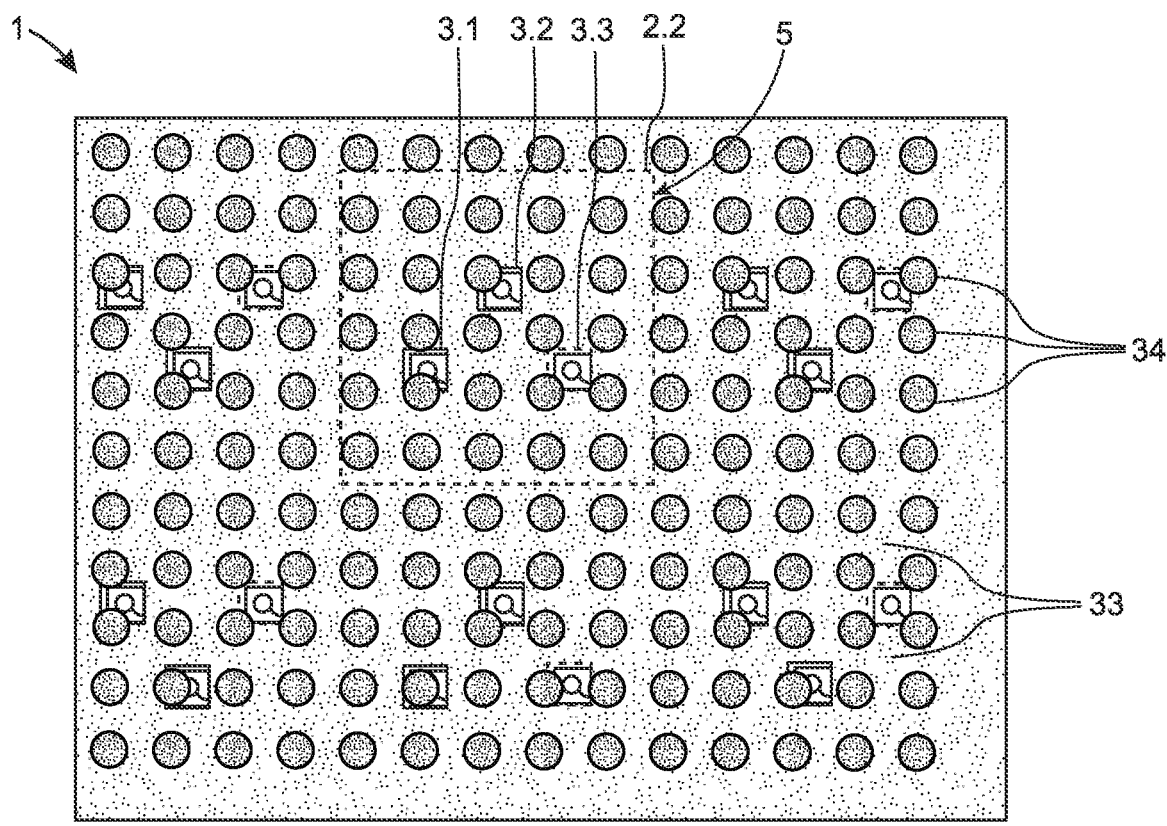
FIG. 22 illustrates a top view of an embodiment of a matrix with a light-shaping structure arranged on it.

Depending on the application, the matrix of pixels with μ-LEDs of a small form factor presented here can be supplemented by a light-shaping or even light-converting structure. FIG. 22 shows a top view of such an embodiment. In this case, a light-shaping structure with areas 33 and 34 is arranged on the matrix. The areas 34 are configured as pillars or columns or holes in the transparent layer 33 covering the matrix. The refractive index of layer 33 is different from that of the columns 34 or holes 34. This results in a periodic variation of the refractive index in the two spatial directions as shown in the top view. In this way, a photonic structure or a two-dimensional photonic crystal is formed above the matrix of individual μ-LEDs and pixels. The light of at least one wavelength can thus be shaped appropriately by selecting the periodicity accordingly. In addition, the columns or holes or even the μ-LEDs forming the subpixels can be arranged above one another. In this way, the holes or columns form a light guide, which can lead to an improvement of the radiation characteristic, an increased decoupling efficiency or an improved directionality.

Figure 23:
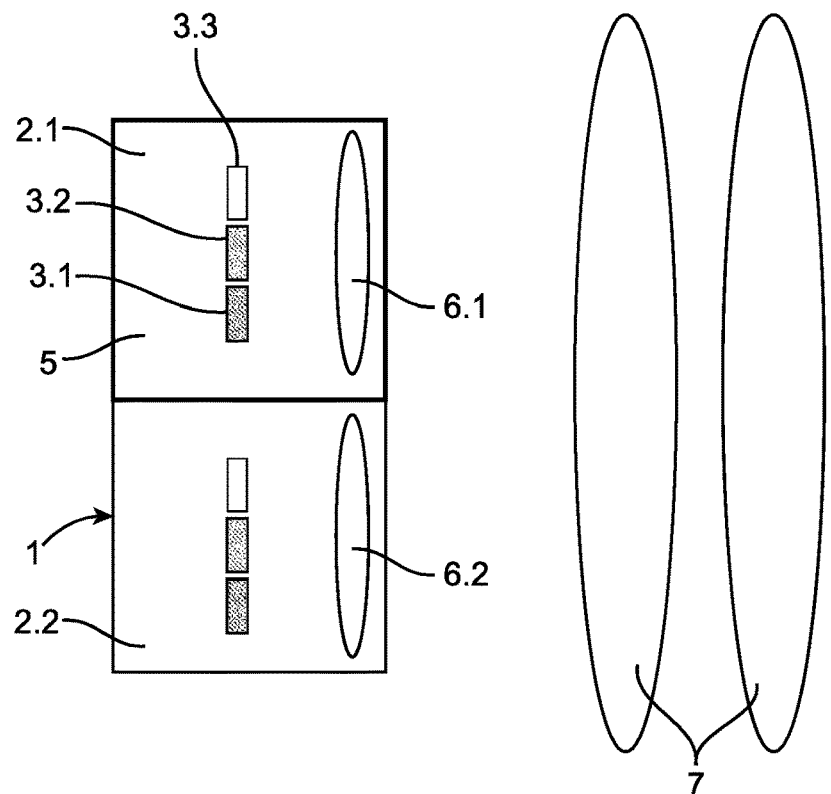
FIG. 23 shows a schematic representation of a projection unit according to some aspects of the proposed principle.

Furthermore, FIG. 23 shows a schematic view of the different components of a proposed projection unit. Such a projection unit has an optoelectronic lighting device 1, with matrix-forming pixels 2.1, 2.2, which have a low fill factor and each comprise μ-LEDs 3.1, 3.2, 3.3, which emit light of different colors, namely red, green and blue light. According to some suggested aspects, for each pixel 2.1, 2.2 a collimation optics 6.1, 6.2 is provided which collimates the light emitted by the μ-LEDs 3.1, 3.2, 3.3 and images it into a preferably virtual intermediate image 8.1, 8.2. With the aid of a projection optical system 7, the intermediate image 8.1, 8.2 of the μ-LEDs 3.1, 3.2, 3.3 is directed onto a display, screen or other display unit, which may also be the windscreen of a motor vehicle, which is not shown individually, in order to produce an image which can be perceived by the observer in the desired size, orientation and distance.

Figure 24:
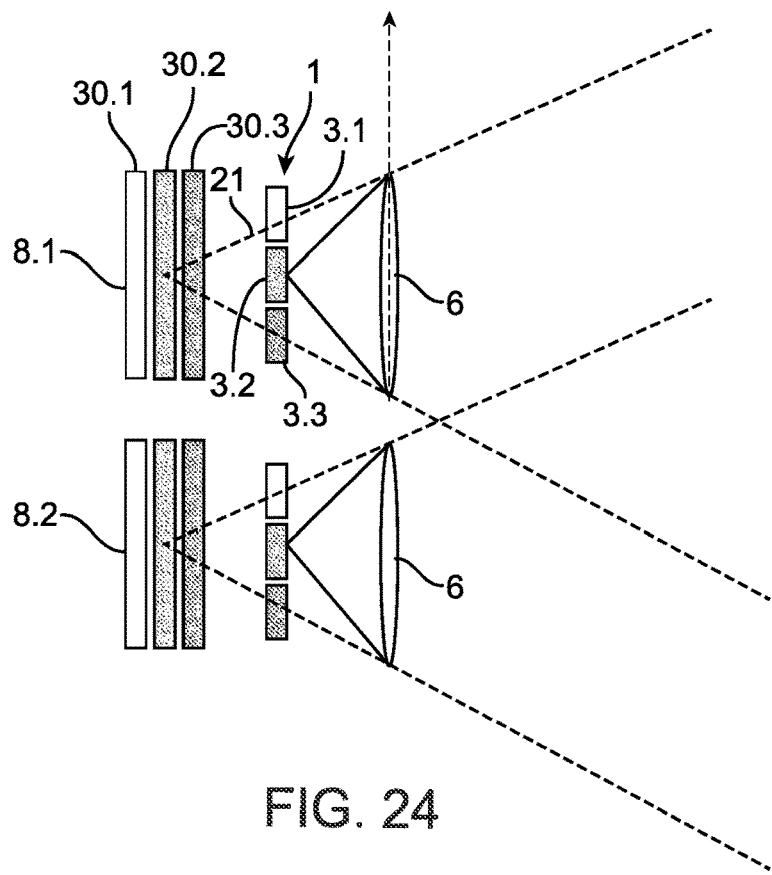
FIG. 24 shows a schematic representation of the generation of an intermediate image by the projection unit of the previous figure.

Furthermore, FIG. 24 shows the proposed location correction, which leads to an overlay of the enlarged virtual intermediate images 8.1, 8.2 of the μ-LEDs 3.1, 3.2, 3.3. Consequently, the collimation optics 6.1, 6.2 is designed in such a way that the size of the intermediate images 8.1, 8.2 of the μ-LEDs 3.1, 3.2, 3.3 essentially corresponds to the size of the respective pixel 2.1, 2.2 and additionally the different positions and sizes of the μ-LEDs 3.1, 3.2, 3.3 are largely compensated for the superimposition of the intermediate images 8.1, 8.2. Preferably the intermediate images 30.1, 30.2, 30.3 of the μ-LEDs 3.1, 3.2, 3.3 overlap over at least 85% and preferably over at least 95% of their intermediate image area. The intermediate images 30.1, 30.2, 30.3 of the µ-LEDs 3.1, 3.2, 3.3 may also overlap over at least 70%, 80% or 90% of their intermediate image area. It is also preferred that the total area of the overlapping intermediate images 30.1, 30.2, 30.3 of the µ-LEDs 3.1, 3.2, 3.3 of the respective pixel 2.1, 2.2 corresponds to at least 80% and preferably at least 90% of the pixel area 5. The total area of the overlapping intermediate images 30.1, 30.2, 30.3 of the µ-LEDs 3.1, 3.2, 3.3 of the respective pixel 2.1, 2.2 may correspond to at least 70%, 80% or 90% of the pixel area 5.

Figure 25:
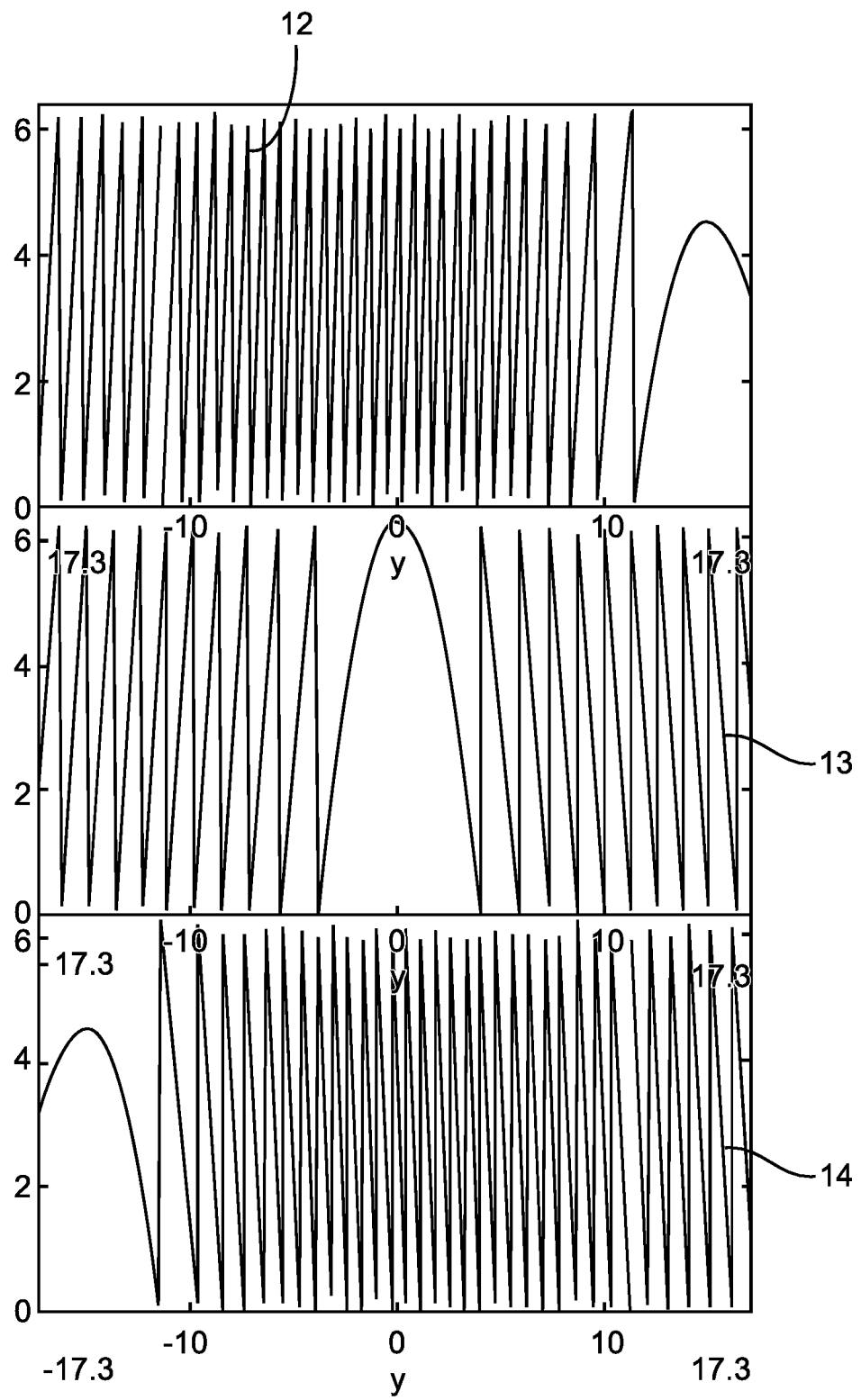
FIG. 25 shows the chromatic phase function of the collimation optics of FIG. 23.

The collimation optics 6.1, 6.2 assigned to each individual pixel 2.1, 2.2 can be achieved by means of a holographic optical element (HOE), a refractive optical element (ROE) or a diffractive optical element (DOE). FIG. 25 shows the necessary chromatic phase function 12, 13, 14 of the collimation optics 6.1, 6.2, 6.3 for the three different µ-LEDs 3.1, 3.2, 3.3 of the respective pixel 2.1, 2.2. The upper graphic shows the chromatic phase function 12 for the µ-LED 3 emitting red light, the middle graphic shows the phase function 13 of the collimation optics 6.1, 6.2 for the green light emitting µ-LED 3.2 and the lower graphic shows the necessary chromatic phase function 14 of the collimation optics 6.1, 6.2 for the blue light emitting µ-LED 3.3.

Figure 26:
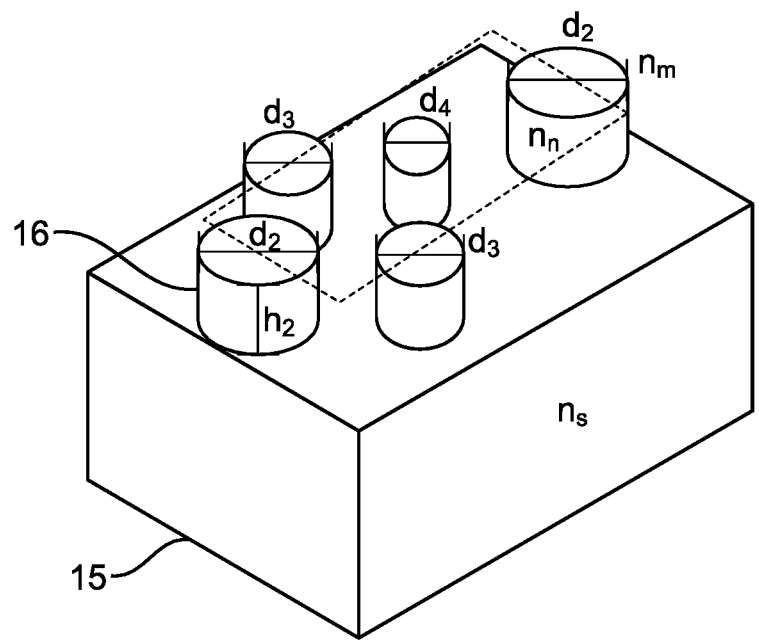
FIG. 26 shows a metal lens of collimating optics according to some embodiments of the proposed concept.

FIG. 26 shows an embodiment for which the collimation optics 6 is realized with the help of a meta-lens 15. Such a meta-lens 15 can be designed to produce either a refractive optical element or a diffractive optical element. It is advantageous for such meta-lenses 15 to have at least two spaced-apart regions, which have been structured in different ways. It is conceivable, for example, that in a first region of the meta-lenses a grid-like structure is provided, while the second region of such a meta-lens 15 comprises a circular structure. It is advantageous if the meta-lens 15 has a binary structure and/or is made of a dielectric material at least in some areas. A further aspect on FIG. 296 results when taking into account that the column structure can be arranged periodically or quasi-periodically. This results in an area with a periodic variation of the refractive index.

Figure 27:
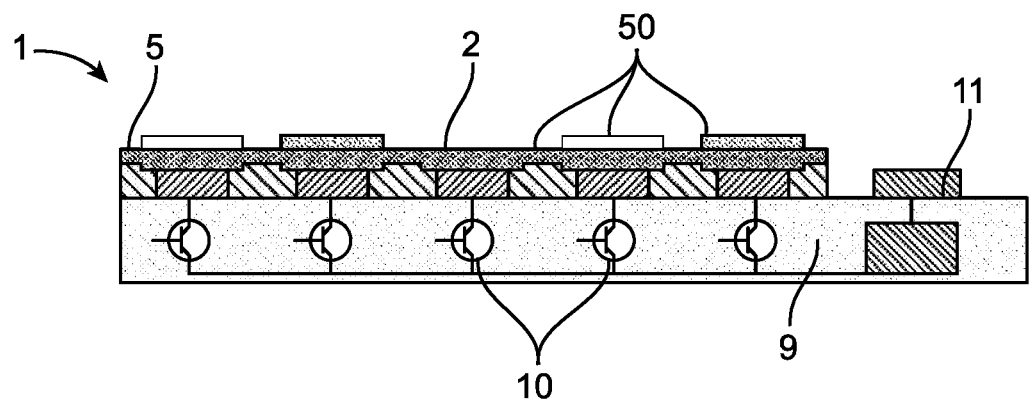
FIG. 27 shows a schematic side view of a monolithic array with several integrated µ-LEDs to illustrate some aspects of the proposed concept.

FIG. 27 shows the side view of a monolithic optochip containing the optoelectronic lighting device 1 for a projection display configured in accordance with the invention. The optochip has a silicon substrate 9 on which the individual pixels 2 with the sub-pixels provided therein are located. In order to supply the optochip with the necessary electrical energy, it has a power connection 11 and suitable conductor paths. The power supply and control of the individual light-emitting pixels 2 is provided by a CMOS array 10. Light generation at the subpixels is realized with LEDs, preferably µ-LEDs, which emit blue or ultraviolet light that is converted into light with the required color with the aid of suitable converter elements or suitable converter material.

On the surface of the optochip, there are pixels 2, in which subpixels 50 are arranged, each emitting red, green and blue light. The individual subpixels 50 each form a pixel 2 with a low fill factor, so that the individual light-emitting areas within a pixel 2 only occupy a part of the area of pixel 2 in comparison to the areas that do not emit any light, and are sufficiently spaced from one another in such a way that optical and electrical crosstalk between the individual subpixels 50 and between adjacent pixels 50 is reliably prevented or at least considerably minimized.

The pixels 2, each formed by three subpixels 50, are each assigned a collimation optic, not shown in detail in FIG. 27, which causes collimation of the radiation emitted by the subpixels 3 and spatial correction. According to the invention, the collimation optics produce 6 intermediate images of the subpixels 50 whose size corresponds to the size of a pixel 2. In addition, the collimation optics must be designed in such a way that the different positions and sizes of the individual sub-pixels in the intermediate image are compensated. In addition to the design with a monolithic optochip shown in FIG. 27, it is also conceivable to arrange different chips, each having one or a plurality of pixels or subpixels, on a common substrate and to contact them electrically. Preferably, the subpixels 50 of pixel 2 are formed by LEDs, which emit light with the required color, especially red, green or blue light. In principle, it is conceivable here to use LEDs that directly emit light with the desired color and/or convert the light emitted by LEDs, especially blue light, into light with the required color with the aid of suitable converter elements and converter materials. It is also conceivable to design the subpixel 50 as superluminescent diodes, VCSELs or edge-emitting lasers. It is also conceivable to implement the individual subpixel 50s by means of fiber optic cable end pieces that conduct light with the appropriate color.

In addition to the above version, the different resolution capabilities of the eye can also be taken into account by producing images of different resolution and directing them to the retina of a user. As already mentioned, the central part of the fovea is dominated by the cones, whereas the rods are present over a larger angular range. Likewise, the increased cone density (L, S and M cones) means that better color vision predominates, as the three different types of cones (L or also red, S or also green and M or also blue cones) register different color valences. Towards the edge, the sensitivity of color vision is reduced in accordance with the lower cone density, but at the same time contrast vision is maintained over a larger angular range by means of the rods, which are still active at low light intensity and are therefore responsible for night vision. FIGS. 1B and 1D illustrate this relationship. Overall, a radially symmetrical visual pattern is thus formed for the eye. A high resolution of an image for all primary colors is required, especially in the center. At the edge it may be sufficient to generate an image resolution adapted to the spectral sensitivity of the rods (max. sensitivity at 498 nm, see FIG. 1B).

Small movements of the eye and a change in the direction of vision or focus can be counteracted by suitable optics and tracking of the eye.

Figure 28:
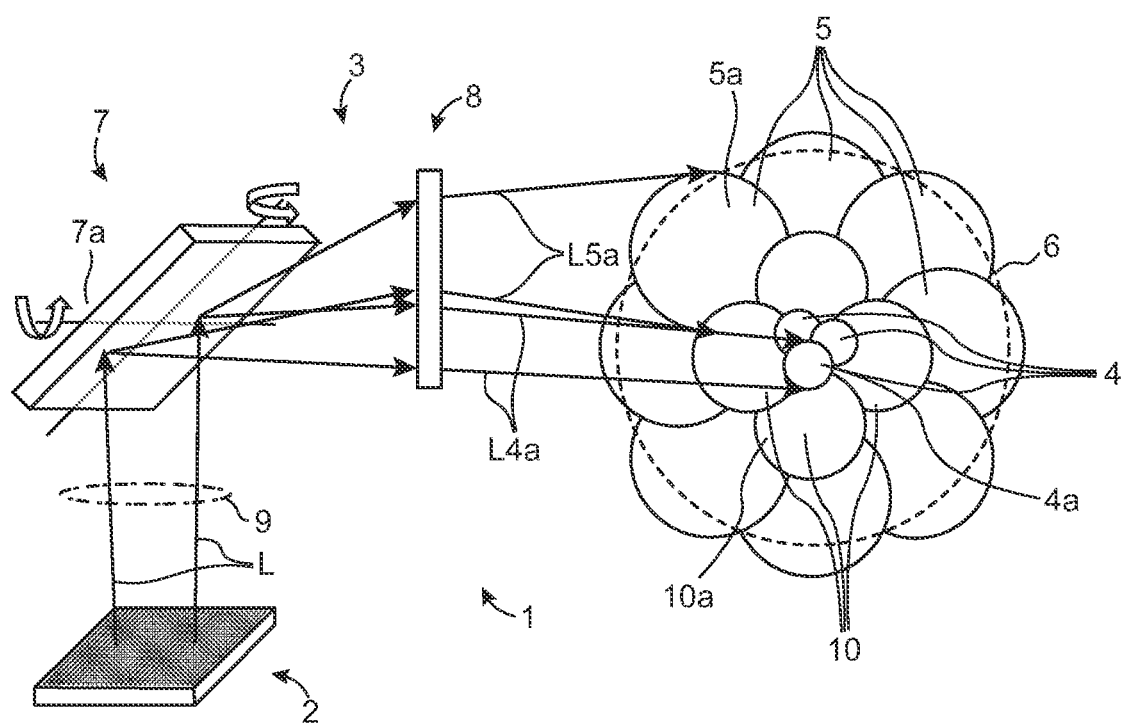
FIG. 28 shows an example of an arrangement for beam guidance according to some aspects of the presented concept, which takes into account the different spatial resolution of the eye.

The optoelectronic device 1 of FIG. 28 comprises a µ-display or more generally an optoelectronic imager 2 for generating at least a first and a second image, and an imaging optic 3. The imaging optic 3 is adapted to project a first image of the first image with a first resolution onto a first region 4 of a retina 6 of the eye of a user and to project a second image of the second image with a second resolution onto another, second region 5 of the retina 6, the first resolution being different from the second resolution.

For this purpose, imaging optics 3 comprises a beam steering device 7, which comprises a movable mirror 7a. The mirror 7a, when appropriately positioned, directs light rays L4a of the first image, for example to the first region 4a of the retina 6, to produce the first image and, after adjustment of its position, directs the light rays L5a of the second image, for example to the second region 5a of the retina, to produce the second image. In the present case, the movable mirror 7a is tiltable about two axes, whereby the area illuminated on the retina can be adjusted in both vertical and horizontal directions.

Furthermore, the imaging optics 3 comprises a beam-shaping device 8, which focuses the light rays of the first and second image on the respective area of the retina. The light rays L4a of the first image are focused more strongly than the light rays L5a of the second image.

Since both the first and the second image are produced by only one imaging device 2, and since this imaging device 2 has a certain total number of pixels, the first and the different second resolution of the first and second image on the retina 6 is only produced by the different focusing of the light beams of the first image L4a and the light beams of the second image L5a by the beam-shaping device 8. The resolution of the first and the second image results from the ratio of the pixel number of the imaging device 2 and the area of the respective image on the first and second regions 4a, 5a of the retina 6, respectively.

Since a high resolution of a projected image on the retina is only necessary in the area of center 4, the first region 4a with the first and higher resolution is closer to the center of retina 6 than the second region 5b with the second, lower resolution.

In the case of a retina 6 of an eye of a user of the optoelectronic device 1, which is to be assumed to be as round as possible, closer to the center essentially means that the center of the first region 4a, viewed in the radial direction, is closer to the center of the retina 6 than the center of the second region 5a. This means in particular that the resolution of the first and second images on the retina 6 is adapted to the higher receptor density at the center of the retina 6.

Since the optoelectronic device 1 comprises only one image generator 2 according to the embodiment of FIG. 28, the first image and second image and further images are displayed on the image generator one after the other in time. As a result, an overall image composed of the at least one first and one second image, i.e. a scene or a frame on the retina, is generated by a scanning process. The user only perceives the overall image due to the rapid sequence of the individual images. Scanning in this context means that the first and second image and possibly further, subsequent images are projected onto the areas of the retina one after the other, so that within a scene the entire surface of the retina is essentially completely illuminated by the images.

A marginal area 5 of the retina can be composed of several areas (e.g. area 5a), which are illuminated with images of the same resolution. Similarly, a central area 4 can be composed of several areas (e.g. area 4a) that are illuminated by images with the same higher resolution. Between the edge region 5 and the central region 4 it is also possible that at least one intermediate region 10 is formed, which is composed of several regions (e.g. 10a) and is illuminated with images with the same resolution. The edge region 5 and the at least one intermediate region 10 each largely form a ring which is illuminated by several images. The central area 4, on the other hand, largely forms a circle, which is also illuminated by several images. Illuminated areas of the retina may overlap. Preferably, however, the overlapping of areas is kept to a minimum. For example, less than 50% of the areas of the regions overlap, or less than 25% of the area of the regions, or less than 10% of the area of the regions.

Since the individual images are projected onto the retina so quickly one after the other, the result is, as mentioned above, a "total image" composed of the individual images within a scene on the retina, which is perceived by the eye as one image. Typical image repetition frequencies are 60 or 120 Hz and the display duration per frame is a fraction of a frame, whereby 2 to 100 partial images, preferably 5 to 50 partial images, are displayed per frame.

Optionally, an additional lens 9 can be placed between the imager 2 and the movable mirror 7a in order to focus the light beams L emitted by the imager and direct them to the movable mirror 7a.

Figure 29:
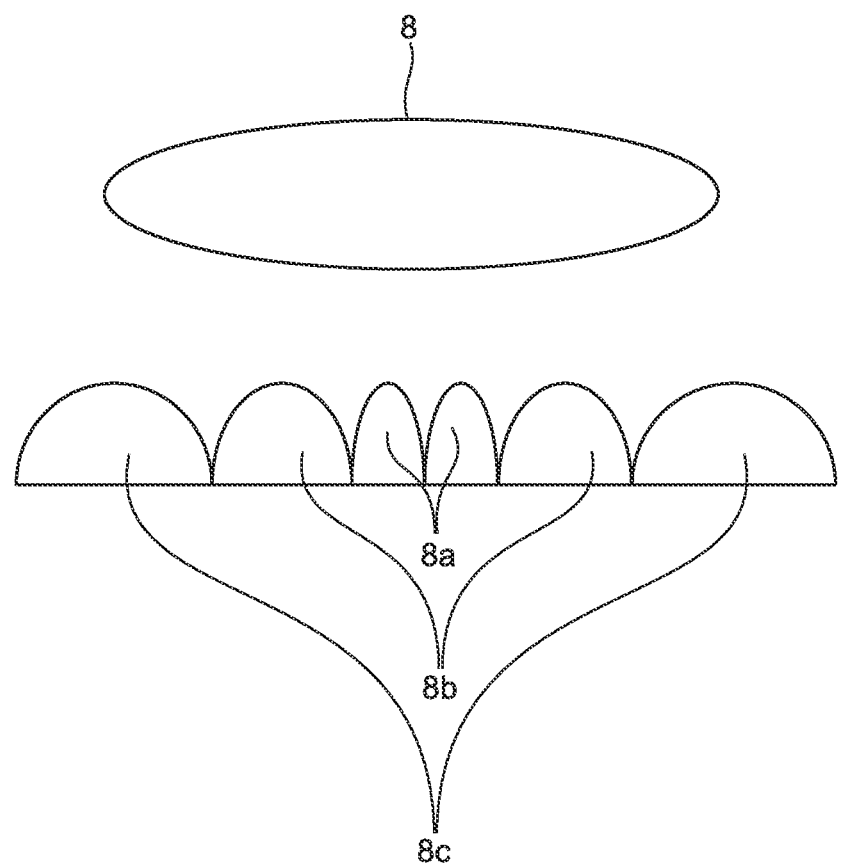
FIG. 29 are schematic illustrations for a beamline device in the arrangement of the previous figure.

FIG. 29 shows two possible designs of the beam-shaping device 8, which can be either a classical lens with curved surfaces or a segmented lens. A different focusing of the first and second image with a classical lens is achieved in that a stronger focusing occurs under a light incidence with a small angle to the optical axis than with beams with a larger angle to the optical axis.

The segmented lens, on the other hand, consists of several smaller lenses (mini-lens array) that focus to different degrees. Lenses 8a are installed close to the optical axis of the system, which reduce the image considerably, whereas lenses 8b, 8c project the image onto a larger area of the retina 6. As an alternative to a classical lens, the beam-shaping device 8 can also be designed as a flat optical element, for example as a meta-lens. Especially in case of segmentation, this offers the advantage that individual areas can be structured directly adjacent or smooth transitions between areas of different lens properties are possible. For the overall system, the use of a flat optical element for beam-shaping can enable a compact design.

Figure 30:
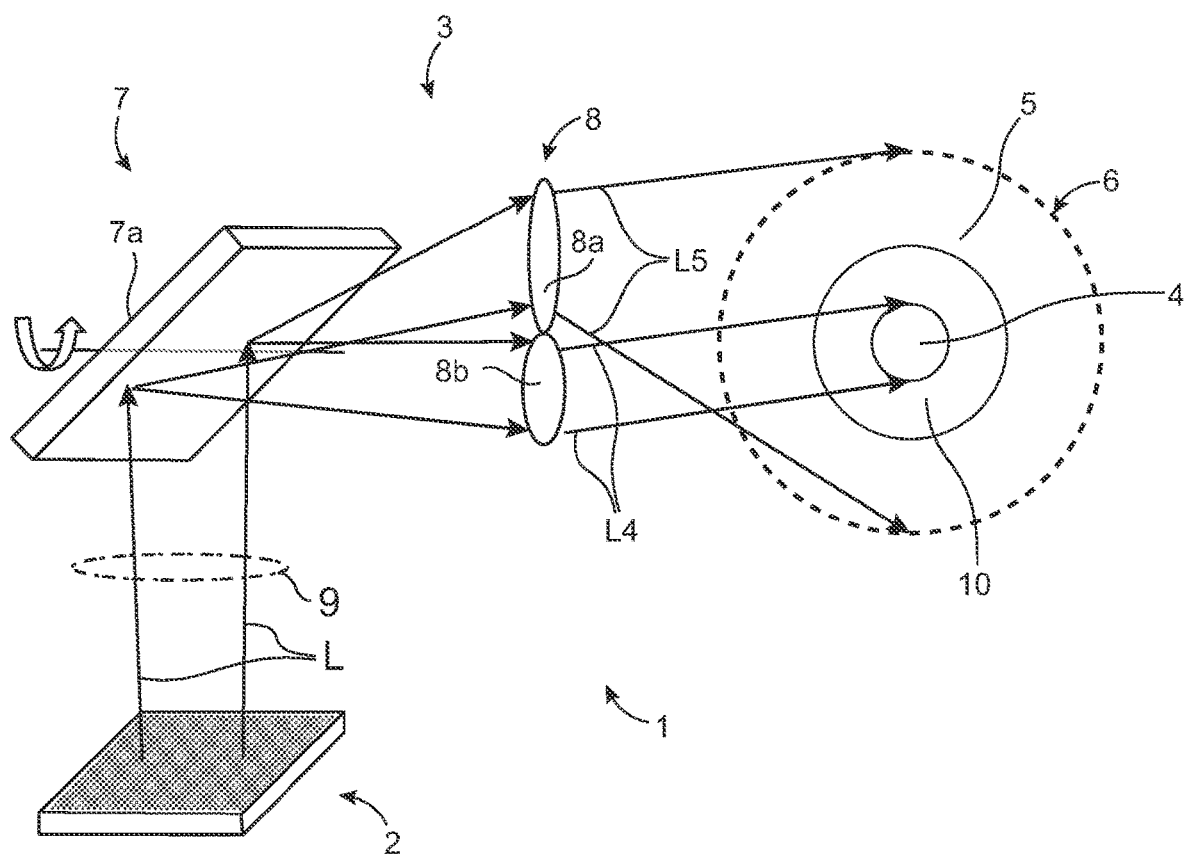
FIG. 30 shows another embodiment of a beamline arrangement to explain further aspects of the concept presented.

The optoelectronic device 1 of FIG. 30 differs from the optoelectronic device 1 of FIG. 28 in particular in that the movable mirror 7a is designed to tilt only about one axis. Furthermore, the beam-shaping device 8 can be formed from several optical elements, for example lenses 8a, 8b with different imaging properties. By tilting the movable mirror 7a, the at least one first and one second image generated by the imaging device 2 is sequentially projected onto the respective areas of the retina 6. The areas result as concentric circles that overlap in their center. The following two options are possible for the image formation of an "overall image":

Each point on retina 6 is illuminated by only one projected image. In other words, for N images, the imager produces N−1 times a ring-shaped image with a dark central area, which is projected onto the retina 6.

Alternatively, at least one image generated by the imaging device can also be projected onto the entire retina, whereby, viewed in the radial direction, at least one second image in the center of the retina is projected onto the central region of the retina 6 with a higher focus and thus higher resolution than the first image, and thus the cumulative stimulation of the at least two images corresponds to a desired target value. In practice, this means that the basic stimulation that applies to a larger area of the retina is produced at low magnification and details are produced at higher magnification settings by additional stimulation. For this purpose, the image content is analysed by the electronics of a system with regard to the spatial variation and broken down into partial images corresponding to the different magnification scales.

Figure 31:
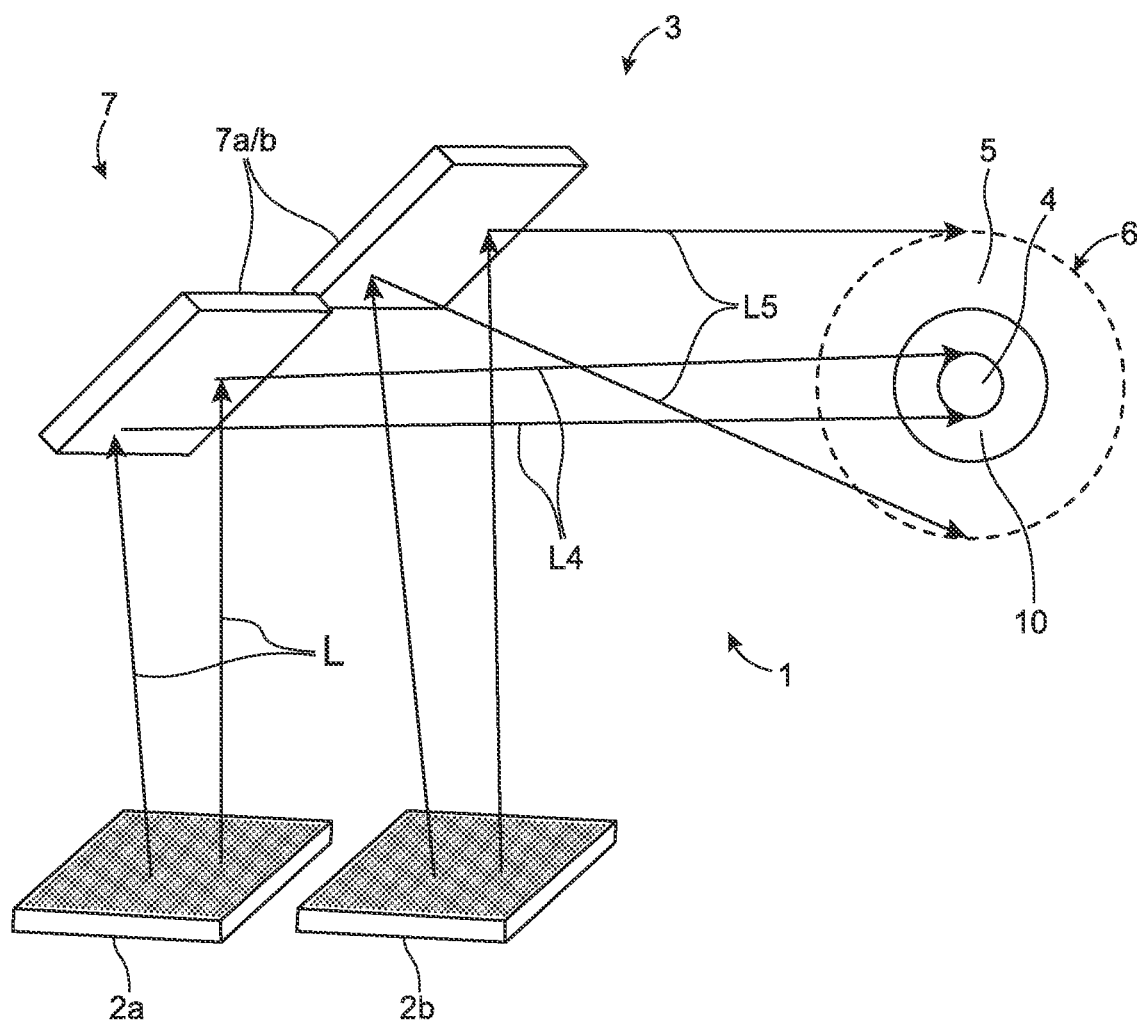
FIG. 31 is a further embodiment of an arrangement for beam guidance that takes into account the different resolving power of the human eye.

The optoelectronic device 1 of FIG. 31 differs from the optoelectronic device of FIG. 30 in that the beam steering device 7 has no movable mirrors but comprises at least two fixed beam steering elements 7a/b. In addition, the optoelectronic device 1 comprises at least two image generators 2a, 2b, which at least substantially simultaneously generate a first and a second image. The first beam steering element 7a directs the light rays L of the first image and the second beam steering element 7b directs the light rays of the second image in the direction of the retina 6. By an appropriately selected design of the beam steering elements 7a/b, the images of the at least one first and one second image are focused in a different manner on the retina 6, resulting in a different resolution of the two areas. An additional beam-shaping device is not necessary for this embodiment.

The areas on the retina 6 result, as already for the design of the optoelectronic device 1 of FIG. 30, as concentric circles overlapping in their center. The following two options, among others, are possible for the image formation of an "overall image":

Each point on retina 6 is illuminated by only one projected image. With N imaging devices and correspondingly with N simultaneously generated images, N−1 imaging devices generate a ring-shaped image with a dark central area, which is projected onto the retina 6.

Alternatively, the image generated by at least one imaging device illuminates the entire retina, whereby, viewed in the radial direction, at least one second image generated by a second imaging device is projected in the center of the retina onto the central region of the retina 6 with a higher focus and thus higher resolution than the first image. The cumulative stimulation of the at least two images may correspond to a desired target value. In practice, this means that the basic stimulation that applies to a larger area of the retina is produced at low magnification and details are produced at higher magnification settings by additional stimulation. For this purpose, the image content is analysed by the electronics of a system with regard to spatial variation and is broken down into partial images that correspond to the different magnification scales.

The at least two beam steering elements 7a/b may, for example, be formed by fixed mirrors or have glass fibres.

With this embodiment, the imaging optics 3 can be made much simpler in comparison to the embodiments of FIGS. 28 and 30. Nevertheless, by using several imaging devices, an adapted resolution can be achieved on each area of the retina.

Figure 32:
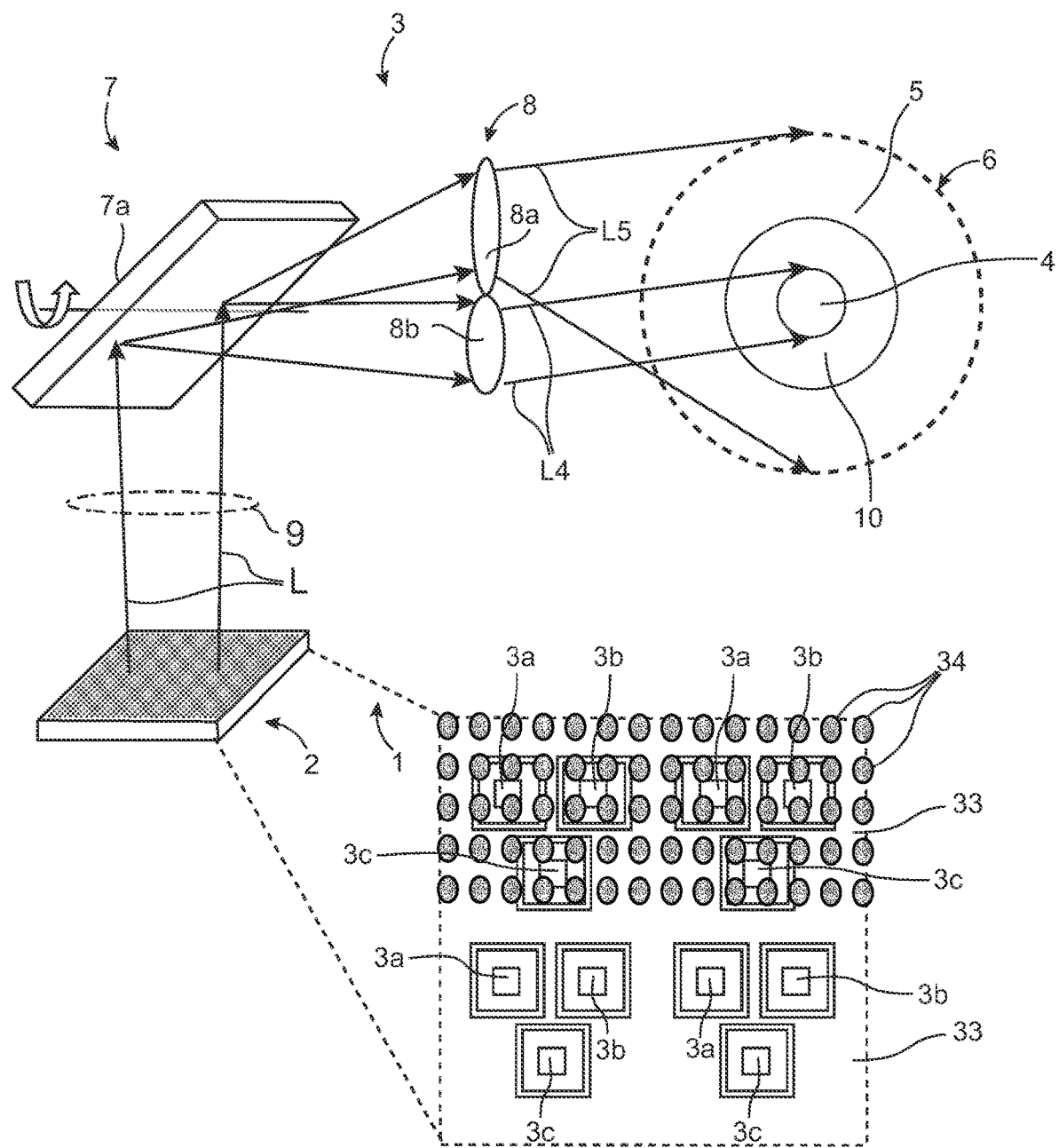
FIG. 32 shows a representation of a µ-display for the application illustrated in FIG. 30.

The various configurations of a beamline as shown in FIGS. 28 to 31 can be combined in any way, inter alia, with the various μ-displays and display devices disclosed in this application. FIGS. 32 to 33C show different configurations. In FIG. 32, light guide arrangement 3 is combined with a μ-display as shown in the configuration in FIG. 90. The μ-display 2 comprises a plurality of pixels arranged in rows and columns, each of which comprises a sub-pixel in the form of a μ-LED. The subpixels 3a, 3b and 3c are designed to emit and guide light of different colors. They are each surrounded by a reflective structure so that light emitted from the side is emitted upwards. To improve directionality, i.e. directional emission, a light-shaping structure is applied to the μ-display and in particular above the individual pixels. This comprises periodic areas with different refractive indices. For this purpose, a transparent material 33 is deposited on the upper side of each pixel and each μ-LED and periodic holes 34 are formed in it. The resulting structure thus forms a 2-dimensional photonic crystal, whereby the light emitted by the μ-LEDs is directed over the periodicity and radiated upwards in the form of a combined light beam L. Such collimation has the advantage that a more precise positioning on the retina of an observer is achieved by the mirror 7a and the lens system 8.

Figure 33A:
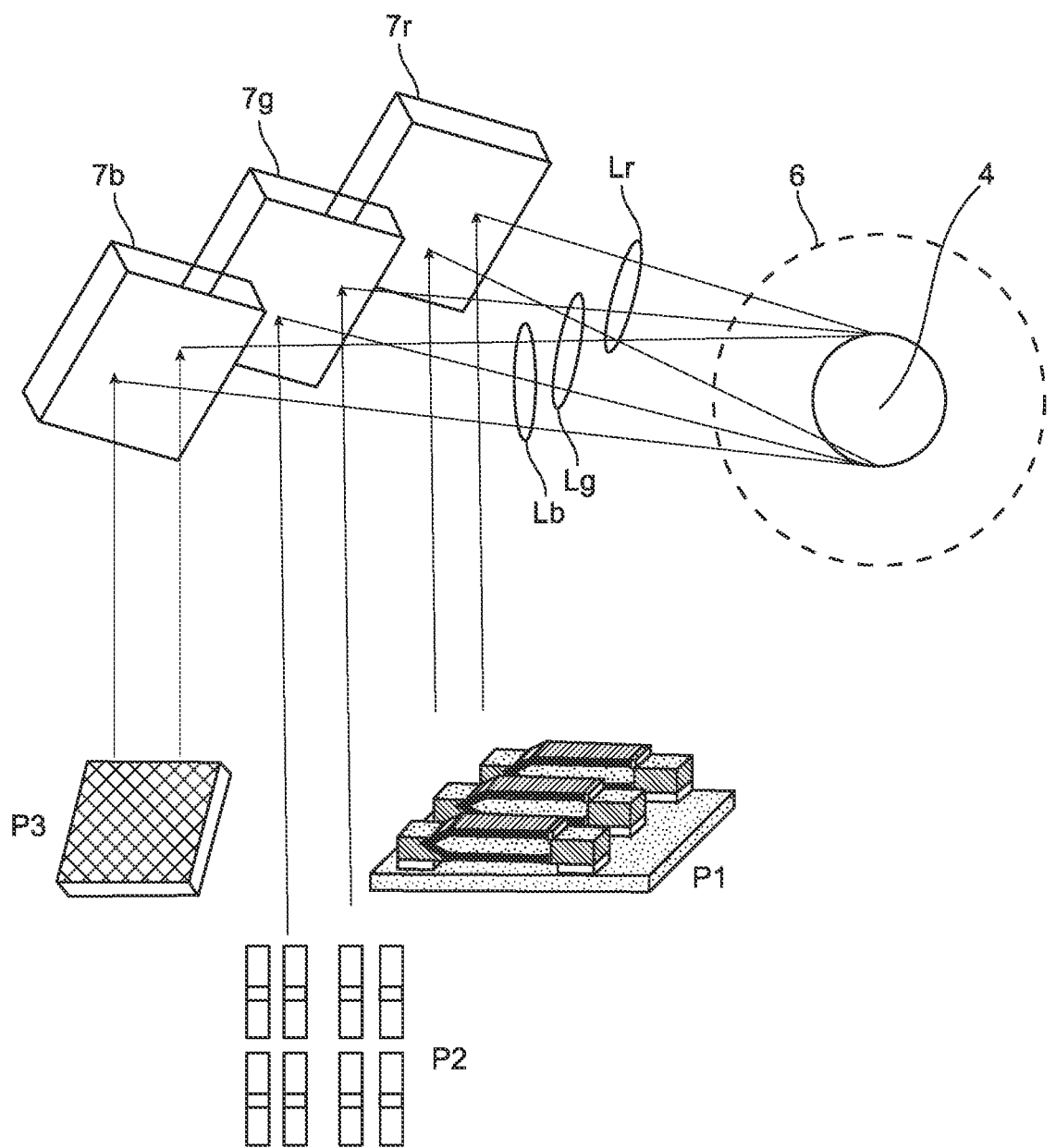
FIG. 33A illustrates different possibilities of a µ-display for generating light in a beam guiding device according to the proposed concept

FIG. 33A shows a further embodiment in this respect. Instead of a μ-display with μ-LEDs with different color emission arranged on it, three different μ-displays are provided. Each individual μ-display P1, P2 or P3 comprises a large number of individual μ-LEDs arranged in rows and columns, each of which can be individually controlled to emit a specific color. The individual μ-displays P1, P2 and P3 thus generate a combined light beam, which falls on one of the mirrors 7r, 7g and 7b respectively. The mirrors redirect the light beam and guide it via a lens system Lr, Lg and Lb to the retina of an observer.

In other words, the actual colored image is not already generated on the μ-display, but by the 3 different mirrors on the retina of the viewer. The individual color information is thus available separately for each pixel and is only assembled on the retina of the observer. Compared to a μ-display with the subpixels of each color, this embodiment has the advantage that the size requirements of each μ-LED are slightly reduced. In contrast, there is of course a larger space requirement.

The individual μ-displays P1, P2 and P3 are realized in this embodiment by 3 different designs. It goes without saying, however, that only one embodiment can be used for each individual μ-display. For example, the μ-display P1 for the red light comprises a plurality of horizontal μ-rods, which are contacted on the surface and can be individually controlled. In this design, the μ-rods are each monochrome, i.e. designed to emit red light. Accordingly, the other μ-displays P2 and P3 could also be equipped with such μ-rods to emit green and blue light respectively. Such a μ-display with horizontally aligned μ-rods of different colors is already shown in various other embodiments and can also be realized here with the shown light guide arrangement.

Furthermore, in the representation of FIG. 33A, the μ-display P2 for the green light is implemented with an antenna slot structure according to the proposed concept disclosed in this application. The antenna slot structure comprises 2 antenna slots arranged in parallel for each individual green pixel. On the one hand, the parallel arrangement allows a higher intensity and also allows compensating for possible defects by the redundant arrangement of two antenna slots per pixel. In addition, as shown in this embodiment, the emitted green light is linearly polarized due to the parallel arrangement of the antenna slots. In this respect, such an antenna slot structure as μ-display for each color would also be suitable for generating three-dimensional images on the retina of a user. In such a case, for example, the antenna slot structure for the μ-displays of the other eye could be arranged 90° offset. The lens systems Lb, Lg and Lr could possibly have switchable polarization filters.

A third version of a possible μ-display is realized by the μ-display P3. This comprises a plurality of monolithically integrated pixels of one color each, arranged in rows and columns. All μ-displays shown here can be equipped with further measures for light coordination and light shaping. For example, photonic structures of the surface or other light forms of the elements such as microlenses are conceivable.

Figure 33B:
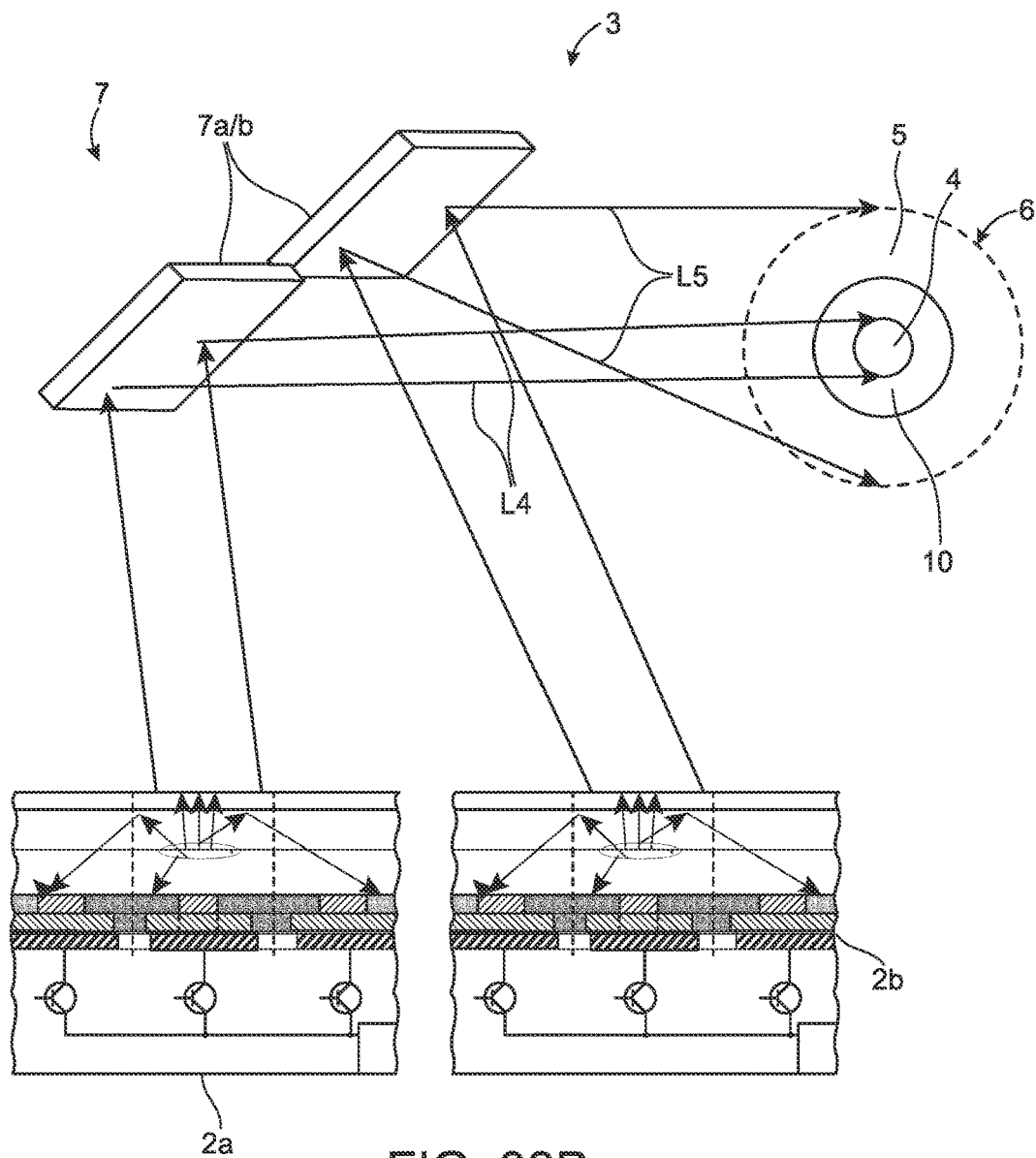
FIG. 33B is another possibility to combine a beam delivery device with a µ-display embodiment.
Figure 33C:
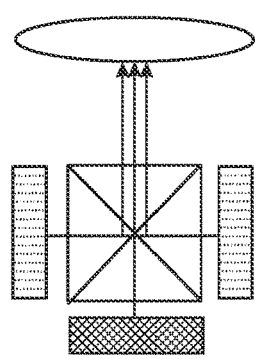
FIG. 33C shows a chromatic cube as it can be used in some applications and in which the light-emitting surfaces can be formed with the versions of µ-displays disclosed here.

A further concept based on the embodiment of FIG. 32 and a μ-LED arrangement according to FIG. 333 shows the embodiment of FIG. 33B. The embodiment is adapted with 2 μ-displays 2a and 2b each, which contain a large number of monolithically integrated μ-LEDs. Each subpixel can be controlled individually. As explained in the embodiment for FIG. 32, the light emitted by the μ-displays 2a and 2b is deflected by the two mirror systems 7a and 7b either to the central area of the eye of the fovea or to the more decentralized area 5. Accordingly, if the μ-displays 2a and 2b are configured in the same way, the resolution in the fovea 4 area is higher than in the central area 5 due to the μ-display 2b and the mirror system 7b.

Finally, FIG. 33C shows a different embodiment in this respect with a dichroic cube. The dichroic cube comprises 2 semi-reflecting surfaces perpendicular to each other. On three sides of the dichroic cube, there is a μ-display of a plurality of μ-LEDs arranged in rows and columns. Each μ-display is designed to emit one color. In the example shown in FIG. 33C, the lower μ-display is used to emit a blue light, the right μ-display to emit a green light beam and the left μ-display to emit red light. The respective red and green light beams hit the surfaces of the dichroic cube in an angle and are deflected onto a lens system. In contrast, the two surfaces of the dichroic cube are transparent to the blue light, so that it hits the lens system directly.

Figure 34A:
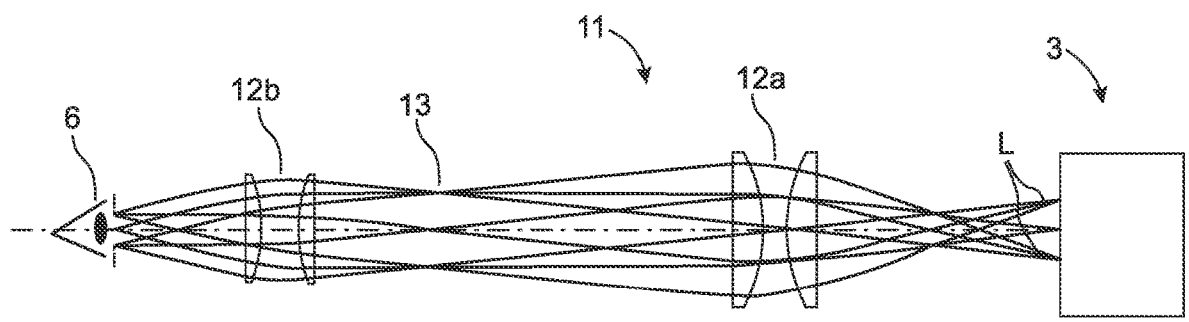
FIGS. 34A and 34B show various embodiments of beam systems which can be placed upstream, downstream or integrated into the imaging optics of the device of FIG. 29, 30 or 31.
Figure 34B:
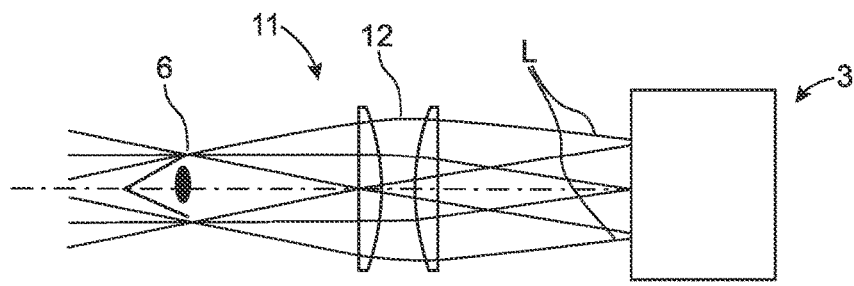

FIGS. 34A and 34B show two possible embodiments of beam systems 11, which can be arranged downstream of a respective imaging optics 3 of the device of FIG. 28, 30 or 31. The respective beam system 11 can thus be arranged between the imaging optics 3 and the eye.

The beam system 11 of FIG. 34A comprises an objective lens system 12a and an eyepiece lens system 12b, which are arranged successively in the beam path between the imaging optics 3 and the retina 6 in order to direct the light rays L to the retina 6 following the imaging optics 3. Since the light path of the light rays L crosses in the beam system 11, the objective lens system 12a produces an upside down and laterally reversed real intermediate image 13 of the projected image. By means of the eyepiece lens system 12b (principle of a magnifying glass), this intermediate image 13 of the projected image is viewed magnified.

The beam system 11 of FIG. 34B, on the other hand, comprises only one lens system 12, which is arranged in the beam path between the imaging optics 3 and the retina 6 in order to direct the light rays L to the retina 6 in the wake of the imaging optics 3. Correspondingly, no real intermediate image 13 of the projected image is produced in this lens system 11, but the projected image is merely viewed enlarged or reduced.

In a variant not shown, the respective beam system 11 could also be arranged between the imaging device 2, 2a, 2b and the imaging optics 3.

It may be intended that the imaging optics 3 are integrated in the beam system 11. With reference to FIG. 34A, the imaging optics 3 could, for example, be in the plane of the intermediate image 13. It may be provided that a pair of lenses of lens system 12b shown in FIG. 34A, which at least substantially defines the magnification, is spatially segmented (or at least one of the two lenses), and that the imaging optics 3 lies between the spatially separated segments of a lens. Alternatively, the imaging optics 3 can also lie between the two lenses of the lens pair shown.

Also in the variant according to FIG. 34B, the shown lens pair of lens system 12 could include imaging optics 3, either as an additional element in between or as a modification of one or both lenses of the lens pair.

Figure 35:
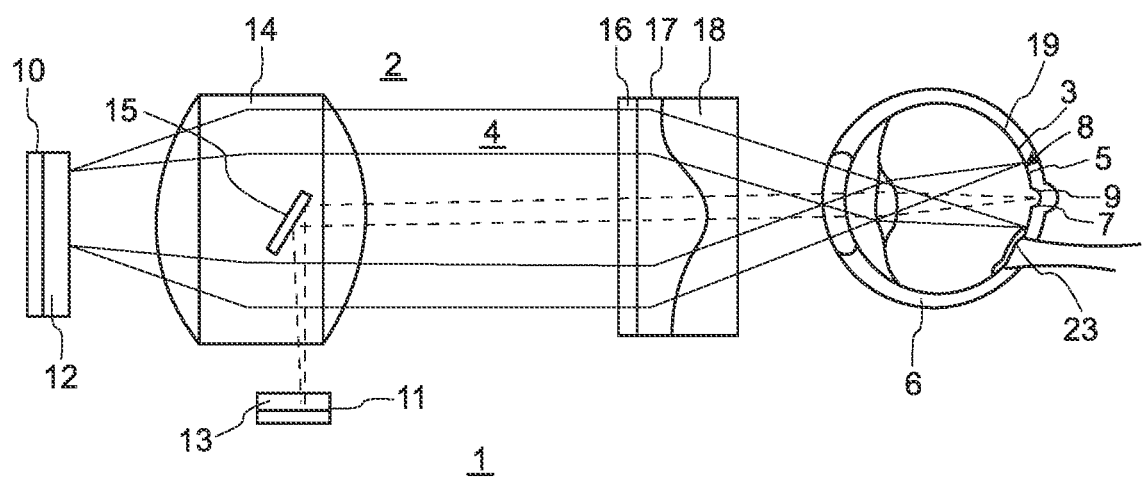
FIG. 35 shows a schematic diagram for a first embodiment of a light field display according to some aspects of the proposed principle.

An alternative design to transfer images to or into the eye of a user is achieved by a Light field display which creates an image within the eye by direct retinal projection. FIG. 35 shows a first version of a light field display 1 according to some of the principles presented here, which is explained below for the components assigned to a user eye. Binocular optics not shown in detail accordingly show a symmetrical double arrangement of the outlined components.

Shown in FIG. 35 is an optoelectronic device 2 and an optics module 4 that create a retinal projection 5 of a raster image 3 in a user's eye 6. The optoelectronic device 2 comprises a first imaging unit 10 with a first μ-display 12 and a second imaging unit 11 with a second μ-display 13. Both μ-displays are designed as μ-LED array with a plurality of μ-LEDs in rows and columns. The μ-LEDs are organized as pixels, with each pixel having three subpixels of different color. In other words, each μ-LED is designed to emit one color and is individually addressable and controllable.

For the embodiment shown, optics module 4 has a collimation optics 14 and a projection optics 17 with a free-form lens 18, which produce a first raster sub-image 8 of the first imaging unit 10 on the retina 19 of the user's eye 6. The first partial sub-image 8 is created over a large area.

For the imaging of the second imaging unit 11, an adjustment optic 15 is available in optics module 4, which is arranged within the collimation optic 14 for the present embodiment. For other embodiments not shown in detail, the adjusting optics 15 can be located between the collimation optics 14 and the projection optics 17 or at least partly in a waveguide 16 of the projection optics 17.

The second raster sub-image 9 of the second imaging unit 11 is projected onto a local area of the retina 19 with the fovea centralis 7, in which the most precise optical perception can be achieved due to the high surface density of the visual cells, which are exclusively designed as cones for photo-optical vision. A higher resolution is selected for the second raster sub-image 9 than for the first raster sub-image 8.

FIG. 1C shows the different perceptual capacity of the human eye by means of a graph of the angular resolution A relative to the angular deviation α from the optical axis of the eye. The highest angular resolution A is in a region of the fovea centralis 7 with a diameter of 1.5 mm on the retina 19, which covers an angle of about +/−2.5° around the center (0°). In addition, there is a blind spot 22 on the retina 19 at an angle of about −15°. FIG. 1C also illustrates the local limitation of the second projection area 21 of the light field display 1 for the high-resolution second raster sub-image 9 and the larger first projection area 20.1, 20.2 for the first raster sub-image 8 with a lower resolution.

Figure 36:
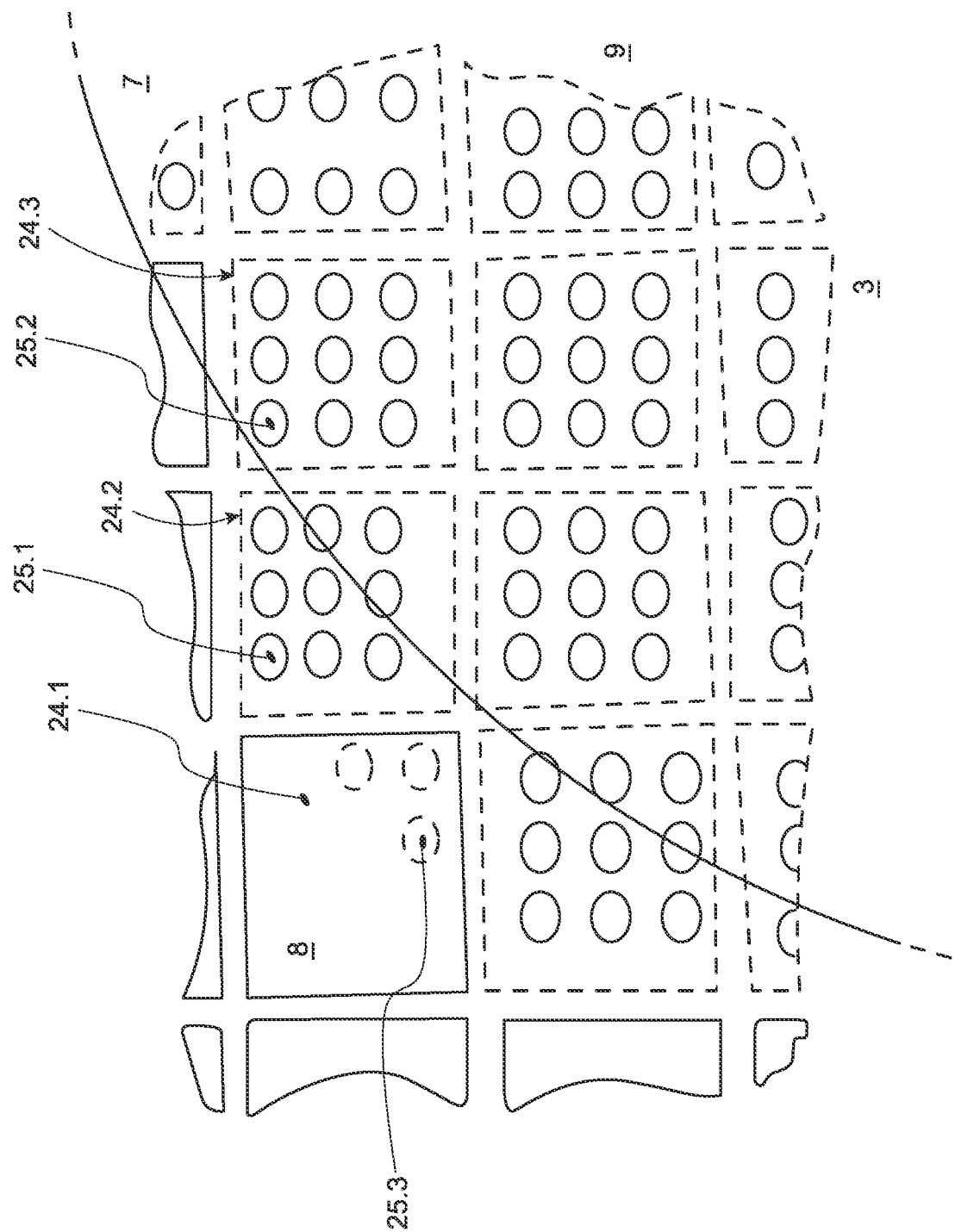
FIG. 36 illustrates the assembly of the first halftone image and the second halftone image to form a halftone image projected onto the retina.

FIG. 36 illustrates the assembly of the first sub-image 8 and the second sub-image 9 to form the halftone image 3 projected onto the retina 19. For the first raster sub-image 8, an activated first pixel image 24.1 with a relatively low resolution is sketched with a solid line. In addition, two non-activated and dashed first pixel images 24.2, 24.3 of the first raster sub-image 8 are shown, whereby the representation in these areas assigned to the fovea centralis 7 is replaced by an arrangement of second pixel images 25.1, 25.2, which are part of the higher-resolution second raster sub-image 9. In order to keep an overlap area of the two sub-images 8, 9 as small as possible, individual second pixel images 25.3 can also be switched off for the advantageous design shown by an appropriate control of the second imaging unit 11.

Figure 37:
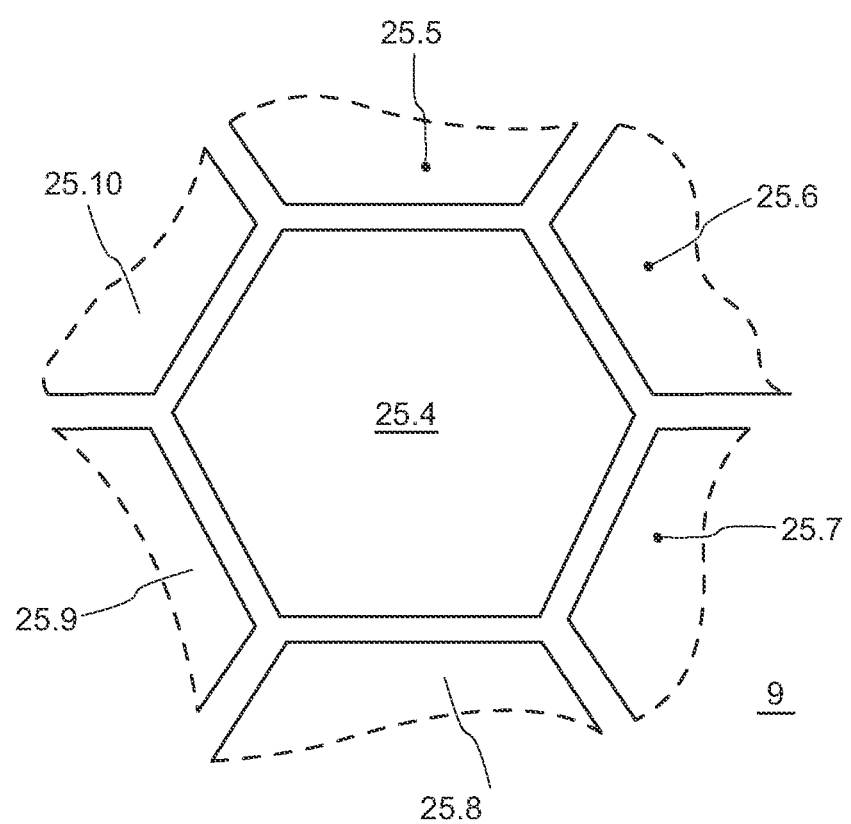
FIG. 37 shows second pixel images with hexagonal outline.

FIG. 37 shows that the contours of the pixel images may differ from the rectangular shape. Shown is a hexagonal version of the second pixel images 25.4-25.10, which allows a high surface density. Techniques to produce such μ-LEDs are disclosed in this application.

Figure 38A:
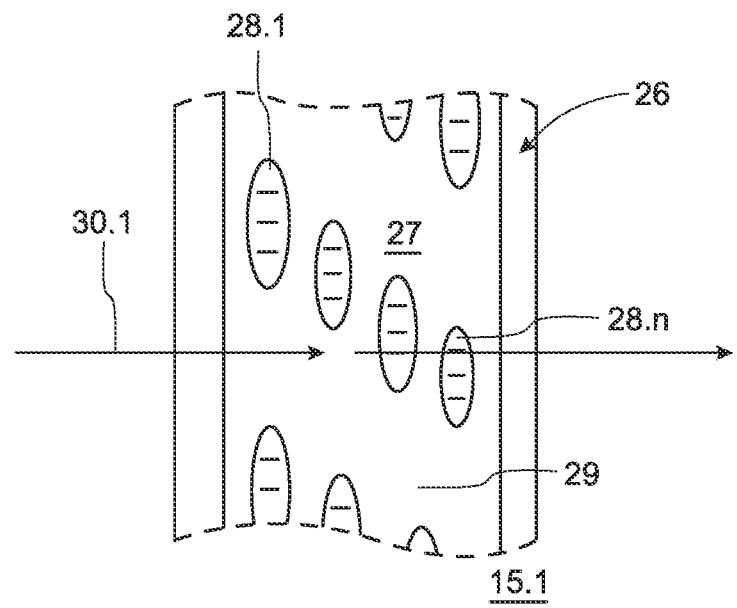
FIGS. 38A to 38B show an adjustment optic with a switchable Bragg grating according to some aspects of the proposed concept.
Figure 38B:
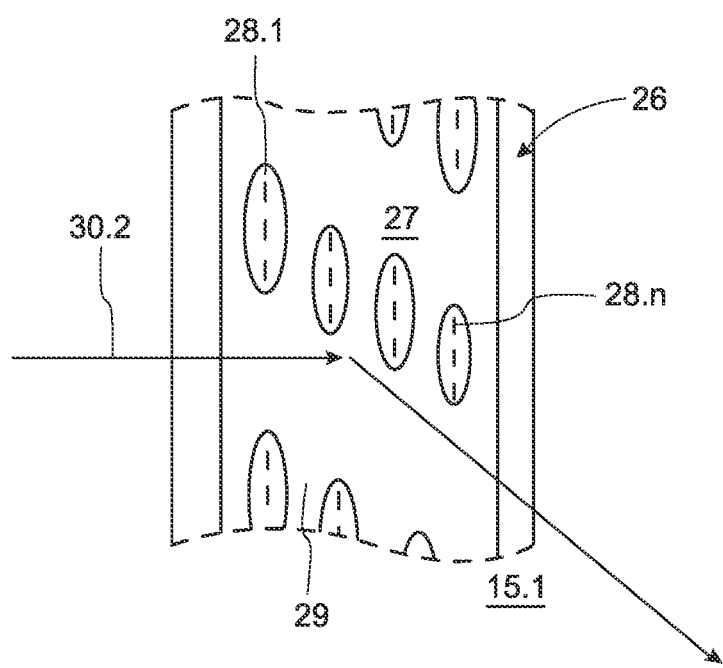

FIGS. 38A and 38B show a possible design of the adjustment optics 15.1, 15.2 with the help of which the relative position of the retinal projection 5 of the second halftone image 9 can be adjusted in relation to the retinal projection 5 of the first halftone image 8. Shown is a version with a switchable Bragg grating 26, which has a holographically produced pattern 27 with liquid crystal areas 28.1-28.n in a polymer matrix 29. FIG. 38A shows the state with an electric field oriented in a first direction and an undeflected optical path 30.1 and FIG. 38B shows the state with an electric field oriented in a second direction perpendicular to the first direction and a resulting deflected optical path 30.2.

Figure 39:
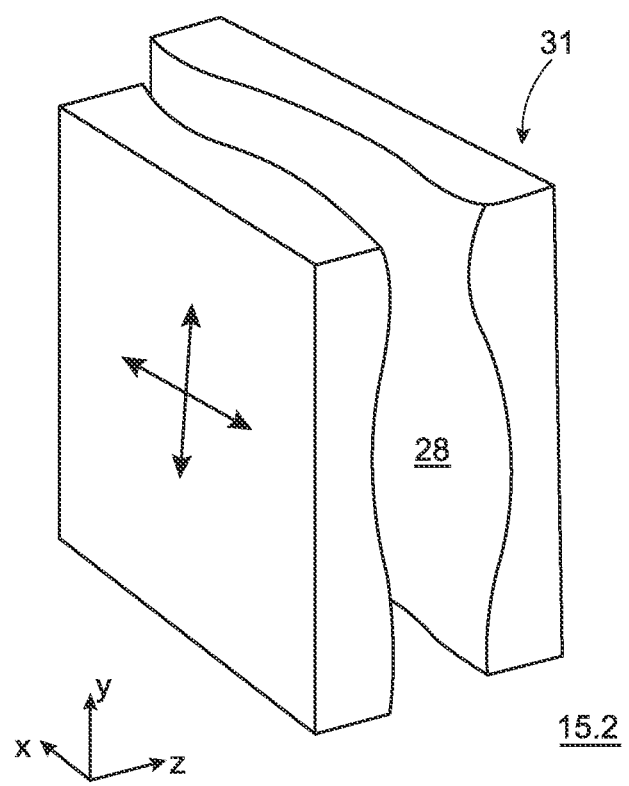
FIG. 39 is a view of an adjustment optic with an Alvarez lens arrangement suitable for a light field display according to the proposed principle.
Figure 40:
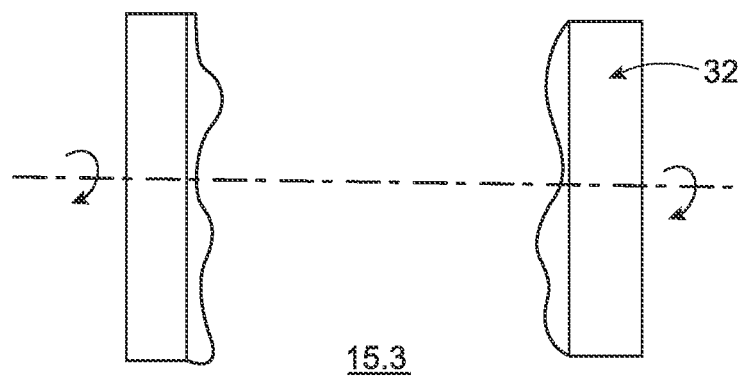
FIG. 40 shows an adjustment optic with a Moire lens arrangement suitable for a light field display according to the proposed principle.

An alternative embodiment of the adjustable optics 15.2 with an adjustable Alvarez lens assembly 31 is shown in FIG. 39. This comprises a double arrangement with phase plates each having a surface relief, which can be moved relative to each other in the x and y direction for beam adjustment. A special type of adjustable optics 15.3 with rotating Alvarez lenses, called Moire lens array 32, is shown in FIG. 40.

Figure 41:
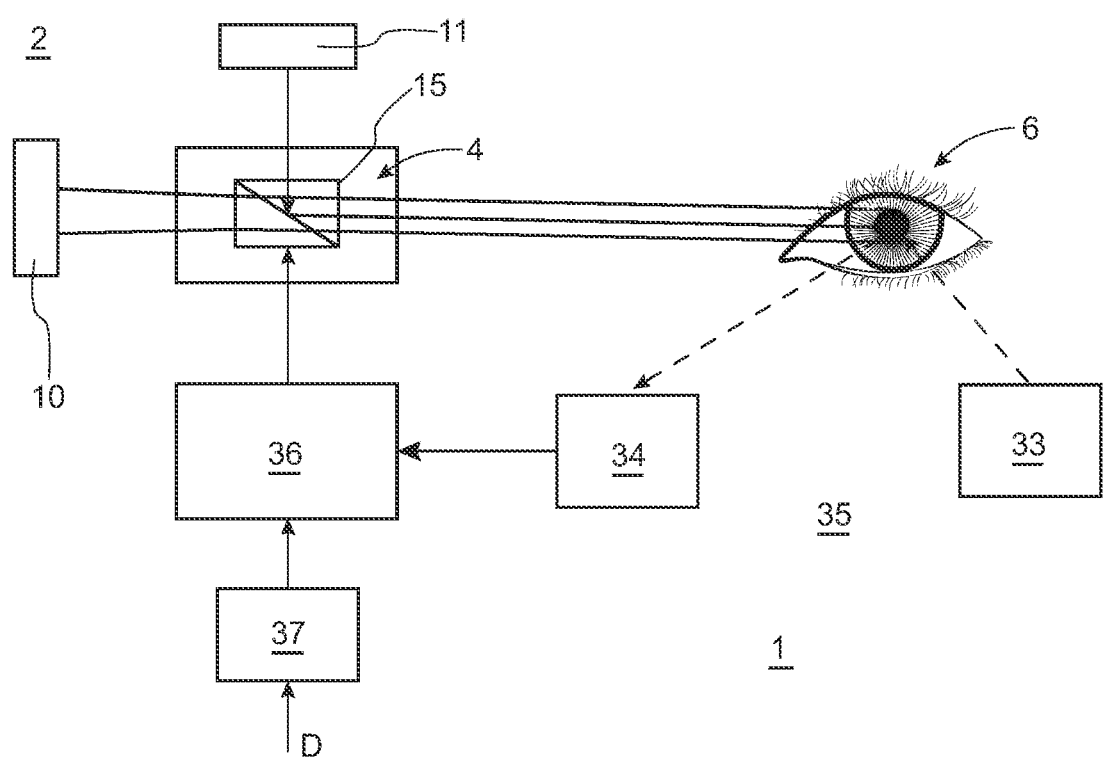
FIG. 41 shows an embodiment of a dynamic eye movement detection device and a control device for the adjustment optics of a light field display according to the proposed concept.

FIG. 41 shows a further embodiment of the proposed light field display 1 with a measuring device 34 to determine the position of the fovea centralis. For this purpose, a user eye 6 is illuminated by means of an IR illuminator 33 and an image of the retina 19 is taken. In the example shown, the second halftone image 9 (cf. FIG. 35) is dynamically adjusted so that the measuring device 34 is part of an eye movement detection device 35 with which the direction of vision of the user can be followed. By means of a control device 36 connected to the eye movement detection device 35, the adjusting optic 15 is controlled in such a way that the second halftone image 9 of the second imaging unit 10 is held in the area of the fovea centralis, while the first halftone image 8 of the first imaging unit 11 remains stationary in relation to the optoelectronic device 2. In addition, the control device 36 is connected to a prediction device 37 in which a model of eye movement fed by the displayed image data D is calculated.

In addition to the concepts presented here for the production and structuring of μ-LEDs and μ-Displays or modules, a special concept of such a module is introduced in the form of a imaging element with a variable pixel density.

The inventors take advantage of the fact that the human eye does not see equally well everywhere in its full range of vision, both in terms of color perception and spatial resolution. Thus, an imaging element only needs to have as good a resolution as is required for the respective areas in the eye.

Figure 42:
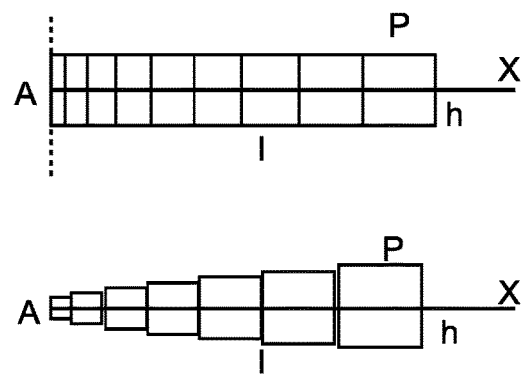
FIG. 42 shows several examples of a one-dimensional pixel array according to some aspects of another concept.

FIG. 42 shows examples of a linear pixel array comprising a single row of a plurality of μ-LEDs arranged side by side, or a monolithic LED array in which pixels in the μm range can be individually controlled. The row comprises a starting point A, to which the individual pixels P of the row are connected along the axis X. These pixels are optoelectronic components, which are set as μ-LEDs along the row or as monolithic integrated components, possibly also in segments. Each pixel has a fixed height h, but variable width 1 and comprises at least one light-emitting element, for example a μ-LED. The pixels are arranged centrally around the axis X, and the pixels with the smallest width are closest to the starting point A. In the embodiment shown, the pixels widen with a fixed predetermined function, for example a linear function. The number of pixels in the row corresponds to the resolution of the display to be shown. In other designs, the widening in width 1 can follow the course of the sensitivity of the rods and cones of the eye. Thus, some adjacent pixels have the same width, others have a different width. Another possibility is a group widening, i.e. a number of pixels along the axis comprise the same width or dimension, a second group adjacent to it has a larger width. The latter way can be implemented as a monolithic component in groups or segments.

In the second example, the pixels increase both in width 1 and height h with increasing distance from the starting point. The change is chosen in such a way that a suitable rotation through an optical system results in a visual impression in which the pixels are each located on points of circles without any gaps between them. The number of pixels in the row can be in the range of several hundred pixels, but it can be less than an HD resolution of 1980 pixel points per row.

In an example, about 150 pixels with the smallest width are arranged in one row from the starting point. The width can be 5 μm, for example. Then follows another group of 150 pixels with a pixel size of 10 μm. Two further groups with pixel sizes of 20 μm and 30 μm and a number of 100 pixels or 50 pixels follow. This results in a total length of the row of about 5750 μm. However, with approximately the same effective visual resolution for the eye, the number of pixels is significantly reduced to 500, which leads to a simpler and more cost-effective production.

In this context, it should be emphasized that the width between adjacent pixels is not always different, but can also be the same. In some cases, a pixel can also have a smaller dimension than an adjacent pixel closer to the starting point. However, the expression "width substantially increasing from the starting point" means that the width of the pixels increases with distance over a larger number of pixels. The width, and possibly also the height, therefore generally increases for pixels with a greater distance from the starting point, even though isolated pixels with neighboring pixels may comprise the same dimension. Thus, the above-mentioned execution of a segmental widening also falls under the above-mentioned expression.

Using imaging optics, an image can now be generated by rotating the pixel array around the starting point. For this purpose, the pixel array itself is not rotated, but the light stripes generated by the pixel array are shifted in fixed periods with an imaging optics, so that the impression of a rotation around the starting point is created. If this offset occurs, fast enough, the inertia of the visual processing results in the impression of an image. The number of individual steps may or may not depend on the height of the individual pixels. Depending on the image, the period can also be selected in such a way that a certain overlapping area results, especially in the high resolution area of the eye.

Figure 43:
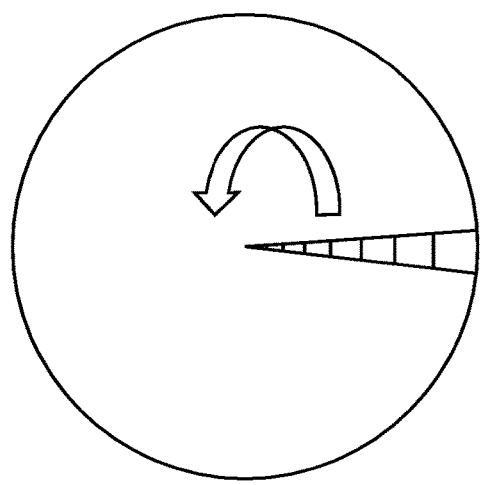
FIG. 43 is an example to illustrate the rotation of the pixel row according to some aspects of the proposed concept.

FIG. 43 shows a schematic representation of such a rotation. In contrast to the pixel row in FIG. 42, the height of each pixel is also varied here and the height of the pixels increases with increasing distance from the starting point. This can be done in two ways. First, the height of the pixels can actually be changed. Another way is to place an aperture above the pixel row so that the aperture widens. Thus, each pixel resembles a trapezium rather than a square or rectangle. Thus, when the pixel row is rotated around the starting point, the step size for each pixel remains essentially constant and the "rotated" pixels lie "next to each other". The height of a pixel can be approximately determined by $H_{pixel} >= 2\,d/n\pi$ (where d is the distance from the starting point to the pixel and n is the number of steps for a 360° rotation. If the height of the pixels is selected to be larger, there will be an overlap between pixels during the rotation.

Figure 44:
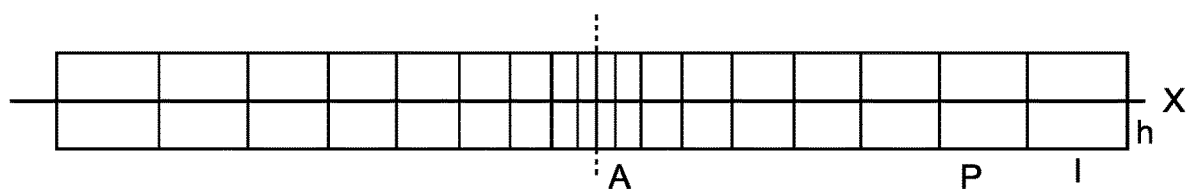
FIG. 44 shows another embodiment of a pixel array to illustrate a new light generation and guidance concept.

FIG. 44 shows another embodiment in which the pixel array is symmetrically arranged along the X-axis around a center point that represents the starting point A. The advantage of this arrangement is that the imaging optics need only rotate the array by 180° to produce a complete image.

Figure 45:
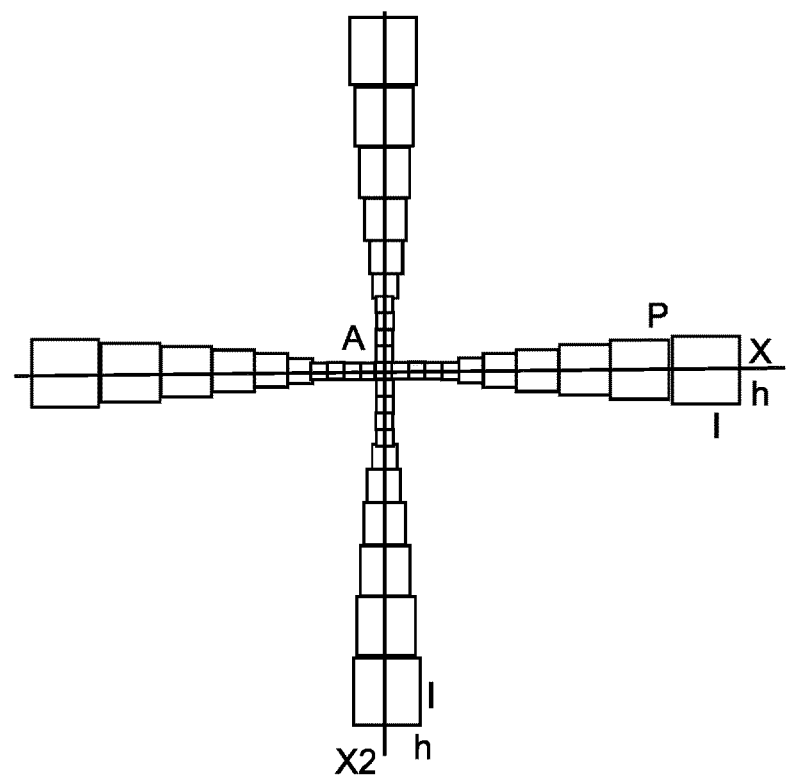
FIG. 45 illustrates an embodiment of a pixel matrix with two pixel arrays according to the proposed principle.

FIG. 45 shows an embodiment of a pixel matrix with two pixel arrays arranged perpendicular to each other. The two pixel arrays have a common center point around which the pixel density is greatest, i.e. the pixels have the smallest size. During operation, the two pixel arrays generate a light cross along the axes X and X2, which can be rotated by a downstream optical system to generate a complete image. The arrangement with two, or in alternative embodiments also several pixel arrays, allows a simpler design of the optics. In the example shown here, the optics is configured to rotate the generated light cross by only 90°, so the pixel array is rotationally symmetrical by 90°.

Figure 46:
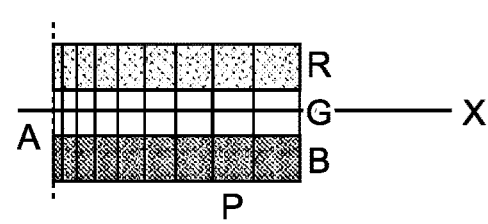
FIG. 46 shows a third embodiment of a pixel array with several rows of different colors to illustrate a new light generation and guidance concept.

FIG. 46 shows another aspect concerning the color perception of the eye. In the embodiment shown, several rows are arranged one above the other with subpixels of different colors. A column of subpixels of the colors thus forms one pixel. The subpixels of each pixel of each row are, for example, formed in the different basic colors R(ed), G(reen) and B(lue). The rows of the different colors are arranged in a row "one above the other" along the axis. For example, the middle green row G is located centrally on the X-axis of the row, a red row R and a blue row B are adjacent to the first row with the green subpixels G on both sides of the axis. In the example, the arrangement and especially the pixel density is the same for each row.

Figure 47:
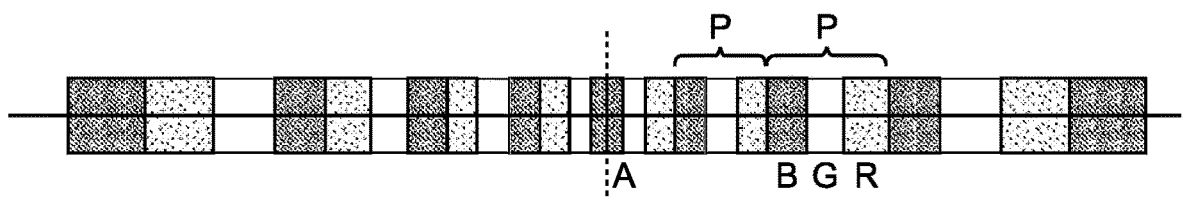
FIG. 47 shows another embodiment of a pixel array with rows for the different colors according to the proposed principle.

FIG. 47 shows an alternative embodiment in which pixels P and their subpixels of different colors are arranged in a single row. The pixel row is arranged symmetrically around the starting point A. In the example, the subpixels of each pixel P have different colors but the same width. The width between the pixels increases continuously. The pixels in the row that are further out, that is, those that are further away from point A, also have a greater width. Alternatively, it can also be taken into account that the rods and cones in the eye also have different relative color sensitivity at the same angle from the center of vision. In order to compensate for this, the subpixels of different colors are also designed with different widths, i.e. with different dimensions. If the current through the pixels remains constant, there is a different brightness of the color, so that the user has the impression of equally bright colors at the respective location.

Figure 48A:
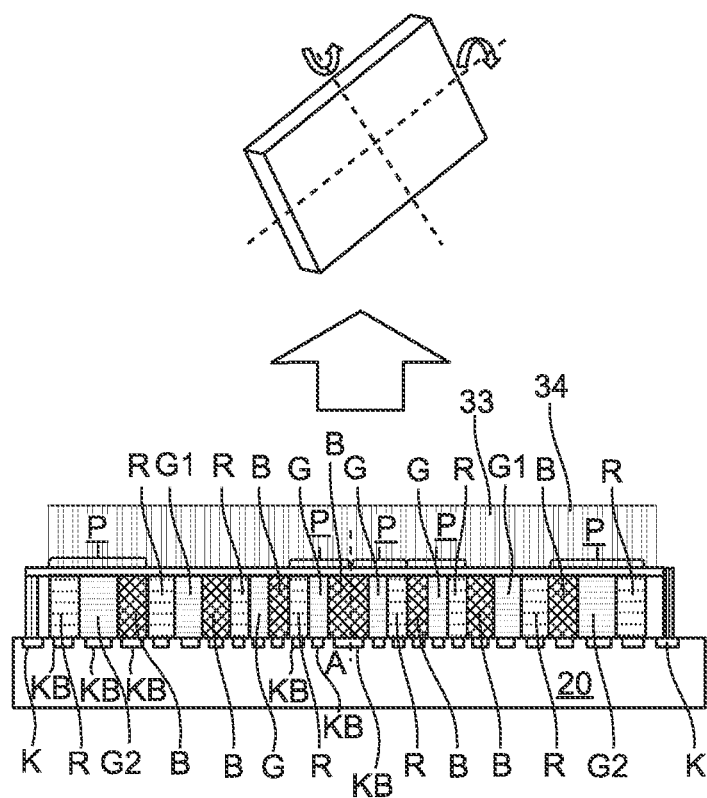
FIGS. 48A and 48B show a cross-section of the pixel row of FIG. 47 with a photonic structure on a substrate and a top view of it.

FIG. 48A shows a further embodiment in cross-sectional representation of a pixel row according to the proposed principle. The mirror device arranged above the pixel row can be rotated in 2 axes and can thus generate a circular image with different resolution for the user, as already presented in this application. The pixel row itself is arranged on a carrier substrate 20, which comprises different contact areas KB and K. In addition to the contact areas KB and K, the substrate 20 also includes drive electronics, driver circuits, and power supply for the electrical supply of the pixel array and the individual µ-LEDs. The contact areas KB are designed differently depending on the size of the pixel of the pixel row arranged above. This simplifies positioning and contacting of the respective µ-LEDs of a pixel P of the pixel row. In this embodiment, a pixel P is made up of 3 subpixels R, G and B each with one µ-LED each. A central subpixel with one of the colors blue B is arranged rotationally symmetrically around the axis A. It has twice the size of the adjacent green and red subpixels G and R.

As shown, the pixels P and the corresponding subpixels R, G and B and the µ-LEDs show an increasing size with increasing distance from the rotation axis A. For example, the µ-LEDs of the subpixels B, G2 and R of the outer pixels P are significantly larger than the µ-LEDs of the pixels adjacent around the central axis A. In addition, the µ-LEDs of the green subpixels G1 and G2 have larger dimensions compared to the other µ-LEDs of the same pixel as the distance from the rotation axis A increases. This is useful because the eye reacts more sensitively to the green color and thus the green color also dominates in peripheral vision.

The shown µ-LEDs are configured as vertical µ-LEDs. For this purpose, they have a common connection contact on the side facing away from the substrate 20, which is electrically connected to the contacts K on the outside. A light-shaping structure in the form of a photonic crystal with the areas 33 and 34 is applied to the upper side of this transparent cover electrode. The areas 33 and 34 produce a variation of the refractive index and thus cause a collimation of the light emitted by the µ-LEDs.

Figure 48B:
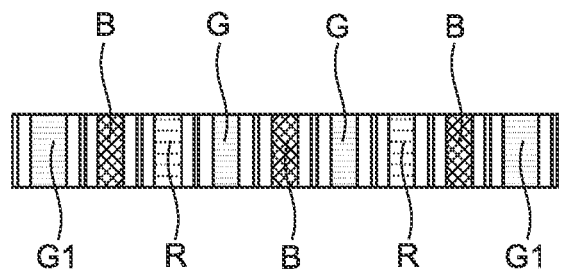

The pixel row proposed according to this concept can be realized with µ-LEDs of different shapes and designs. FIG. 48B shows an embodiment in which the individual subpixels of each pixel are implemented in the form of so-called bars using µ-LEDs. A converter material is arranged between a pair of µ-LEDs. At a greater distance from the central subpixel with the color blue B, the µ-LEDs emitting a green color are designed larger. This aspect considers the already mentioned increased sensitivity of the human eye in the green range.

Figure 48C:
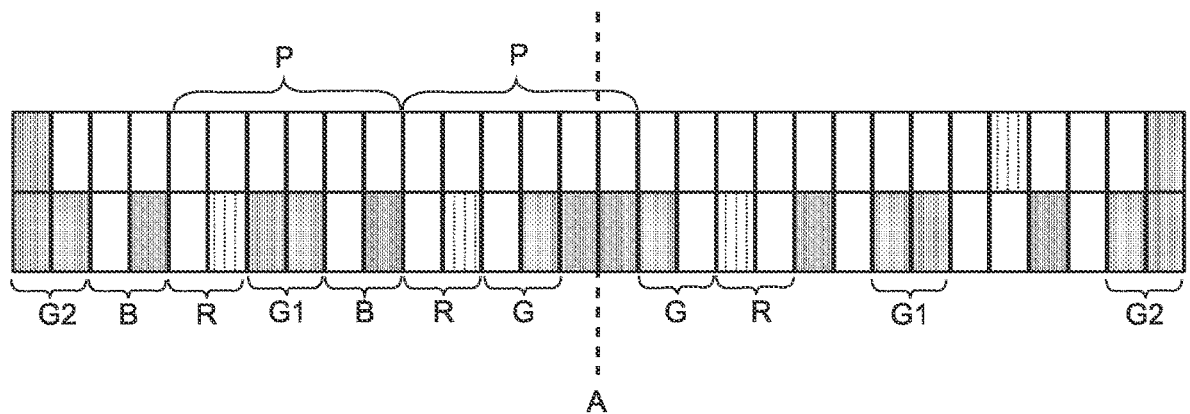
FIGS. 48C and 48D show another embodiment of a pixel row, which is configured with redundant µ-LEDs.

FIG. 48C shows a different embodiment. For each individual subpixel of a color, a matrix of 2×2 µ-LEDs is provided, which are electrically separated from each other but optically connected. Thus, 2 essential aspects can be realized. On the one hand, this design allows defective µ-LEDs to be sorted out and replaced by working µ-LEDs. This is shown for example in the right area in the bottom row with a red subpixel, which is marked as defective as shown. The marked defective red µ-LED is replaced by another µ-LED in the red subpixel. Additionally further outside, a different intensity and radiation characteristic can be achieved by switching on additional µ-LEDs in the respective subpixel. This is indicated by the µ-LEDs of the green subpixel G1 and G2.

Figure 48D:
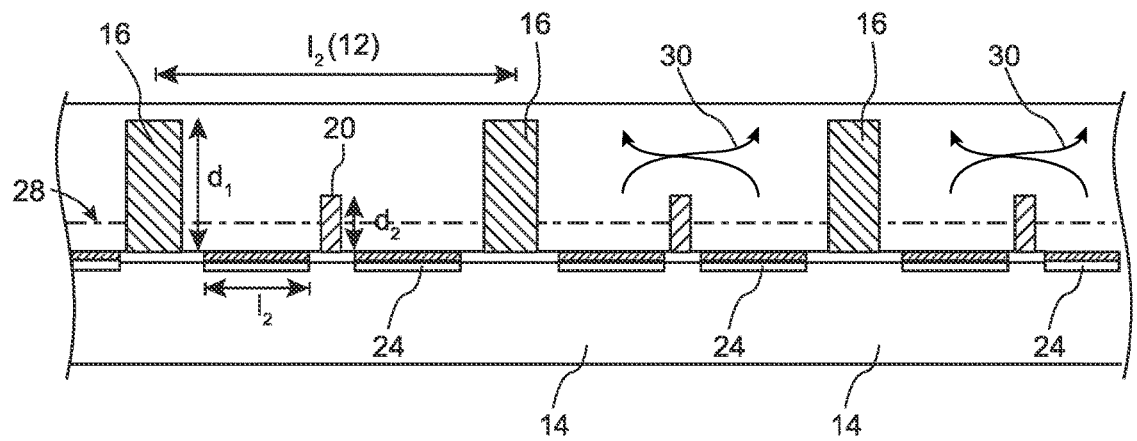

The structure shown in FIG. 48C comprises 4 µ-LEDs for each subpixel, some of which may be designed as redundant µ-LEDs. In a different configuration, the matrix can also be a 2×1 matrix, with only a single row of 2 µ-LEDs per pixel. The decreasing resolution capabilities of the eye outside of an area of the fovea can be taken into account by enlarging the µ-LEDs. FIG. 48D shows the cross-sectional representation through the pixel structure of FIG. 48 shown in top view. The embodiments of these µ-LEDs with optical and electrical separating elements 16 as well as electrical separating elements 20 is already explained in this application in the embodiment of FIG. 133.

Figure 49A:
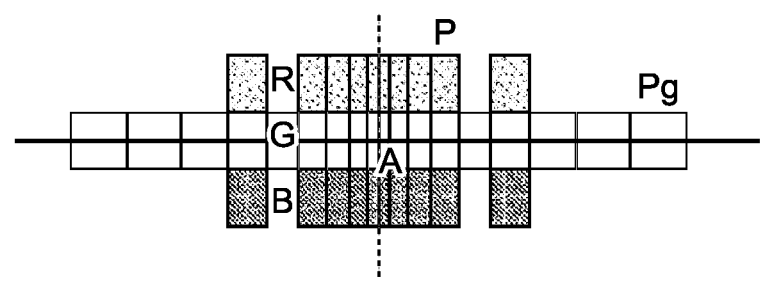
FIGS. 49A and 49B show examples of embodiments of a pixel array with several subpixels of different size and frequency according to the proposed principle.
Figure 49B:
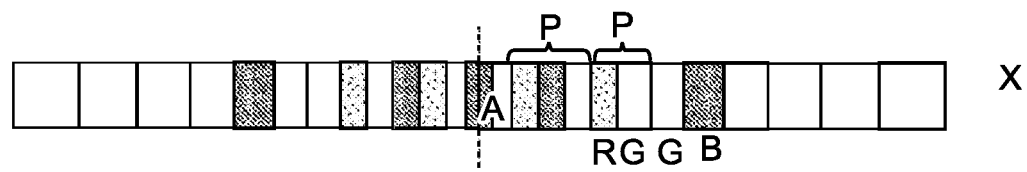

Finally, the two embodiments in FIGS. 49A and 49B take into account that the sensitivity of the eye to recognize colors also depends on the angle of vision and the distance to the center of the fovea, respectively. The dependence of sensitivity is expressed by the fact that further outside, i.e. at a greater distance from the center, the eye no longer comprises as many cones that react to the colors red and blue. Here the rods for the color green predominate. Correspondingly, a variable, i.e. different density is proposed for the respective pixels or subpixels of green color. While near the starting point A the subpixels of different color are distributed essentially equally in the three rows, the row with the pixels for the color green predominates with increasing distance.

In FIG. 49A, the greater number of pixels of green is achieved by placing the first row of green subpixels centrally along the X-axis, with essentially all pixel positions occupied. The other two rows R, B with the red and blue pixels are placed above and below the first row. Near the central starting point A, the pixel positions in all three rows are occupied. With increasing distance, however, not all positions in the second row R and the third row B are occupied, i.e. some positions for the red and blue pixels remain unoccupied. The occupancy density of the second and third rows decreases compared to the first row. This result in a lower number of red and blue pixels compared to the green pixels. In other words, the second and third rows are thus "shorter" than the first row.

In the alternative embodiment of FIG. 49B, the pixels of different colors are arranged along the X-axis similar to the embodiment of FIG. 47. Close to the starting point, the pixels of rows R, G and B are equally distributed. As the distance increases, the density of pixels in rows R and B decreases, so that the pixels of the color green predominate in row G. At greater distances from the starting point A, the pixel row G with the green basic color then predominates.

It should be explicitly mentioned at this point that the different aspects and examples can also be combined with each other to create a desired arrangement that makes sense for the respective application. This also, but not only, concerns the combination of rows and pixels in the respective rows, i.e. combinations that relate to spatial resolution and color sensitivity.

Figure 50:
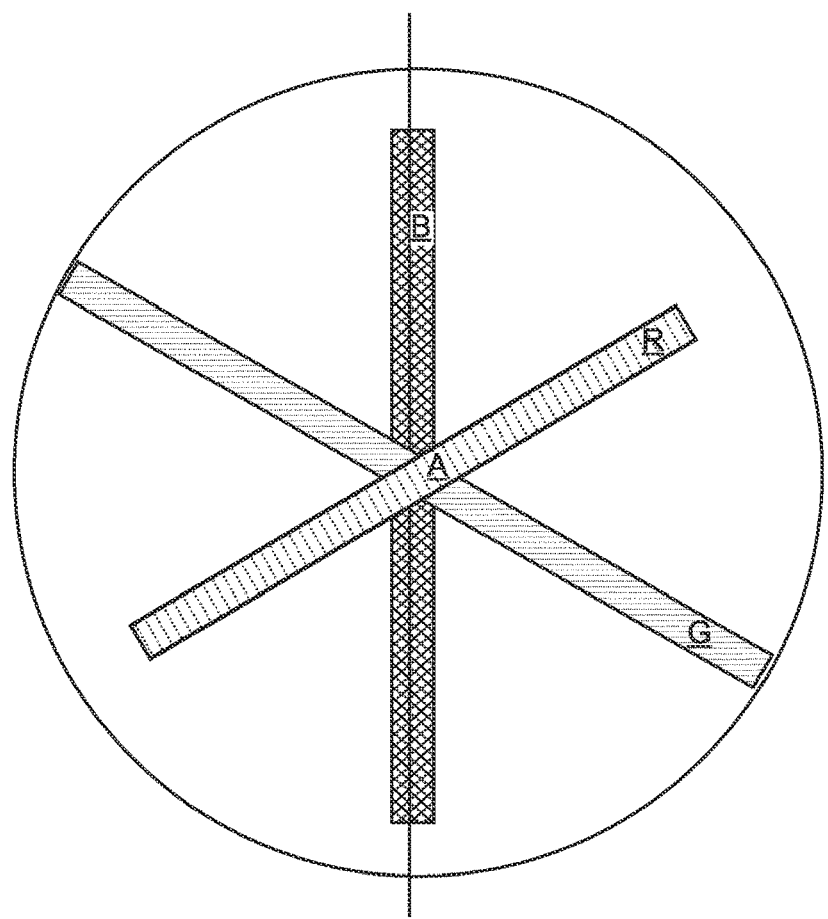
FIG. 50 shows another embodiment of a pixel matrix in which three rows of pixels of different colors are offset from each other.

FIG. 50 shows another embodiment of a pixel matrix in which three rows R, G, and B are offset from each other with pixels of different colors. The three rows have a common center A, and the angle between individual adjacent rows is 60°. Each row R, G, and B has pixels of the same color. In addition, the widths of the individual pixels of each row are different (not shown here) to account for the different sensitivity. The staggered arrangement makes the realization easier, because the µ-LEDs of each row can be manufactured independently from the µ-LEDs of other rows. By rotating the resulting image by means of an optical system by 180°, an approximately circular colored image is generated. In addition to this arrangement, the rows have different "lengths". Furthermore, the pixel density of the individual rows of different color is also different. The row with the green color has the highest pixel density, because the eye reacts most sensitive to this. In the outer area, the pixel width of the rows R and B is increased, i.e. the spatial resolution is reduced there. In addition, rows R and B are somewhat shorter because the color sensitivity of the eye is reduced so much near the maximum distance that red and blue colors are no longer perceived.

Figure 51:
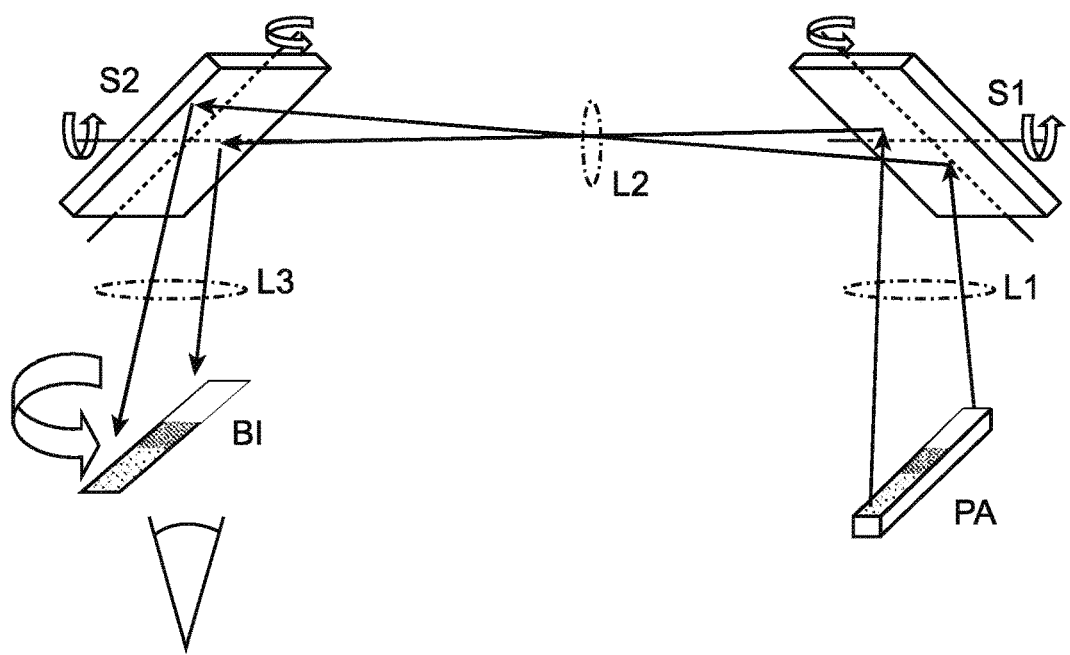
FIG. 51 is an embodiment of an optical system for generating an image according to some aspects of the proposed concept of a one-dimensional pixel array.

FIG. 51 schematically shows an implementation of an imaging optic to convert an imaging element with a variable pixel density into a virtual image. The imaging element is a single pixel row with different subpixels that are designed to deliver a color. In addition to this pixel row, other imaging elements disclosed here can also be provided. The virtual image is created by a fast rotation of the light emitted by the pixel array with several pixels in the user's eye. In particular, the pixel array generates a strip of light that corresponds to an image row in polar coordinates. The light is bundled by a first lens L1 and directed to a first mirror S1. The first mirror S1 can be tilted around two axes that are perpendicular to each other, so it can deflect the light strip around these two axes.

The light deflected by the first mirror is directed via another lens L2 to a second mirror S2. This second mirror can also be tilted around two axes arranged perpendicular to each other. This functionality is exemplified in the figure by the two arrows. A third lens L3 focuses the generated light strip onto the user's eye. The light strip is now rotated by a slight periodic tilting of the mirrors S1 and S2. The tilting can be realized with MEMS or piezoelectric elements. With each rotation, the image and color information desired at the new position is also radiated from the PA pixel array. Due to the inertia of the eye, a sufficiently fast rotation creates the impression of a circular image. The point of rotation in image Bi, for example, is placed in the focal point or direction of vision of the eye. A change in the direction of view can be detected by eye-tracking measures. The mirrors S1 and S2 can then follow the rotation point and deflect the image so that the rotation point is again in the focus of the eye.

Each of the three lenses can be optional. Likewise, measures other than lenses or mirrors, or other combinations of such optics, may be provided to produce the desired effect.

In the following, various devices and arrangements as well as methods for manufacturing, processing and operating as items are again listed as an example. The following items present different aspects and implementations of the proposed principles and concepts, which can be combined in various ways. Such combinations are not limited to those listed below:

684. Optical fibre device, comprising:
a light-emitting device comprising at least two light-emitting elements, in particular µ-LEDs, which emit light of two different colors;
an elongated first light guide to guide light of a first color and having an output part;
an elongated second light guide to guide light of a second color and having an output portion;
a first coupling element disposed adjacent to the first light guide and configured to reflect the light of the first color into the elongated first light guide;
a second coupling element disposed adjacent to the second light guide and configured to reflect the light of the second color into the elongated second light guide.

685. Light guide device according to item 684, further comprising:
a third launching member mounted opposite the second launching member and adjacent the elongated second light guide, the third launching member being configured to reflect light of a third color into the elongated second light guide.

686. Light guide device according to any of items 684 to 685, wherein the first coupling element is transparent to light of a color different from the first color.

687. Light guide device according to object 685, the second coupling element being transparent to light of the third color.

688. Light guide device according to any of the preceding items, wherein the light of different colors has an angle of incidence between 45° and 90° with respect to the surface of the respective light guide 689. Light guide device according to any of the preceding items, where light of the third color has a wavelength greater than the light of the second color 690. Light guide device according to any of the preceding items, wherein at least one of the first and second coupling elements is arranged on a sidewall of the respective elongated light guide.

691. Light guide device according to any of the preceding items, wherein the first and second elongated light guides are substantially parallel to each other.

692. Light guide device according to any of the preceding items, further comprising spacer elements for spacing the first and second elongated light guides apart.

693. Light guide device according to any of the preceding items, further comprising
a first decoupling element arranged on the output part of the elongated first light guide for decoupling light of the first color;
a second out-coupling element arranged on the output part of the elongated second light guide to couple out light of the second color.

694. Light guide device according to item 693, further comprising:
a third out-coupling element arranged on the elongated second light guide opposite the second out-coupling element to couple out light of the third color.

695. Light guide device according to one of the objects 693 to 694, wherein the first decoupling element is transparent to light of the second and/or the third color.

696. Light guide device according to any of items 693 to 695, wherein the second output coupler is transparent to light of the third color or the third output coupler is transparent to light of the second color.

697. Lighting device comprising a light-emitting optoelectronic element and an optical device for beam conversion of the electromagnetic radiation generated by the light-emitting optoelectronic element
wherein said light-emitting optoelectronic element comprises a plurality of emission regions arranged in a matrix form; and wherein each emission region is assigned a main beam direction; and
at least part of the emission zones are arranged in such a way that the centers of the emission regions lie on a curved surface.

698. Lighting arrangement according to item 697, characterized in that the curved surface has a concave curvature.

699. Lighting arrangement according to any of the preceding items, characterized in that the main directions of radiation of the emission regions are at an angle to each other.

700. lighting arrangement according to any of the preceding items, characterized in that there are emission regions with a coinciding main beam direction, which are arranged on different planes at a different distance in the main beam direction from the optical device.

701. lighting arrangement according to any of the preceding items, characterized in that the curved surface forms a spherical segment, the associated spherical center lying on the optical axis of the optical device,
or in that the curved surface has the shape of at least a portion of a rotated conical section, in particular an ellipsoid, paraboloid or hyperboloid.

702. Lighting arrangement according to any of the preceding items, characterized in that the emission regions whose centers are located on the curved surface, each form Lambert radiators.

703. Lighting arrangement according to any of the preceding items, characterized in that at least one of the emission regions is the aperture of a primary optical element associated with a µ-LED or of a converter element associated with a µ-LED.

704. Lighting arrangement according to any of the preceding items, characterized in that the emission regions whose centers lie on a curved surface are part of a monolithic pixelated optochip.

705. Lighting arrangement according to item 704, in which the monolithic pixelated optochip has a plurality of µ-LEDs arranged in rows and columns.

706. Lighting arrangement according to any of the preceding items, in which the emission regions constitute the surface of a coupling-out structure, and which comprises a photonic crystal or photonic structure for beam-shaping.

707. Lighting arrangement according to any of the preceding items characterized in that the emission regions, whose centers lie on a curved surface, are assigned to separate µ-LEDs arranged on a non-planar IC substrate.

708. Lighting arrangement according to any of the preceding items, characterized in that the optical device comprises a system optic and between the system optic and the emission areas there is a curved collimating optical element or several non-planarly arranged collimating optical elements.

709. Lighting arrangement according to any of the preceding items, characterized in that the optical device comprises a system optic, which forms an imaging projection optic.

710. Lighting arrangement according to any of the preceding items, in which the light-emitting optoelectronic element has a layer comprising a plurality of drive elements, in particular current sources for individual drive of each of the emission areas.

711. Method of producing an illumination assembly comprising a light-emitting optoelectronic element and an optical device for beam conversion of the electromagnetic radiation generated by the light-emitting optoelectronic element; wherein
the optoelectronic element comprises a plurality of emission regions arranged in matrix form;
characterised in that
at least part of the emission regions are arranged in such a way that the centers of the emission regions lie on a curved surface.

712. Method according to item 711, characterized in that separate µ-LEDs are arranged on a non-planar IC substrate to create the emission regions.

713. Method according to any of the preceding items, characterized in that at least one of the emission regions is formed by the aperture of a primary optic associated with a µ-LED or a converter element associated with a µ-LED.

714. Light guide arrangement comprising a µ-display and a projection optics, wherein the µ-display comprises a matrix with pixels for emission of visible light and wherein each pixel comprises several µ-LEDs with spectrally different light emission; and wherein each pixel is assigned a separate collimation optics preceding the projection optics,
characterised in that
the collimation optics are configured in such a way that enlarged and overlapping intermediate images of the µ-LEDs of the respective pixel are generated in the beam path in front of the projection optics.

715. Light guide arrangement according to item 714, characterized in that the intermediate images of the µ-LEDs of the respective pixel generated by the collimation optics overlap each other over at least 70%, 80% or 90% of their intermediate image area.

716. Light guide arrangement according to item 714 or 715, characterized in that the intermediate images µ-LEDs are virtual intermediate images.

717. Light guide arrangement according to any of the preceding items, characterized in that the collimation optics is arranged between the µ-LEDs of a pixel and the projection optics.

718. Light guide arrangement according to any of the preceding items, characterized in that the µ-LEDs of a pixel occupy not more than 30%, particularly preferably not more than 15% and most particularly preferably not more than 10% of the pixel area.

719. Light guide arrangement according to any of the preceding items, characterized in that the µ-LEDs are configured as color converted µ-LEDs or as VCSELs or as edge-emitting laser diodes and optionally have illuminated optical waveguide end pieces.

720. Light guide arrangement according to any of the preceding items, characterized in that the collimation optics are designed such that the total area of the overlapping intermediate images of the µ-LEDs of the respective pixel corresponds to at least 70%, 80% or 90% of the pixel area.

721. Light guide arrangement according to any of the preceding items,
characterized in that the collimation optics comprise a holographic optical element (HOE) and/or refractive optical element (ROE) and/or a diffractive optical element (DOE).

722. Light guide arrangement according to any of the preceding items,
characterised in that the radiation emitted by the projection optics is directed directly or indirectly onto a display.

723. Light guide array according to any of the preceding items, in which each pixel comprises a µ-LED array according to any of the preceding items.

724. Light guide arrangement according to any of the preceding items, in which each pixel comprises a µ-LED following one of the preceding objects.

725. Light guide arrangement according to any of the preceding items, in which the µ-LEDs of a pixel are each formed by a horizontally arranged microrod according to any of the preceding items.

726. Light guide arrangement according to any of the preceding items, in which the µ-LEDs of a pixel are each formed by at least one antenna slit structure according to any of the preceding items.

727. Light guide arrangement according to any of the preceding items, in which the µ-LEDs of a pixel are each formed by a pair of emitting elements with a converter material arranged therebetween according to any of the preceding items.

728. Light guide arrangement according to any of the preceding items, in which the µ-LEDs of a pixel each comprise quantum well intermixing in an edge region of an active layer of the µ-LED.

729. Light guide arrangement according to any of the preceding items, in which the matrix comprises a light-shaping structure, in particular a photonic crystal, which is in particular arranged at least partially in a semiconductor material of the µ-LEDs of the pixels.

730. Light guide arrangement according to any of the preceding items, further comprising a drive unit arranged in a substrate, in particular with current drivers or current sources according to any of the following items, wherein the µ-display is arranged on the substrate and the pixels are electrically connected to the current drivers or current sources.

731. Light guide arrangement according to any of the preceding items, in which a plurality of pixels of the matrix each have a microlens arranged above the µ-LEDs.

732. Light guide arrangement according to any of the preceding items, in which a plurality of pixels of the matrix has a reflection structure limiting the pixels, in particular with features according to any of the preceding items, which surrounds the µ-LED of the pixel.

733. Light guide arrangement according to any of the preceding items, in which at least some of the pixels of the matrix have a redundant µ-LED.

734. Light guide arrangement according to any of the preceding items, in which the matrix comprises a plurality of µ-LED base modules or a µ-display.

735. Light guide array according to any of the preceding items according to any of the preceding items, in which the pixels of the array comprise an optoelectronic device or a µ-LED array.

736. Use of a projection unit according to any of the preceding items to produce an image in an augmented reality display unit, a virtual reality display unit and/or on a head-up display.

737. Light guide arrangement comprising:
at least one optoelectronic imaging device, in particular a µ-display for generating at least a first image and a second image, and
at least one imaging optic adapted to project a first image of the first image at a first resolution onto a first region of a retina of a user and to project a second image of the second image at a second resolution onto another, second region of the retina, the first resolution being different from the second resolution.

738. Light guide arrangement according to item 737, characterized in that
the first region is closer to the center of the retina than the second region and that
the first resolution is higher than the second resolution 739. Light guide arrangement according to any of the preceding items, characterized in that
the imaging optics comprises beam steering means which directs light rays of the first image onto the first region and light rays of the second image onto the second region.

740. Light guide arrangement according to any of the preceding items, characterized in that
the imaging optics comprise at least one beam-shaping device which focuses the light beams of the first image more strongly than the light beams of the second image.

741. Light guide arrangement according to item 740, characterised in that
the beam-shaping device comprises at least a first beam-shaping element and a second beam-shaping element, the first beam-shaping element focusing the light beams of the first image and the second beam-shaping element focusing the light beams of the second image.

742. Light guide arrangement according to any of the preceding items, characterized in that
the beam steering device for steering the beam has at least one movable and/or fixed mirror.

743. Light guide arrangement according to any of the preceding items, characterized in that
the beam steering device for steering the beam comprises at least one and preferably at least two glass fibres.

744. Light guide arrangement according to any of the preceding items, characterized in that
the first and the second image are temporarily displayed one after the other, especially on the same imager.

745. Light guide arrangement according to any of the preceding items, characterized in that
the first and second images are displayed at least substantially simultaneously, in particular on at least two different display devices.

746. Light guide arrangement according to any of the preceding items, characterized in that
said at least one optoelectronic imager is formed by a µ-display with a plurality of µ-LED arrays, in particular according to any of the preceding items or a monolithic pixelated array.

747. Light guide arrangement according to any of the preceding items, characterized in that
the second region concentrically encloses the first region.

748. Light guide arrangement according to any of the preceding items, in which the at least one optoelectronic imager comprises at least one matrix of pixels formed by a µ-LED arrangement according to any of the preceding items.

749. Light guide device according to any of the preceding items, in which the at least one optoelectronic imager comprises a matrix of pixels formed by one or more μ-LED according to any of the preceding items.

750. Light guide arrangement according to any of the preceding items, wherein the μ-LEDs of a pixel are each formed by a horizontally arranged microrod according to any of the preceding items, or wherein the μ-LEDs of a pixel are each formed by at least one antenna slot structure according to any of the preceding items.

751. Light guide arrangement according to any of the preceding items, in which the μ-LEDs of a pixel are each formed by a pair of emitting elements with a converter material arranged therebetween according to any of the preceding items.

752. Light guide arrangement according to any of the preceding items, in which the μ-LEDs of a pixel each have a quantum well intermixing in an edge region of an active layer of the μ-LED, in particular quantum well intermixing.

753. Light guide arrangement according to any of the preceding items, further comprising a drive circuit according to any of the subsequent items, which is implemented in a substrate from which the μ-display is arranged.

754. Light guide arrangement according to any of the preceding items, in which the μ-display of the at least one optical imager comprises a matrix with a light-shaping structure, in particular a photonic crystal.

755. Light guide arrangement according to item 754, in which the light-shaping structure is at least partially arranged in a semiconductor material of the μ-LEDs of the pixels of the at least one optical imager.

756. Light guide arrangement according to any of the preceding items, in which the plurality of pixels of the at least one optical imager each have a microlens arranged above the μ-LEDs of each pixel.

757. Light guide arrangement according to any of the preceding items, in which the plurality of pixels of the at least one optical imager has a reflection structure delimiting the pixels, in particular with features according to any of the preceding items, which surrounds the μ-LED of each pixel.

758. Light guide arrangement according to any of the preceding items, in which a first and a second optical imaging device, each comprising a μ-display, formed with μ-LED arrays, optoelectronic devices or μ-LEDs according to any of the preceding items.

759. Light guide arrangement according to any of the preceding items, in which at least some pixels of the matrix have a redundant μ-LED.

760. Light guide arrangement according to any of the preceding items, wherein the matrix comprises a plurality of μ-LED base modules or a μ-display.

761. Light guide arrangement according to any of the preceding items, in which the pixels of the array comprise an optoelectronic device or a μ-LED array.

762. Use of a light guide arrangement according to any of the preceding items to produce an image in an augmented reality display unit, a virtual reality display unit and/or on a head-up display.

763. Light guide arrangement comprising:
at least three μ-displays, each comprising a matrix of pixels arranged in rows and columns, each with at least one μ-LED, configured to emit a light of a main wavelength
a projection unit, which is arranged in a beam path of each μ-display and is designed to project images generated by the μ-displays in overlapping manner onto an image plane, the image plane being in particular a retina of an observer.

764. Light guide arrangement according to item 763, characterized in that the projection unit comprises a lens or a mirror mounted in at least one axis for each μ-display.

765. Light guide arrangement according to any of the preceding items, in which at least one glass fibre are used to direct the light of the displays onto the projection unit.

766. Light guide arrangement according to any of the preceding items, further comprising a collimation optics, which is configured to generate enlarged and overlapping intermediate images of the μ-LEDs of the respective pixel in the beam path in front of the projection optics.

767. Light guide arrangement according to any of the preceding items, wherein the matrix comprises a plurality of μ-LED base modules or a μ-display.

768. Light guide array according to any of the preceding items, in which the pixels of the array comprise an optoelectronic device or a μ-LED array.

769. Light guide arrangement according to any of the preceding items, in which the μ-LEDs of a pixel are each formed by a horizontally arranged microrod or by at least one antenna slot structure or by a pair of emitting elements with a converter material arranged therebetween according to any of the preceding items.

770. Light guide arrangement according to any of the preceding items, further comprising a light-shaping structure on the pixels of each μ-display, wherein the light-shaping structure is a microlens or a photonic structure.

771. Light guide arrangement according to any of the preceding items, in which the μ-LEDs of a pixel comprise a reflective lateral surface.

772. Light guide arrangement according to any of the preceding items, in which a drive circuit is provided in a substrate, which comprises at least one current driver circuit or a supply circuit, in particular according to any of the subsequent items for supplying at least one pixel, the μ-display being arranged on the substrate.

773. Light guide arrangement with
a dichroic cube;
three μ-displays with a matrix of pixels arranged in rows and columns, one μ-display of which is arranged substantially parallel to one side of the dichroic cube;
a light-emitting surface on the dichroic cube.

774. Light guide arrangement according to item 773, in which the μ-displays with the matrix of pixels arranged in rows and columns comprise an optoelectronic device or a μ-LED arrangement.

775. Light guiding arrangement according to any of the preceding items, in which the pixels each comprise μ-LEDs formed by horizontally arranged microrods or by at least one antenna slot structure or by a pair of emitting elements with a converter material arranged therebetween according to any of the preceding items.

776. Light guide arrangement according to any of the preceding items objects, further comprising a light-shaping structure on the pixels of each μ-display, wherein the light-shaping structure is a microlens or a photonic structure.

777. Light guide arrangement according to any of the preceding items, in which the μ-LEDs of a pixel comprise a reflective side surface.

778. Light guide arrangement according to any of the preceding items, further comprising collimation optics, which are designed to produce enlarged and superimposed intermediate images of the respective μ-display in the beam path according to the dichroic cube.

779. Light guide arrangement according to any of the preceding items, in which the light-shaping structure is at least partially arranged in a semiconductor material of the μ-LEDs of the pixels of the at least one optical imager.

780. Light guide arrangement according to any of the preceding items, further comprising a drive unit arranged in a substrate, in particular with current drivers or current sources according to any of the subsequent items, wherein the μ-display is arranged on the substrate and the pixels are electrically connected to the current drivers or current sources.

781. System, comprising:
a light guide arrangement according to any of the preceding items, and
a control unit for controlling the image generator or the imaging optics of the optoelectronic device, in particular in such a way that projected images of a frame of images, in particular comprising the first and second image, on the retina produce a coherent overall image.

782. System according to item 781, in which fuse elements are electrically coupled to at least some of the μ-LEDs or pixels of the μ-displays, the at least some of the μ-LEDs or pixels forming redundant elements and the fuse elements activating the redundant elements or deactivating them when not required.

783. System according to any of the preceding items, comprising supply drivers, or control units having characteristics based on any of the subsequent items.

784. System according to any of the preceding items, in which the control unit is implemented in a substrate on which the μ-display is arranged and electrically connected to the control unit 785. Light field display comprising:
an optoelectronic device, in particular a μ-display for generating a raster image;
an optics module, for direct retinal projection of the raster image into a user's eye;
characterised in that
said optoelectronic device comprises a first imaging unit generating a first raster sub-image and a second imaging unit generating a second raster sub-image;
wherein the raster image comprises the first raster sub-image and the second raster sub-image; and
the optics module comprises an adjustment optic for the retinal projection of the second raster subimage onto the fovea centralis in the viewer's eye; and
wherein the retinal projection of the second raster sub-image has a higher resolution than that of the first raster sub-image.

786. Light field display according to item 785, characterized in that the adjusting optics is configured in such a way that the relative position of the retinal projection of the second raster partial image can be adjusted with respect to the retinal projection of the first raster sub-image.

787. Light field display according to any of the preceding items, characterized in that the retinal projection of the second raster sub-image in the user eye has a smaller spatial extension than the retinal projection of the first raster subimage.

788. Light field display according to any of the preceding items, characterized in that the adjusting optics comprises a switchable Bragg grating.

789. Light field display according to any of the preceding items, characterized in that the adjusting optics comprises an adjustable Alvarez lens arrangement.

790. Light field display according to item 789, characterized in that the adjusting optics comprises a Moire lens arrangement.

791. Light field display according to any of the preceding items, characterized in that a collimation optic is arranged in the beam path of the first imaging unit and/or the second imaging unit.

792. Light field display according to item 791, characterised in that the adjusting optics is at least partially arranged in the collimating optics.

793. Light field display according to any of the preceding items, characterized in that the adjusting optics is arranged at least partially between the collimating optics and a waveguide.

794. Light field display according to any of the preceding items, characterized in that the adjusting optics are arranged at least partially in a waveguide.

795. Light field display according to any of the preceding items, characterized in that the first imaging unit and/or the second imaging unit comprises a μ-LED array having a plurality of μ-LEDs.

796. Light field display according to any of the preceding items, characterized in that the first imaging unit and/or the second imaging unit comprises a matrix of a plurality of μ-LED base modules or a μ-display.

797. Light field display according to any of the preceding items, characterized in that the first imaging unit and/or the second imaging unit comprise a matrix of optoelectronic device arranged in rows and columns or μ-LED arrangements.

798. Light field display according to any of the preceding items, characterized in that the first imaging unit and/or the second imaging unit comprises a matrix with a light-forming structure, wherein the light-forming structure is a microlens or a photonic structure.

799. Light field display according to item 798, in which the light-shaping structure is at least partially arranged in a semiconductor material of the μ-LEDs of the pixels of the at least one optical imager.

800. Light field display according to any of the preceding items, further comprising a drive circuit according to any of the following items, which is implemented in a substrate on which the μ-display is arranged.

801. Light field display according to any of the items 795 to 800, characterized in that the μ-LEDs comprise arrangements in which the μ-LEDs of a pixel comprise a reflective side surface.

802. Light field display according to any of the items 795 to 801, characterized in that at least some of the μ-LEDs form arrays or μ-LEDs form redundant elements which are separated from adjacent μ-LED arrays or μ-LEDs by electrically insulating but optically crosstalking elements.

803. Light field display according to any of the items 795 to 802, characterized in that the μ-LED arrangements are configured to be of different sizes depending on the color, or that a total area of the μ-LED arrangements or μ-LEDs of a pixel is smaller than the area of the pixel, in particular only 50% to 70% of the area of the pixel.

804. Light field display according to any of the preceding items, characterized in that the light field display comprises a measuring device for determining the position of the fovea centralis.

805. Light field display according to any of the preceding items, characterized in that the light field display comprises an eye movement detection device and a control device for dynamic tracking of the adjustment optics for the retinal projection of the second raster sub-image onto the fovea centralis.

806. Method of operating a light field display according to any of the preceding items, characterized in that a first raster sub-image is imaged onto the retina of a user and a second raster sub-image, which has a higher resolution than that of the first raster sub-image, is imaged at least onto the fovea centralis in the user's eye.

807. Pixel array, in particular for a display in polar coordinates, comprising
   a plurality of pixel elements arranged from a starting point on an axis through the starting point in at least one row, wherein
   the first plurality of pixel elements in planar view have a length and a variable width such that the width of the pixel elements substantially increases from the starting point.

808. Pixel array according to item 807, in which the starting point forms a central point and the plurality of pixel elements are arranged symmetrically about the central point along the axis in a row.

809. Pixel array according to any of the preceding items, in which any two adjacent pixel elements of the plurality of pixel elements have at least one of the following characteristics:
   luminous areas of equal size, the distance between them increasing with increasing distance from the starting point;
   luminous areas, the corresponding increasing width of the pixels becomes larger; or
   a combination of these two possibilities.

810. Pixel array according to any of the preceding items, in which the plurality of pixel elements have a variable length such that the length of the pixel elements increases with increasing distance from the starting point.

811. Pixel array according to any of the preceding items, where two adjacent subpixels of the multiplicity of pixels have different colors.

812. Pixel array according to any of the preceding items, in which the plurality of pixel elements have at least three different colors, the number of pixels of each color being different.

813. Pixel array according to any of the preceding items, in which a first number of said plurality of pixel elements are arranged in a first row and a second number of said plurality of pixel elements are arranged in at least one second row, said first and second numbers of pixel elements having a different color in operation.

814. Pixel array according to item 813, in which pixels in each of at least two rows have different colors in operation, the pixels being arranged such that the n-th pixel of a first row has a different color from an n-th pixel of the at least one second row.

815. Pixel array according to item 813, in which at least three rows of pixel elements are arranged, the colors of which are different in operation.

816. Pixel array according to any one of the items 813 to 815, in which the first row runs along a first axis and the at least one second row runs along a second axis different from the first axis through a common center point.

817. Pixel array according to any of the preceding items, in which the first number of the plurality of pixel elements in the first row is different from the second number of the plurality of pixel elements in the at least one second row.

818. Pixel array according to any of the preceding items, in which at least some pixels of the first and at least one second row have the same width and from an n-th pixel of the first row onwards the width is different from the width of the n-th pixel of the at least one second row.

819. Pixel array according to any of the preceding items, in which the first row and the at least one second row comprise pixels of different colors, and are arranged along the axis and starting from the starting point.

820. Pixel array according to any of the preceding items, where the row with the largest number of pixels preferably comprises pixel sin a green color.

821. Pixel array according to any of the preceding items, where from an nth pixel of the first row onwards the width of adjacent pixels in the first row is smaller than that from the nth pixel onwards in the at least one second row.

822. Pixel array according to any of the preceding items, where a number of pixels of the color green is greater than a number of pixels of the other colors.

823. Pixel array according to any of the preceding items, in which the plurality of pixel elements in the at least one row are formed by a monolithically shaped pixelated array of µ-LEDs.

824. Pixel array according to any of the preceding items, in which at least some of the plurality of pixel elements in the at least one row are formed by transferred µ-LEDs.

825. Pixel array according to any of the preceding items, in which the µ-LEDs each comprise a horizontally aligned microrod contacted on a substrate.

826. Pixel array according to any of the preceding items, in which the µ-LEDs each comprise a pair of spaced light-emitting elements with a converter material disposed therebetween.

827. pixel array according to any of the preceding items, in which the µ-LEDs have been manufactured by a process according to any of the preceding items.

828. Pixel array according to any of the preceding items objects, in which at least some µ-LEDs are assigned redundant µ-LEDs of the same color, at least one of the µ-LEDs and the redundant µ-LEDs being assigned a fuse element.

829. Pixel array according to any of the preceding items, in which the µ-LEDs are composed of µ-LED modules, each module comprising at least one base module according to any of the preceding items, the number of base modules per µ-LED module increasing towards the outside.

830. Pixel array according to any of the preceding items, in which the pixel elements have a light-shaping structure, in particular a reflective structure, a microlens or a photonic crystal.

831. Pixel array according to any of the preceding items, comprising a substrate on which the pixel array is disposed, the substrate having a supply circuit or driver circuit following one of the following items.

832. Pixel matrix comprising at least two pixel arrays according to any of the preceding items, in particular for a display in polar coordinates, in which the at least two pixel arrays have a common center point and enclose an angle substantially equal to 360° divided by twice the number of the at least two pixel arrays.

833. Pixel matrix according to item 832, in which three pixel arrays are provided, each of which has a different color.

834. Display arrangement in polar coordinates with an array or matrix of pixels according to any of the preceding items, further comprising
   an optical system comprising at least one mirror movable about two axes, which is arranged in a main radiation direction of the pixel array or pixel matrix and is adapted to rotate radiated light from the pixels arranged in row about a point corresponding to the starting point.

835. Method of operating a pixel array or a pixel matrix according to any of the preceding items, comprising the steps of;
creating a first light line with the multitude of pixel elements arranged in a row;
guiding the first light line to a destination;
creating a second light line;
rotating the second light line by a certain angle and a rotation point corresponding to the starting point of the pixel elements arranged in line;
guiding the second light line to the destination.

The description with the help of the exemplary embodiments does not limit the various embodiments shown in the examples to these. Rather, the disclosure depicts several aspects, which can be combined with each other and also with each other. Aspects that relate to processes, for example, can thus also be combined with aspects where light extraction is the main focus. This is also made clear by the various objects shown above.

The invention thus comprises any features and also any combination of features, including in particular any combination of features in the subject-matter and claims, even if that feature or combination is not explicitly specified in the exemplary embodiments.

The invention claimed is:

1. Light guide arrangement comprising:
a μ-display for generating at least a first image and a second image, and
an imaging optic adapted to project a first image at a first resolution onto a first region of a retina of a user and to project a second image at a second resolution onto another, second region of the retina, the first resolution being different from the second resolution; wherein
the μ-display is adapted to display the first image and the second image consecutively; and
the imaging optic comprises a beam steering device that directs light rays of the first image onto the first region and light rays of the second image onto the second region.

2. Light guide arrangement according to claim 1, characterized in that the first region is closer to a center of the retina than the second region and that the first resolution is higher than the second resolution.

3. Light guide arrangement according to claim 1, characterized in that the beam steering device has at least one movable and/or fixed mirror.

4. Light guide arrangement according to claim 1, characterized in that the second region concentrically encloses the first region.

5. Light guide arrangement according to claim 1, in which the μ-display comprises at least one matrix of pixels formed by a μ-LED arrangement.

6. Light guide arrangement according to claim 1, in which the μ-display comprises a matrix with a light-shaping structure, comprising a photonic crystal.

7. Light field display comprising:
an optoelectronic device for generating a raster image;
an optics module for directing a retinal projection of the raster image into a user's eye;
characterised in that
said optoelectronic device comprises a first μ-display generating a first raster sub-image and a second μ-display generating a second raster sub-image;
wherein the raster image comprises the first raster field sub-image and the second raster field sub-image; and
the optics module comprises an adjustment optic for directing the retinal projection of the second raster sub-image onto a fovea centralis in the user's eye; and
wherein the retinal projection of the second raster sub-image has a higher resolution than that of the first raster sub-image;
wherein the adjustment optic comprises one of:
a switchable Bragg grating;
an adjustable Alvarez lens arrangement; or
a Moire lens arrangement.

8. Light field display according to claim 7, characterized in that the adjustment optic is configured in such a way that a relative position of the retinal projection of the second raster sub-image can be adjusted with respect to the retinal projection of the first raster sub-image.

9. Light field display according to claim 7, characterized in that the retinal projection of the second raster sub-image in the user's eye has a smaller spatial extension than the retinal projection of the first raster sub-image.

10. Light field display according to claim 7, characterized in that a collimation optic is arranged in a beam path of the first μ-display and/or the second μ-display.

11. Light field display according to claim 7, characterized in that the first μ-display and/or the second μ-display comprises a matrix of a plurality of μ-LED base modules.

12. Light field display according to claim 7, characterized in that the first μ-display and/or the second μ-display comprises a matrix with a light-shaping structure, wherein the light-shaping structure is a microlens or a photonic structure.

13. Light field display according to claim 12, in which the light-shaping structure is at least partially arranged in a semiconductor material of μ-LEDs of pixels of the optoelectronic device.

14. Light field display according to claim 7, wherein the optoelectronic device comprises μ-LEDs including arrangements in which the μ-LEDs of a pixel comprise a reflective side surface.

15. Pixel array, for a display in polar coordinates, comprising
a plurality of pixel elements arranged from a starting point on an axis through the starting point in at least one row, wherein
the plurality of pixel elements in planar view have a length and a variable width such that the variable width of the plurality of pixel elements substantially increases from the starting point.

16. Pixel array according to claim 15, in which any two adjacent pixel elements of the plurality of pixel elements have at least one of the following characteristics:
first luminous areas of equal size, a distance between them increasing with increasing distance from the starting point;
second luminous areas wherein a corresponding increasing width of pixels becomes larger; or
a combination thereof.

17. Pixel array according to claim 15, in which the plurality of pixel elements have a variable length such that the variable length of the plurality of pixel elements increases with increasing distance from the starting point.

18. Pixel array according to claim 15, in which the plurality of pixel elements have at least three different colors, a number of pixels of each color being different.

19. Pixel array according to claim 15, in which a first number of said plurality of pixel elements are arranged in a first row and a second number of said plurality of pixel elements are arranged in at least one second row, said first and second numbers of pixel elements having a different color in operation.

20. Pixel array according to claim 19, in which the first number of the plurality of pixel elements in the first row is different from the second number of the plurality of pixel elements in the at least one second row.

21. Pixel array according to claim 19, in which at least some pixels of the first and at least one second row have a same width and from an n-th pixel of the first row onwards the width is different from the width of the n-th pixel of the at least one second row.

22. Pixel array according to claim 15, where a number of pixels of a color green is greater than a number of pixels of other colors.

23. Pixel array according to claim 15, in which the plurality of pixel elements in the at least one row are formed by a monolithically shaped pixelated array of µ-LEDs.

24. Pixel array according to claim 15, comprising µ-LEDs that each comprise a pair of spaced light-emitting elements with a converter material disposed therebetween.

25. Pixel array according to claim 15, in which the plurality of pixel elements have a light-shaping structure comprising one of a reflective structure, a microlens, or a photonic crystal.

26. Pixel matrix comprising at least two pixel arrays according to claim 15, for a display in polar coordinates, in which the at least two pixel arrays have a common center point and enclose an angle substantially equal to 360° divided by twice a number of the at least two pixel arrays.

27. Pixel matrix comprising at least two pixel arrays according to claim 15, in which the at least two pixel arrays comprise a different color.

28. Light guide arrangement comprising:
a pixel array, for a display in polar coordinates, which:
has a plurality of light emitting devices, µ-LEDs, µ-LED arrays, or µ-LED modules
which are arranged in at least one row starting from a starting point on an axis through the starting point, wherein
a plurality of pixel elements have a height and a variable width such that the variable width of the plurality of pixel elements substantially increases from the starting point;
or comprising
a µ-display and a projection optics, wherein the µ-display comprises a matrix with pixels for emission of visible light and wherein each pixel comprises several µ-LEDs with spectrally different light emission; and wherein each pixel is assigned a separate collimation optics preceding the projection optics,
characterised in that
the collimation optics are configured in such a way that enlarged and overlapping intermediate images of the µ-LEDs of the respective pixel are generated in a beam path in front of the projection optics.

* * * * *